United States Patent
Matam et al.

(10) Patent No.: US 11,410,266 B2
(45) Date of Patent: *Aug. 9, 2022

(54) DISAGGREGATION OF SYSTEM-ON-CHIP (SOC) ARCHITECTURE

(71) Applicant: Intel Corporation, Santa Clara, CA (US)

(72) Inventors: Naveen Matam, Rancho Cordova, CA (US); Lance Cheney, El Dorado Hills, CA (US); Eric Finley, Ione, CA (US); Varghese George, Folsom, CA (US); Sanjeev Jahagirdar, Folsom, CA (US); Altug Koker, El Dorado Hills, CA (US); Josh Mastronarde, Sacramento, CA (US); Iqbal Rajwani, Roseville, CA (US); Lakshminarayanan Striramassarma, Folsom, CA (US); Melaku Teshome, El Dorado Hills, CA (US); Vikranth Vemulapalli, Folsom, CA (US); Binoj Xavier, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/069,188

(22) Filed: Oct. 13, 2020

(65) Prior Publication Data
US 2021/0133913 A1    May 6, 2021

Related U.S. Application Data

(63) Continuation of application No. 16/355,377, filed on Mar. 15, 2019, now Pat. No. 10,803,548.

(51) Int. Cl.
*G06T 1/20* (2006.01)
*G06F 13/40* (2006.01)

(52) U.S. Cl.
CPC ............ *G06T 1/20* (2013.01); *G06F 13/4027* (2013.01)

(58) Field of Classification Search
CPC .......................... G06T 1/20; G06F 13/4027
(Continued)

(56) References Cited

U.S. PATENT DOCUMENTS

| 7,873,812 | B1 | 1/2011 | Mimar |
| 10,461,076 | B1 | 10/2019 | Brewer |

(Continued)

FOREIGN PATENT DOCUMENTS

| CN | 113396404 A | 9/2021 |
| EP | 3964969 A1 | 3/2022 |

OTHER PUBLICATIONS

Rao, R. Tummala, 3D System Package Architecture as Alternative to 3D Stacking of ICs with TSV at System Level, IEEE 2017, pp. 3.1.1-3.4.3, 2017.

(Continued)

*Primary Examiner* — Jacinta M Crawford
(74) *Attorney, Agent, or Firm* — Jaffery Watson Mendonsa & Hamilton LLP

(57) ABSTRACT

Embodiments described herein provide techniques to disaggregate an architecture of a system on a chip integrated circuit into multiple distinct chiplets that can be packaged onto a common chassis. In one embodiment, a graphics processing unit or parallel processor is composed from diverse silicon chiplets that are separately manufactured. A chiplet is an at least partially packaged integrated circuit that includes distinct units of logic that can be assembled with other chiplets into a larger package. A diverse set of chiplets with different IP core logic can be assembled into a single device.

20 Claims, 58 Drawing Sheets

(58) Field of Classification Search
USPC .................................................. 345/501, 519
See application file for complete search history.

(56) References Cited

U.S. PATENT DOCUMENTS

| | | | |
|---|---|---|---|
| 10,528,864 | B2 | 1/2020 | Dally et al. |
| 10,803,548 | B2 | 10/2020 | Matam et al. |
| 10,860,922 | B2 | 12/2020 | Dally et al. |
| 10,891,538 | B2 | 1/2021 | Dally et al. |
| 2004/0193936 | A1* | 9/2004 | Kelly ............... G06F 5/06 713/500 |
| 2008/0186321 | A1 | 8/2008 | Park |
| 2011/0289180 | A1* | 11/2011 | Sonnier ........... G06F 12/0831 709/213 |
| 2014/0071140 | A1 | 3/2014 | Tripathi |
| 2014/0184894 | A1 | 7/2014 | Motta |
| 2014/0332975 | A1 | 11/2014 | Raorane |
| 2016/0062947 | A1 | 3/2016 | Chetlur et al. |
| 2016/0079220 | A1 | 3/2016 | Lin |
| 2016/0093597 | A1 | 3/2016 | Chang |
| 2016/0181201 | A1 | 6/2016 | Yang |
| 2017/0055218 | A1 | 2/2017 | Fukami |
| 2017/0139635 | A1 | 5/2017 | Jayaena |
| 2017/0200672 | A1 | 7/2017 | Jayasena et al. |
| 2018/0046906 | A1 | 2/2018 | Dally et al. |
| 2018/0061741 | A1 | 3/2018 | Beyne |
| 2018/0102251 | A1 | 4/2018 | Delacruz et al. |
| 2018/0286840 | A1 | 10/2018 | Nair |
| 2018/0307863 | A1 | 10/2018 | Jackson et al. |
| 2019/0164806 | A1 | 5/2019 | Leobandung |
| 2020/0135719 | A1 | 4/2020 | Brewer |

OTHER PUBLICATIONS

International Preliminary Report on Patentability for PCT/US2020/014766, 7 pages, dated Sep. 30, 2021.
Mira Yurizaki: "The Chiplet "Problem" with GPUs—Yurizaki's Tech Ramblings—Linus Tech Tips", linustechtips, Jan. 18, 2019 (Jan. 18, 2019), XP055689387, Retrieved from the Internet: URL:https://web.archive.org/web/20200427081511/https:// linustechtips.com/main/blogs/entry/1567-the-chiplet-problem-with-gpus/, 18 pages.
Goodfellow, et al. "Adaptive Computation and Machine Learning Series", Book, Nov. 18, 2016, pp. 98-165, Chapter 5, The MIT Press, Cambridge, MA.
Ross, et al. "Intel Processor Graphics: Architecture & Programming", Power Point Presentation, Aug. 2015, 78 pages, Intel Corporation, Santa Clara, CA.
Shane Cook, "CUDA Programming", Book, 2013, pp. 37-52, Chapter 3, Elsevier Inc., Amsterdam Netherlands.
Nicholas Wilt, "The CUDA Handbook; A Comprehensive Guide to GPU Programming", Book, Jun. 22, 2013, pp. 41-57, Addison-Wesley Professional, Boston, MA.
Stephen Junkins, "The Compute Architecture of Intel Processor Graphics Gen9", paper, Aug. 14, 2015, 22 pages, Version 1.0, Intel Corporation, Santa Clara, CA.
Extended European Search Report for EP 21204670, 8 pages, dated Jan. 20, 2022.
Notification of CN Publication No. 113989099 for CN Application No. 202111335050.1, dated Feb. 11, 2022, 4 pages.

\* cited by examiner

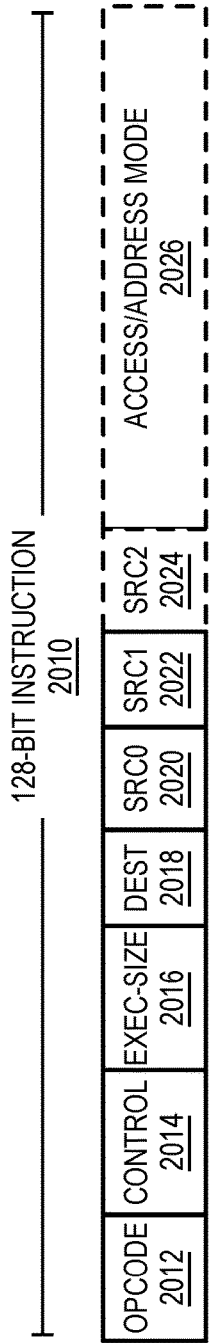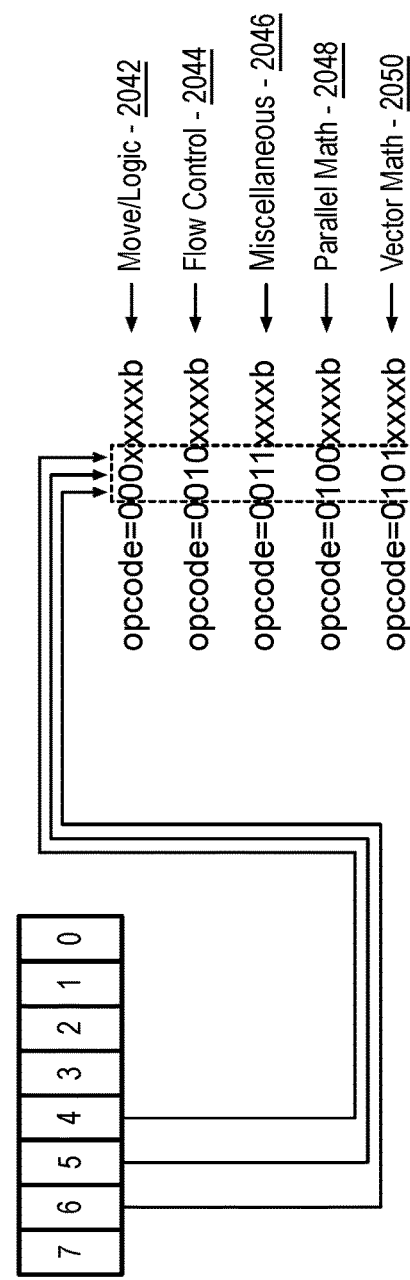
FIG. 20

FIG. 22A GRAPHICS PROCESSOR COMMAND FORMAT 2200

FIG. 22B GRAPHICS PROCESSOR COMMAND SEQUENCE 2210

DISAGGREGATION OF SYSTEM-ON-CHIP (SOC) ARCHITECTURE

CROSS REFERENCE TO RELATED APPLICATIONS

The present patent application is a continuation application claiming priority from U.S. application Ser. No. 16/355,377, filed Mar. 15, 2019, and issued as U.S. Pat. No. 10,803,548 on Oct. 13, 2020, the contents of which are incorporated herein in their entirety by reference.

FIELD

Embodiments relate generally to the design and manufacturing of general-purpose graphics and parallel processing units.

BACKGROUND OF THE DESCRIPTION

Current parallel graphics data processing includes systems and methods developed to perform specific operations on graphics data such as, for example, linear interpolation, tessellation, rasterization, texture mapping, depth testing, etc. Traditionally, graphics processors used fixed function computational units to process graphics data; however, more recently, portions of graphics processors have been made programmable, enabling such processors to support a wider variety of operations for processing vertex and fragment data.

To further increase performance, graphics processors typically implement processing techniques such as pipelining that attempt to process, in parallel, as much graphics data as possible throughout the different parts of the graphics pipeline. Parallel graphics processors with single instruction, multiple thread (SIMT) architectures are designed to maximize the amount of parallel processing in the graphics pipeline. In an SIMT architecture, groups of parallel threads attempt to execute program instructions synchronously together as often as possible to increase processing efficiency. A general overview of software and hardware for SIMT architectures can be found in Shane Cook, *CUDA Programming* Chapter 3, pages 37-51 (2013).

BRIEF DESCRIPTION OF THE DRAWINGS

So that the manner in which the features of the present embodiments can be understood in detail, a more particular description of the embodiments may be had by reference to the appended drawings, in which:

FIG. 20 is a block diagram illustrating graphics processor instruction formats according to some embodiments;

DETAILED DESCRIPTION

In some embodiments, a graphics processing unit (GPU) is communicatively coupled to host/processor cores to accelerate graphics operations, machine-learning operations, pattern analysis operations, and various general-purpose GPU (GPGPU) functions. The GPU may be communicatively coupled to the host processor/cores over a bus or another interconnect (e.g., a high-speed interconnect such as PCIe or NVLink). In other embodiments, the GPU may be integrated on the same package or chip as the cores and communicatively coupled to the cores over an internal processor bus/interconnect (i.e., internal to the package or chip). Regardless of the manner in which the GPU is connected, the processor cores may allocate work to the GPU in the form of sequences of commands/instructions contained in a work descriptor. The GPU then uses dedicated circuitry/logic for efficiently processing these commands/instructions.

In the following description, numerous specific details are set forth to provide a more thorough understanding. However, it will be apparent to one of skill in the art that the embodiments described herein may be practiced without one or more of these specific details. In other instances, well-known features have not been described to avoid obscuring the details of the present embodiments.

System Overview

Figure 1:
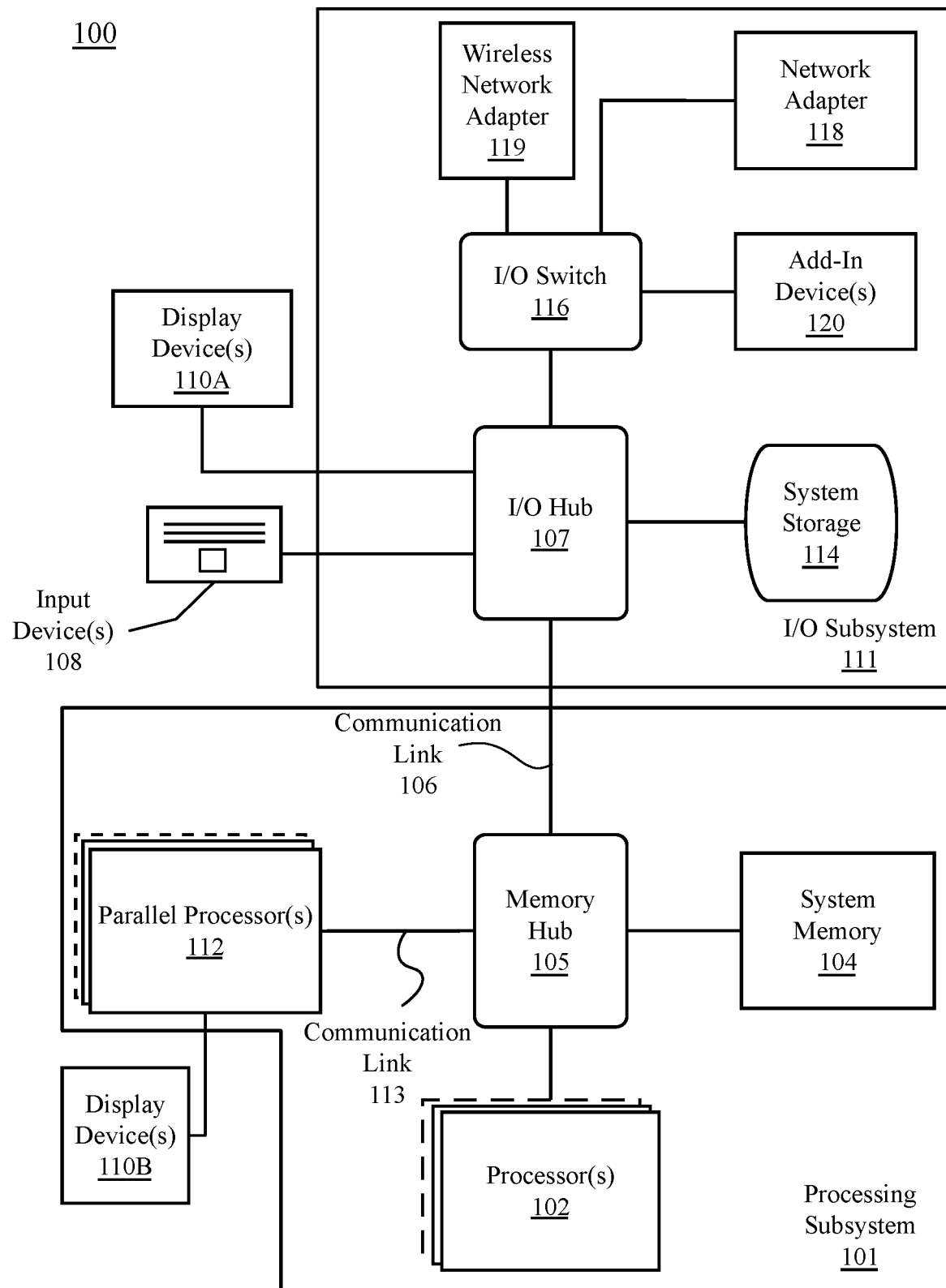
FIG. 1 is a block diagram illustrating a computer system configured to implement one or more aspects of the embodiments described herein.

FIG. 1 is a block diagram illustrating a computing system 100 configured to implement one or more aspects of the embodiments described herein. The computing system 100 includes a processing subsystem 101 having one or more processor(s) 102 and a system memory 104 communicating via an interconnection path that may include a memory hub 105. The memory hub 105 may be a separate component within a chipset component or may be integrated within the one or more processor(s) 102. The memory hub 105 couples with an I/O subsystem 111 via a communication link 106. The I/O subsystem 111 includes an I/O hub 107 that can enable the computing system 100 to receive input from one or more input device(s) 108. Additionally, the I/O hub 107 can enable a display controller, which may be included in the one or more processor(s) 102, to provide outputs to one or more display device(s) 110A. In one embodiment the one or more display device(s) 110A coupled with the I/O hub 107 can include a local, internal, or embedded display device.

In one embodiment the processing subsystem 101 includes one or more parallel processor(s) 112 coupled to memory hub 105 via a bus or other communication link 113. The communication link 113 may be one of any number of standards based communication link technologies or protocols, such as, but not limited to PCI Express, or may be a vendor specific communications interface or communications fabric. In one embodiment the one or more parallel processor(s) 112 form a computationally focused parallel or vector processing system that can include a large number of processing cores and/or processing clusters, such as a many integrated core (MIC) processor. In one embodiment the one or more parallel processor(s) 112 form a graphics processing subsystem that can output pixels to one of the one or more display device(s) 110A coupled via the I/O hub 107. The one or more parallel processor(s) 112 can also include a display controller and display interface (not shown) to enable a direct connection to one or more display device(s) 110B.

Within the I/O subsystem 111, a system storage unit 114 can connect to the I/O hub 107 to provide a storage mechanism for the computing system 100. An I/O switch 116 can be used to provide an interface mechanism to enable connections between the I/O hub 107 and other components, such as a network adapter 118 and/or wireless network adapter 119 that may be integrated into the platform, and various other devices that can be added via one or more add-in device(s) 120. The network adapter 118 can be an Ethernet adapter or another wired network adapter. The wireless network adapter 119 can include one or more of a Wi-Fi, Bluetooth, near field communication (NFC), or other network device that includes one or more wireless radios.

The computing system 100 can include other components not explicitly shown, including USB or other port connections, optical storage drives, video capture devices, and the like, may also be connected to the I/O hub 107. Communication paths interconnecting the various components in FIG. 1 may be implemented using any suitable protocols, such as PCI (Peripheral Component Interconnect) based protocols (e.g., PCI-Express), or any other bus or point-to-point communication interfaces and/or protocol(s), such as the NV-Link high-speed interconnect, or interconnect protocols known in the art.

In one embodiment, the one or more parallel processor(s) 112 incorporate circuitry optimized for graphics and video processing, including, for example, video output circuitry, and constitutes a graphics processing unit (GPU). In another embodiment, the one or more parallel processor(s) 112 incorporate circuitry optimized for general purpose processing, while preserving the underlying computational architecture, described in greater detail herein. In yet another embodiment, components of the computing system 100 may be integrated with one or more other system elements on a single integrated circuit. For example, the one or more parallel processor(s) 112, memory hub 105, processor(s) 102, and I/O hub 107 can be integrated into a system on chip (SoC) integrated circuit. Alternatively, the components of the computing system 100 can be integrated into a single package to form a system in package (SIP) configuration. In one embodiment at least a portion of the components of the computing system 100 can be integrated into a multi-chip module (MCM), which can be interconnected with other multi-chip modules into a modular computing system.

It will be appreciated that the computing system 100 shown herein is illustrative and that variations and modifications are possible. The connection topology, including the number and arrangement of bridges, the number of processor(s) 102, and the number of parallel processor(s) 112, may be modified as desired. For instance, in some embodiments, system memory 104 is connected to the processor(s) 102 directly rather than through a bridge, while other devices communicate with system memory 104 via the memory hub 105 and the processor(s) 102. In other alternative topologies, the parallel processor(s) 112 are connected to the I/O hub 107 or directly to one of the one or more processor(s) 102, rather than to the memory hub 105. In other embodiments, the I/O hub 107 and memory hub 105 may be integrated into a single chip. Some embodiments may include two or more sets of processor(s) 102 attached via multiple sockets, which can couple with two or more instances of the parallel processor(s) 112.

Some of the particular components shown herein are optional and may not be included in all implementations of the computing system 100. For example, any number of add-in cards or peripherals may be supported, or some components may be eliminated. Furthermore, some architectures may use different terminology for components similar to those illustrated in FIG. 1. For example, the memory hub 105 may be referred to as a Northbridge in some architectures, while the I/O hub 107 may be referred to as a Southbridge.

Figure 2A:
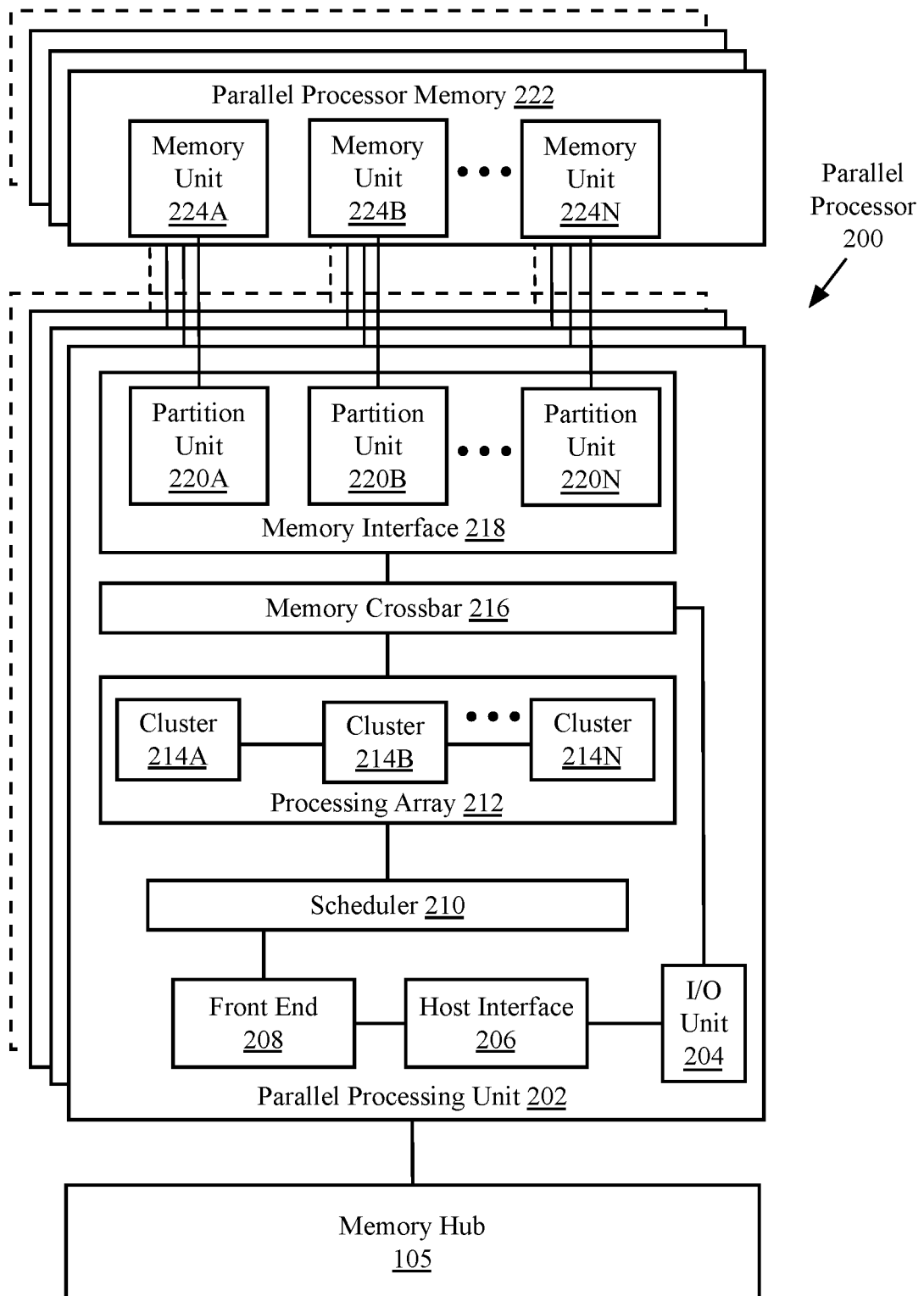
FIG. 2A-2D illustrate parallel processor components, according to an embodiment.

FIG. 2A illustrates a parallel processor 200, according to an embodiment. The various components of the parallel processor 200 may be implemented using one or more integrated circuit devices, such as programmable processors, application specific integrated circuits (ASICs), or field programmable gate arrays (FPGA). The illustrated parallel processor 200 is a variant of the one or more parallel processor(s) 112 shown in FIG. 1, according to an embodiment.

In one embodiment the parallel processor 200 includes a parallel processing unit 202. The parallel processing unit includes an I/O unit 204 that enables communication with other devices, including other instances of the parallel processing unit 202. The I/O unit 204 may be directly connected to other devices. In one embodiment the I/O unit 204 connects with other devices via the use of a hub or switch interface, such as memory hub 105. The connections between the memory hub 105 and the I/O unit 204 form a communication link 113. Within the parallel processing unit 202, the I/O unit 204 connects with a host interface 206 and a memory crossbar 216, where the host interface 206 receives commands directed to performing processing operations and the memory crossbar 216 receives commands directed to performing memory operations.

When the host interface 206 receives a command buffer via the I/O unit 204, the host interface 206 can direct work operations to perform those commands to a front end 208. In one embodiment the front end 208 couples with a scheduler 210, which is configured to distribute commands or other work items to a processing cluster array 212. In one embodiment the scheduler 210 ensures that the processing cluster array 212 is properly configured and in a valid state before tasks are distributed to the processing clusters of the processing cluster array 212. In one embodiment the scheduler 210 is implemented via firmware logic executing on a microcontroller. The microcontroller implemented scheduler 210 is configurable to perform complex scheduling and work distribution operations at coarse and fine granularity, enabling rapid preemption and context switching of threads executing on the processing cluster array 212. In one embodiment, the host software can prove workloads for scheduling on the processing cluster array 212 via one of multiple graphics processing doorbells. The workloads can then be automatically distributed across the processing cluster array 212 by the scheduler 210 logic within the scheduler microcontroller.

The processing cluster array 212 can include up to "N" processing clusters (e.g., cluster 214A, cluster 214B, through cluster 214N). Each cluster 214A-214N of the processing cluster array 212 can execute a large number of concurrent threads. The scheduler 210 can allocate work to the clusters 214A-214N of the processing cluster array 212 using various scheduling and/or work distribution algorithms, which may vary depending on the workload arising for each type of program or computation. The scheduling can be handled dynamically by the scheduler 210, or can be assisted in part by compiler logic during compilation of program logic configured for execution by the processing cluster array 212. In one embodiment, different clusters 214A-214N of the processing cluster array 212 can be allocated for processing different types of programs or for performing different types of computations.

The processing cluster array 212 can be configured to perform various types of parallel processing operations. In one embodiment the processing cluster array 212 is configured to perform general-purpose parallel compute operations. For example, the processing cluster array 212 can include logic to execute processing tasks including filtering of video and/or audio data, performing modeling operations, including physics operations, and performing data transformations.

In one embodiment the processing cluster array 212 is configured to perform parallel graphics processing operations. In embodiments in which the parallel processor 200 is configured to perform graphics processing operations, the processing cluster array 212 can include additional logic to support the execution of such graphics processing operations, including, but not limited to texture sampling logic to perform texture operations, as well as tessellation logic and other vertex processing logic. Additionally, the processing cluster array 212 can be configured to execute graphics processing related shader programs such as, but not limited to vertex shaders, tessellation shaders, geometry shaders, and pixel shaders. The parallel processing unit 202 can transfer data from system memory via the I/O unit 204 for processing. During processing the transferred data can be stored to on-chip memory (e.g., parallel processor memory 222) during processing, then written back to system memory.

In one embodiment, when the parallel processing unit 202 is used to perform graphics processing, the scheduler 210 can be configured to divide the processing workload into approximately equal sized tasks, to better enable distribution of the graphics processing operations to multiple clusters 214A-214N of the processing cluster array 212. In some embodiments, portions of the processing cluster array 212 can be configured to perform different types of processing. For example a first portion may be configured to perform vertex shading and topology generation, a second portion may be configured to perform tessellation and geometry shading, and a third portion may be configured to perform pixel shading or other screen space operations, to produce a rendered image for display. Intermediate data produced by one or more of the clusters 214A-214N may be stored in buffers to allow the intermediate data to be transmitted between clusters 214A-214N for further processing.

During operation, the processing cluster array 212 can receive processing tasks to be executed via the scheduler 210, which receives commands defining processing tasks from front end 208. For graphics processing operations, processing tasks can include indices of data to be processed, e.g., surface (patch) data, primitive data, vertex data, and/or pixel data, as well as state parameters and commands defining how the data is to be processed (e.g., what program is to be executed). The scheduler 210 may be configured to fetch the indices corresponding to the tasks or may receive the indices from the front end 208. The front end 208 can be configured to ensure the processing cluster array 212 is configured to a valid state before the workload specified by incoming command buffers (e.g., batch-buffers, push buffers, etc.) is initiated.

Each of the one or more instances of the parallel processing unit 202 can couple with parallel processor memory 222. The parallel processor memory 222 can be accessed via the memory crossbar 216, which can receive memory requests from the processing cluster array 212 as well as the I/O unit 204. The memory crossbar 216 can access the parallel processor memory 222 via a memory interface 218. The memory interface 218 can include multiple partition units (e.g., partition unit 220A, partition unit 220B, through partition unit 220N) that can each couple to a portion (e.g., memory unit) of parallel processor memory 222. In one implementation the number of partition units 220A-220N is configured to be equal to the number of memory units, such that a first partition unit 220A has a corresponding first memory unit 224A, a second partition unit 220B has a corresponding memory unit 224B, and an Nth partition unit 220N has a corresponding Nth memory unit 224N. In other embodiments, the number of partition units 220A-220N may not be equal to the number of memory devices.

In various embodiments, the memory units 224A-224N can include various types of memory devices, including dynamic random access memory (DRAM) or graphics random access memory, such as synchronous graphics random access memory (SGRAM), including graphics double data rate (GDDR) memory. In one embodiment, the memory units 224A-224N may also include 3D stacked memory, including but not limited to high bandwidth memory (HBM). Persons skilled in the art will appreciate that the specific implementation of the memory units 224A-224N can vary, and can be selected from one of various conventional designs. Render targets, such as frame buffers or texture maps may be stored across the memory units 224A-224N, allowing partition units 220A-220N to write portions of each render target in parallel to efficiently use the available bandwidth of parallel processor memory 222. In some embodiments, a local instance of the parallel processor memory 222 may be excluded in favor of a unified memory design that utilizes system memory in conjunction with local cache memory.

In one embodiment, any one of the clusters 214A-214N of the processing cluster array 212 can process data that will be written to any of the memory units 224A-224N within parallel processor memory 222. The memory crossbar 216 can be configured to transfer the output of each cluster 214A-214N to any partition unit 220A-220N or to another cluster 214A-214N, which can perform additional processing operations on the output. Each cluster 214A-214N can communicate with the memory interface 218 through the memory crossbar 216 to read from or write to various external memory devices. In one embodiment the memory crossbar 216 has a connection to the memory interface 218 to communicate with the I/O unit 204, as well as a connection to a local instance of the parallel processor memory 222, enabling the processing units within the different processing clusters 214A-214N to communicate with system memory or other memory that is not local to the parallel processing unit 202. In one embodiment the memory crossbar 216 can use virtual channels to separate traffic streams between the clusters 214A-214N and the partition units 220A-220N.

While a single instance of the parallel processing unit 202 is illustrated within the parallel processor 200, any number of instances of the parallel processing unit 202 can be included. For example, multiple instances of the parallel processing unit 202 can be provided on a single add-in card, or multiple add-in cards can be interconnected. The different instances of the parallel processing unit 202 can be configured to inter-operate even if the different instances have different numbers of processing cores, different amounts of local parallel processor memory, and/or other configuration differences. For example, in one embodiment some instances of the parallel processing unit 202 can include higher precision floating point units relative to other instances. Systems incorporating one or more instances of the parallel processing unit 202 or the parallel processor 200 can be implemented in a variety of configurations and form factors, including but not limited to desktop, laptop, or handheld personal computers, servers, workstations, game consoles, and/or embedded systems.

Figure 2B:
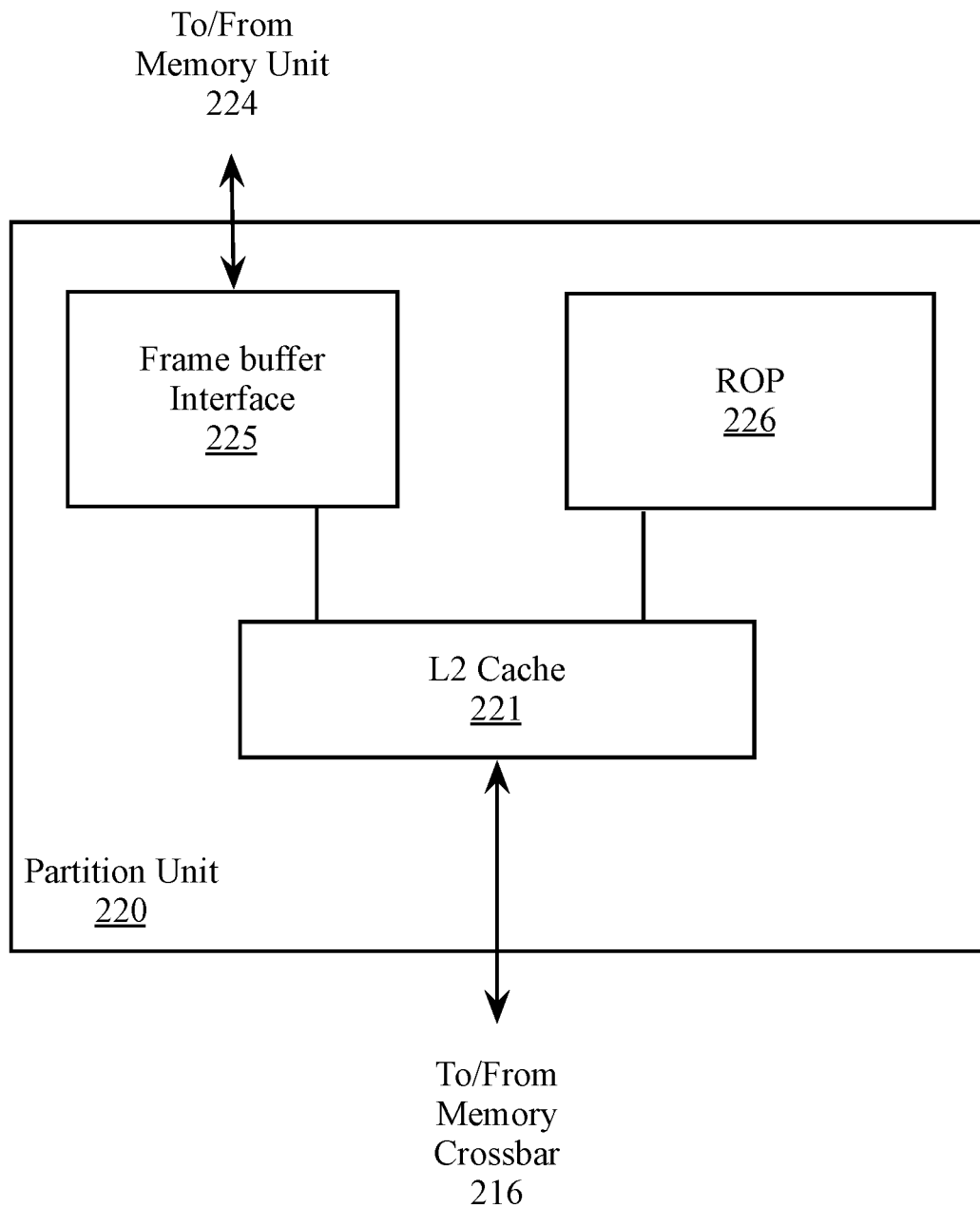

FIG. 2B is a block diagram of a partition unit 220, according to an embodiment. In one embodiment the partition unit 220 is an instance of one of the partition units 220A-220N of FIG. 2A. As illustrated, the partition unit 220 includes an L2 cache 221, a frame buffer interface 225, and a ROP 226 (raster operations unit). The L2 cache 221 is a read/write cache that is configured to perform load and store operations received from the memory crossbar 216 and ROP 226. Read misses and urgent write-back requests are output by L2 cache 221 to frame buffer interface 225 for processing. Updates can also be sent to the frame buffer via the frame buffer interface 225 for processing. In one embodiment the frame buffer interface 225 interfaces with one of the memory units in parallel processor memory, such as the memory units 224A-224N of FIG. 2A (e.g., within parallel processor memory 222).

In graphics applications, the ROP 226 is a processing unit that performs raster operations such as stencil, z test, blending, and the like. The ROP 226 then outputs processed graphics data that is stored in graphics memory. In some embodiments the ROP 226 includes compression logic to compress depth or color data that is written to memory and decompress depth or color data that is read from memory. The compression logic can be lossless compression logic that makes use of one or more of multiple compression algorithms. The type of compression that is performed by the ROP 226 can vary based on the statistical characteristics of the data to be compressed. For example, in one embodiment, delta color compression is performed on depth and color data on a per-tile basis.

In some embodiments, the ROP 226 is included within each processing cluster (e.g., cluster 214A-214N of FIG. 2A) instead of within the partition unit 220. In such embodiment, read and write requests for pixel data are transmitted over the memory crossbar 216 instead of pixel fragment data. The processed graphics data may be displayed on a display device, such as one of the one or more display device(s) 110A-110B of FIG. 1, routed for further processing by the processor(s) 102, or routed for further processing by one of the processing entities within the parallel processor 200 of FIG. 2A.

Figure 2C:
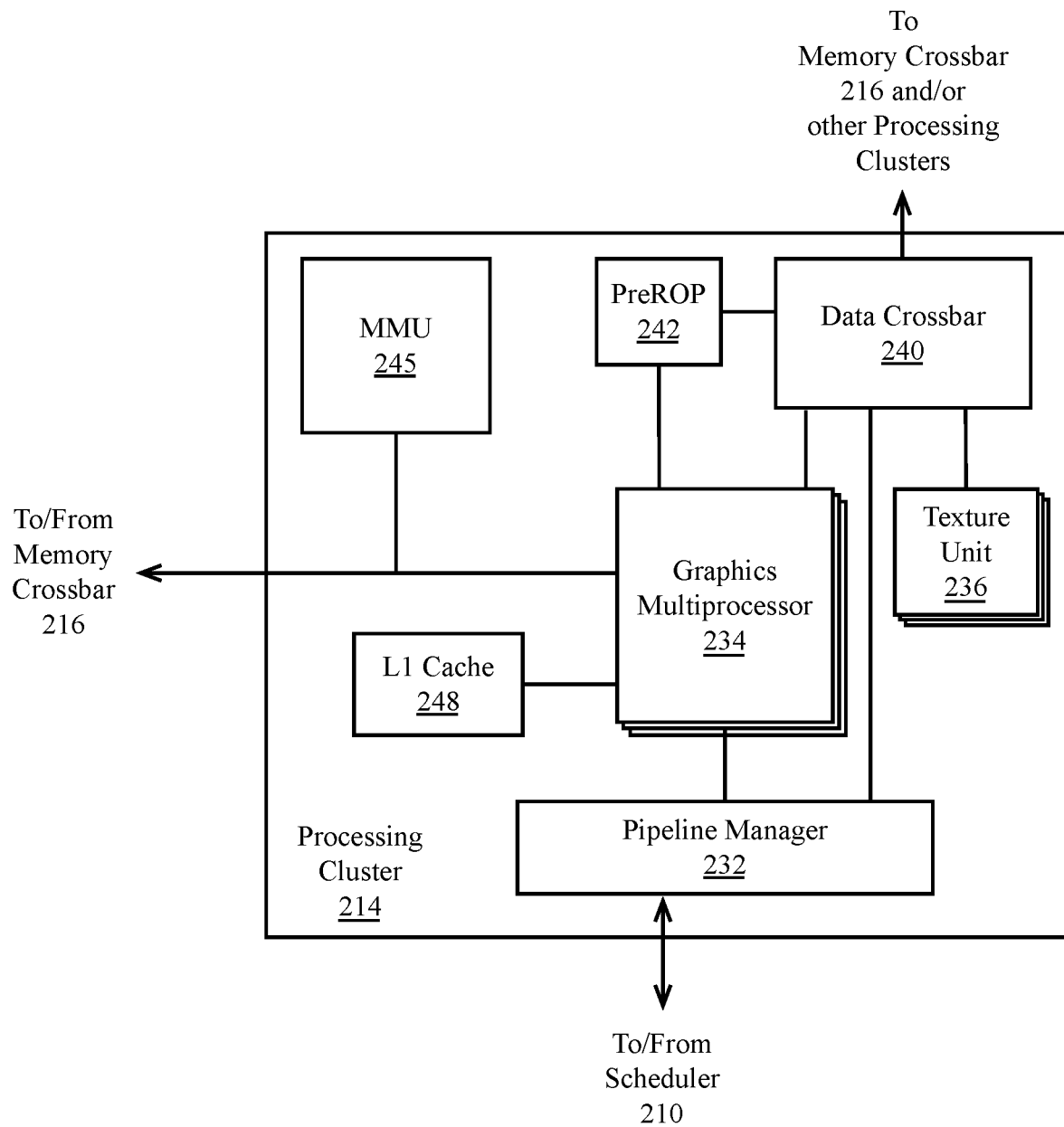

FIG. 2C is a block diagram of a processing cluster 214 within a parallel processing unit, according to an embodiment. In one embodiment the processing cluster is an instance of one of the processing clusters 214A-214N of FIG. 2A. The processing cluster 214 can be configured to execute many threads in parallel, where the term "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within each one of the processing clusters. Unlike a SIMD execution regime, where all processing engines typically execute identical instructions, SIMT execution allows different threads to more readily follow divergent execution paths through a given thread program. Persons skilled in the art will understand that a SIMD processing regime represents a functional subset of a SIMT processing regime.

Operation of the processing cluster 214 can be controlled via a pipeline manager 232 that distributes processing tasks to SIMT parallel processors. The pipeline manager 232 receives instructions from the scheduler 210 of FIG. 2A and manages execution of those instructions via a graphics multiprocessor 234 and/or a texture unit 236. The illustrated graphics multiprocessor 234 is an exemplary instance of a SIMT parallel processor. However, various types of SIMT parallel processors of differing architectures may be included within the processing cluster 214. One or more instances of the graphics multiprocessor 234 can be included within a processing cluster 214. The graphics multiprocessor 234 can process data and a data crossbar 240 can be used to distribute the processed data to one of multiple possible destinations, including other shader units. The pipeline manager 232 can facilitate the distribution of processed data by specifying destinations for processed data to be distributed via the data crossbar 240.

Each graphics multiprocessor 234 within the processing cluster 214 can include an identical set of functional execution logic (e.g., arithmetic logic units, load-store units, etc.). The functional execution logic can be configured in a pipelined manner in which new instructions can be issued before previous instructions are complete. The functional execution logic supports a variety of operations including integer and floating point arithmetic, comparison operations, Boolean operations, bit-shifting, and computation of various algebraic functions. In one embodiment the same functional-unit hardware can be leveraged to perform different operations and any combination of functional units may be present.

The instructions transmitted to the processing cluster 214 constitutes a thread. A set of threads executing across the set of parallel processing engines is a thread group. A thread group executes the same program on different input data. Each thread within a thread group can be assigned to a different processing engine within a graphics multiprocessor 234. A thread group may include fewer threads than the number of processing engines within the graphics multiprocessor 234. When a thread group includes fewer threads than the number of processing engines, one or more of the processing engines may be idle during cycles in which that thread group is being processed. A thread group may also include more threads than the number of processing engines within the graphics multiprocessor 234. When the thread group includes more threads than the number of processing engines within the graphics multiprocessor 234, processing can be performed over consecutive clock cycles. In one embodiment multiple thread groups can be executed concurrently on a graphics multiprocessor 234.

In one embodiment the graphics multiprocessor 234 includes an internal cache memory to perform load and store operations. In one embodiment, the graphics multiprocessor 234 can forego an internal cache and use a cache memory (e.g., L1 cache 248) within the processing cluster 214. Each graphics multiprocessor 234 also has access to L2 caches within the partition units (e.g., partition units 220A-220N of FIG. 2A) that are shared among all processing clusters 214 and may be used to transfer data between threads. The graphics multiprocessor 234 may also access off-chip global memory, which can include one or more of local parallel processor memory and/or system memory. Any memory external to the parallel processing unit 202 may be used as global memory. Embodiments in which the processing cluster 214 includes multiple instances of the graphics multiprocessor 234 can share common instructions and data, which may be stored in the L1 cache 248.

Each processing cluster 214 may include an MMU 245 (memory management unit) that is configured to map virtual addresses into physical addresses. In other embodiments, one or more instances of the MMU 245 may reside within the memory interface 218 of FIG. 2A. The MMU 245 includes a set of page table entries (PTEs) used to map a virtual address to a physical address of a tile and optionally a cache line index. The MMU 245 may include address translation lookaside buffers (TLB) or caches that may reside within the graphics multiprocessor 234 or the L1 cache or processing cluster 214. The physical address is processed to distribute surface data access locality to allow efficient request interleaving among partition units. The cache line index may be used to determine whether a request for a cache line is a hit or miss.

In graphics and computing applications, a processing cluster 214 may be configured such that each graphics multiprocessor 234 is coupled to a texture unit 236 for performing texture mapping operations, e.g., determining texture sample positions, reading texture data, and filtering the texture data. Texture data is read from an internal texture L1 cache (not shown) or in some embodiments from the L1 cache within graphics multiprocessor 234 and is fetched from an L2 cache, local parallel processor memory, or system memory, as needed. Each graphics multiprocessor 234 outputs processed tasks to the data crossbar 240 to provide the processed task to another processing cluster 214 for further processing or to store the processed task in an L2 cache, local parallel processor memory, or system memory via the memory crossbar 216. A preROP 242 (pre-raster operations unit) is configured to receive data from graphics multiprocessor 234, direct data to ROP units, which may be located with partition units as described herein (e.g., partition units 220A-220N of FIG. 2A). The preROP 242 unit can perform optimizations for color blending, organize pixel color data, and perform address translations.

It will be appreciated that the core architecture described herein is illustrative and that variations and modifications are possible. Any number of processing units, e.g., graphics multiprocessor 234, texture units 236, preROPs 242, etc., may be included within a processing cluster 214. Further, while only one processing cluster 214 is shown, a parallel processing unit as described herein may include any number of instances of the processing cluster 214. In one embodiment, each processing cluster 214 can be configured to operate independently of other processing clusters 214 using separate and distinct processing units, L1 caches, etc.

Figure 2D:
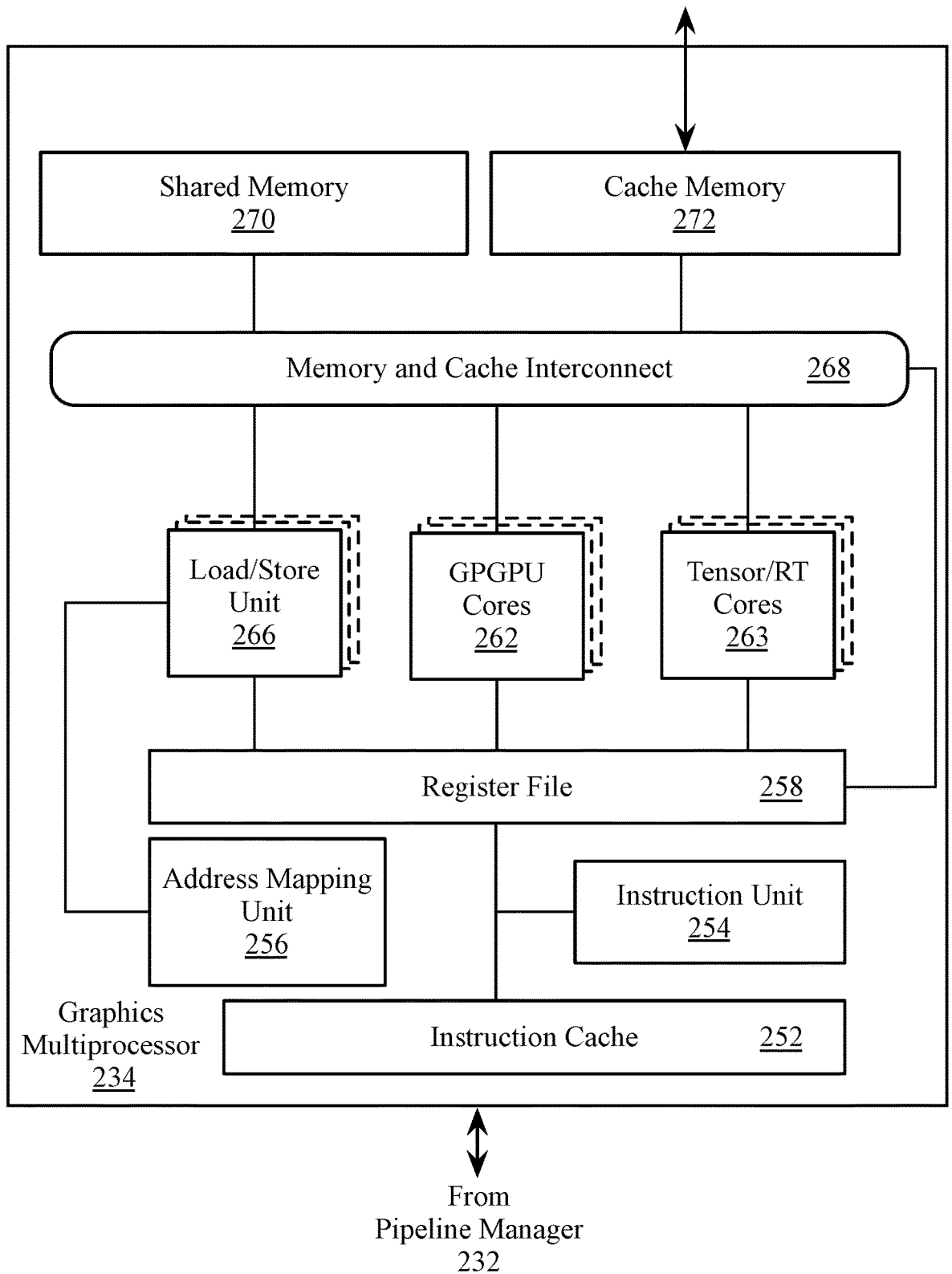

FIG. 2D shows a graphics multiprocessor 234, according to one embodiment. In such embodiment the graphics multiprocessor 234 couples with the pipeline manager 232 of the processing cluster 214. The graphics multiprocessor 234 has an execution pipeline including but not limited to an instruction cache 252, an instruction unit 254, an address mapping unit 256, a register file 258, one or more general purpose graphics processing unit (GPGPU) cores 262, and one or more load/store units 266. The GPGPU cores 262 and load/store units 266 are coupled with cache memory 272 and shared memory 270 via a memory and cache interconnect 268. In one embodiment the graphics multiprocessor 234 additionally includes tensor and/or ray-tracing cores 263 that include hardware logic to accelerate matrix and/or ray-tracing operations.

In one embodiment, the instruction cache 252 receives a stream of instructions to execute from the pipeline manager 232. The instructions are cached in the instruction cache 252 and dispatched for execution by the instruction unit 254. The instruction unit 254 can dispatch instructions as thread groups (e.g., warps), with each thread of the thread group assigned to a different execution unit within GPGPU core 262. An instruction can access any of a local, shared, or global address space by specifying an address within a unified address space. The address mapping unit 256 can be used to translate addresses in the unified address space into a distinct memory address that can be accessed by the load/store units 266.

The register file 258 provides a set of registers for the functional units of the graphics multiprocessor 234. The register file 258 provides temporary storage for operands connected to the data paths of the functional units (e.g., GPGPU cores 262, load/store units 266) of the graphics multiprocessor 234. In one embodiment, the register file 258 is divided between each of the functional units such that each functional unit is allocated a dedicated portion of the register file 258. In one embodiment, the register file 258 is divided between the different warps being executed by the graphics multiprocessor 234.

The GPGPU cores 262 can each include floating point units (FPUs) and/or integer arithmetic logic units (ALUs) that are used to execute instructions of the graphics multiprocessor 234. The GPGPU cores 262 can be similar in architecture or can differ in architecture, according to embodiments. For example and in one embodiment, a first portion of the GPGPU cores 262 include a single precision FPU and an integer ALU while a second portion of the GPGPU cores include a double precision FPU. In one embodiment the FPUs can implement the IEEE 754-2008 standard for floating point arithmetic or enable variable precision floating point arithmetic. The graphics multiprocessor 234 can additionally include one or more fixed function or special function units to perform specific functions such as copy rectangle or pixel blending operations. In one embodiment one or more of the GPGPU cores can also include fixed or special function logic.

In one embodiment the GPGPU cores 262 include SIMD logic capable of performing a single instruction on multiple sets of data. In one embodiment GPGPU cores 262 can physically execute SIMD4, SIMD8, and SIMD16 instructions and logically execute SIMD1, SIMD2, and SIMD32 instructions. The SIMD instructions for the GPGPU cores can be generated at compile time by a shader compiler or automatically generated when executing programs written and compiled for single program multiple data (SPMD) or SIMT architectures. Multiple threads of a program configured for the SIMT execution model can be executed via a single SIMD instruction. For example and in one embodiment, eight SIMT threads that perform the same or similar operations can be executed in parallel via a single SIMD8 logic unit.

The memory and cache interconnect 268 is an interconnect network that connects each of the functional units of the graphics multiprocessor 234 to the register file 258 and to the shared memory 270. In one embodiment, the memory and cache interconnect 268 is a crossbar interconnect that allows the load/store unit 266 to implement load and store operations between the shared memory 270 and the register file 258. The register file 258 can operate at the same frequency as the GPGPU cores 262, thus data transfer between the GPGPU cores 262 and the register file 258 is very low latency. The shared memory 270 can be used to enable communication between threads that execute on the functional units within the graphics multiprocessor 234. The cache memory 272 can be used as a data cache for example, to cache texture data communicated between the functional units and the texture unit 236. The shared memory 270 can also be used as a program managed cached. Threads executing on the GPGPU cores 262 can programmatically store data within the shared memory in addition to the automatically cached data that is stored within the cache memory 272.

Figure 3A:
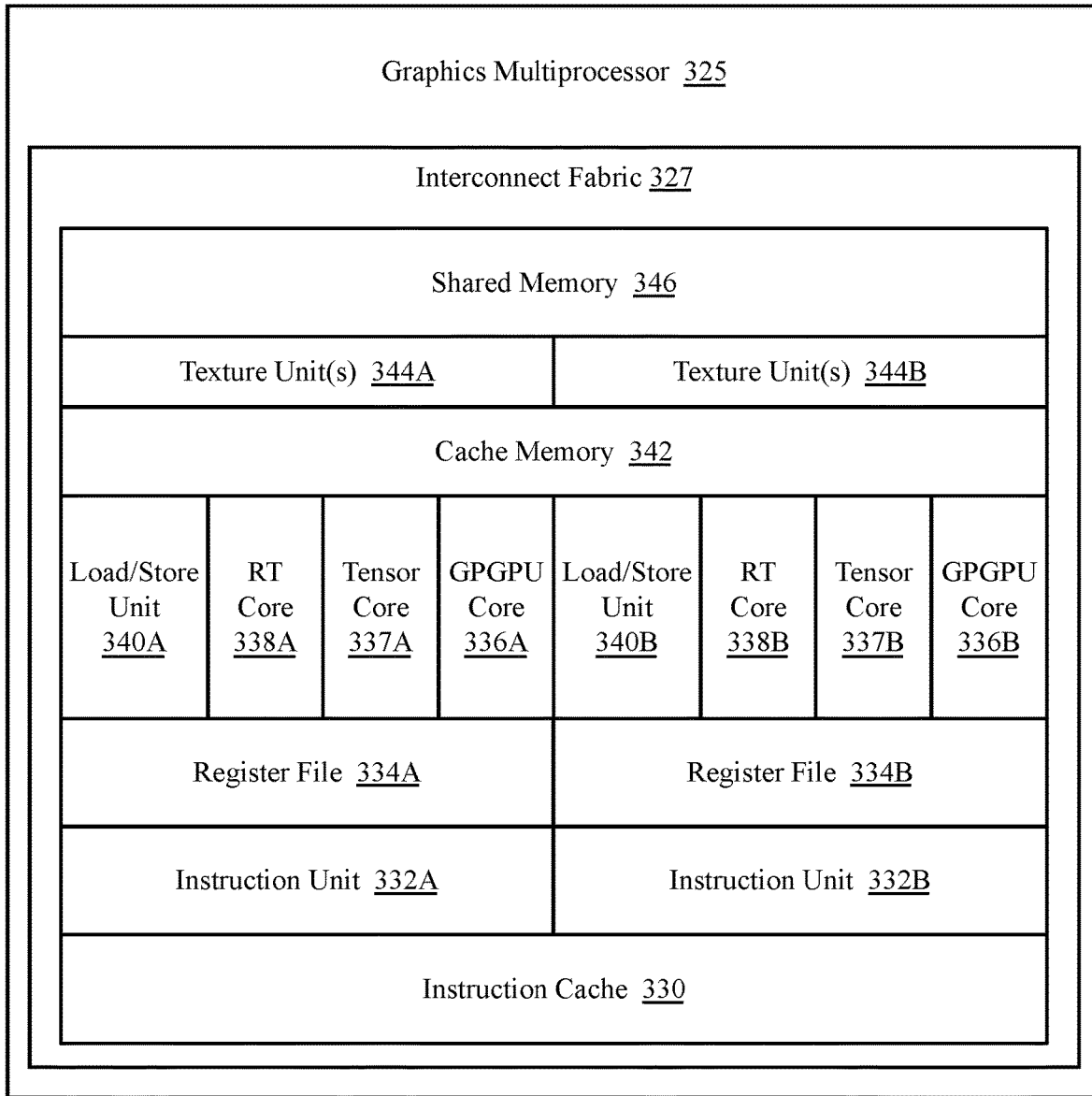
FIG. 3A-3C are block diagrams of graphics multiprocessors and multiprocessor-based GPUs, according to embodiments.
Figure 3B:
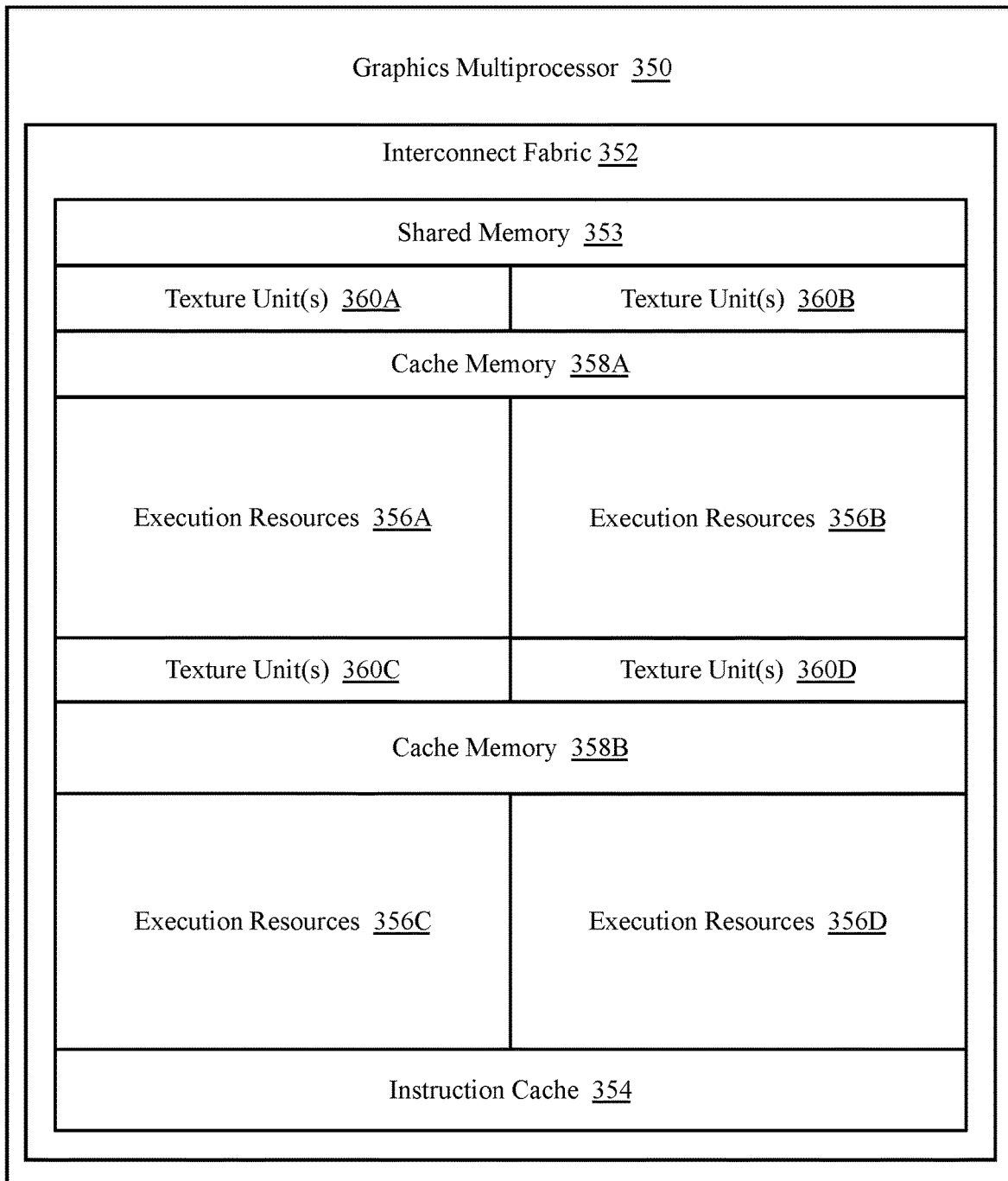
Figure 3C:
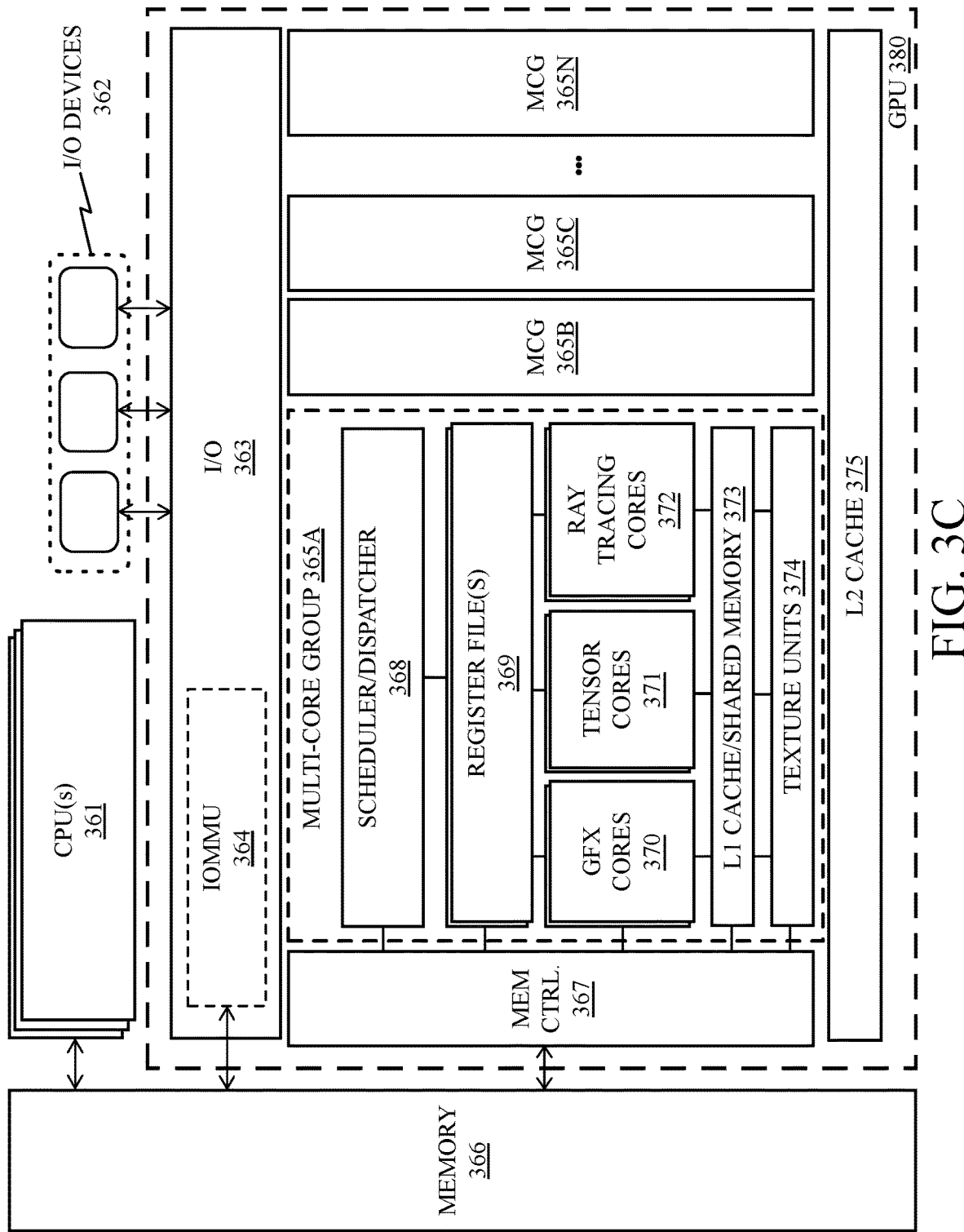

FIG. 3A-3C illustrate additional graphics multiprocessors, according to embodiments. FIG. 3A-3B illustrate graphics multiprocessors 325, 350, which are variants of the graphics multiprocessor 234 of FIG. 2C. FIG. 3C illustrates a graphics processing unit (GPU) 380 which includes dedicated sets of graphics processing resources arranged into multi-core groups 365A-365N. The illustrated graphics multiprocessors 325, 350 and the multi-core groups 365A-365N can be streaming multiprocessor (SM) capable of simultaneous execution of a large number of execution threads.

FIG. 3A shows a graphics multiprocessor 325 according to an additional embodiment. The graphics multiprocessor 325 includes multiple additional instances of execution resource units relative to the graphics multiprocessor 234 of FIG. 2D. For example, the graphics multiprocessor 325 can include multiple instances of the instruction unit 332A-332B, register file 334A-334B, and texture unit(s) 344A-344B. The graphics multiprocessor 325 also includes multiple sets of graphics or compute execution units (e.g., GPGPU core 336A-336B, tensor core 337A-337B, ray-tracing core 338A-338B) and multiple sets of load/store units 340A-340B. In one embodiment the execution resource units have a common instruction cache 330, texture and/or data cache memory 342, and shared memory 346.

The various components can communicate via an interconnect fabric 327. In one embodiment the interconnect fabric 327 includes one or more crossbar switches to enable communication between the various components of the graphics multiprocessor 325. In one embodiment the interconnect fabric 327 is a separate, high-speed network fabric layer upon which each component of the graphics multiprocessor 325 is stacked. The components of the graphics multiprocessor 325 communicate with remote components via the interconnect fabric 327. For example, the GPGPU cores 336A-336B, 337A-337B, and 3378A-338B can each communicate with shared memory 346 via the interconnect fabric 327. The interconnect fabric 327 can arbitrate communication within the graphics multiprocessor 325 to ensure a fair bandwidth allocation between components.

FIG. 3B shows a graphics multiprocessor 350 according to an additional embodiment. The graphics processor includes multiple sets of execution resources 356A-356D, where each set of execution resource includes multiple instruction units, register files, GPGPU cores, and load store units, as illustrated in FIG. 2D and FIG. 3A. The execution resources 356A-356D can work in concert with texture unit(s) 360A-360D for texture operations, while sharing an instruction cache 354, and shared memory 353. In one embodiment the execution resources 356A-356D can share an instruction cache 354 and shared memory 353, as well as multiple instances of a texture and/or data cache memory 358A-358B. The various components can communicate via an interconnect fabric 352 similar to the interconnect fabric 327 of FIG. 3A.

Persons skilled in the art will understand that the architecture described in FIGS. 1, 2A-2D, and 3A-3B are descriptive and not limiting as to the scope of the present embodiments. Thus, the techniques described herein may be implemented on any properly configured processing unit, including, without limitation, one or more mobile application processors, one or more desktop or server central processing units (CPUs) including multi-core CPUs, one or more parallel processing units, such as the parallel processing unit 202 of FIG. 2A, as well as one or more graphics processors or special purpose processing units, without departure from the scope of the embodiments described herein.

In some embodiments a parallel processor or GPGPU as described herein is communicatively coupled to host/processor cores to accelerate graphics operations, machine-learning operations, pattern analysis operations, and various general purpose GPU (GPGPU) functions. The GPU may be communicatively coupled to the host processor/cores over a bus or other interconnect (e.g., a high speed interconnect such as PCIe or NVLink). In other embodiments, the GPU may be integrated on the same package or chip as the cores and communicatively coupled to the cores over an internal processor bus/interconnect (i.e., internal to the package or chip). Regardless of the manner in which the GPU is connected, the processor cores may allocate work to the GPU in the form of sequences of commands/instructions contained in a work descriptor. The GPU then uses dedicated circuitry/logic for efficiently processing these commands/instructions.

FIG. 3C illustrates a graphics processing unit (GPU) 380 which includes dedicated sets of graphics processing resources arranged into multi-core groups 365A-N. While the details of only a single multi-core group 365A are provided, it will be appreciated that the other multi-core groups 365B-365N may be equipped with the same or similar sets of graphics processing resources.

As illustrated, a multi-core group 365A may include a set of graphics cores 370, a set of tensor cores 371, and a set of ray tracing cores 372. A scheduler/dispatcher 368 schedules and dispatches the graphics threads for execution on the various cores 370, 371, 372. A set of register files 369 store operand values used by the cores 370, 371, 372 when executing the graphics threads. These may include, for example, integer registers for storing integer values, floating point registers for storing floating point values, vector registers for storing packed data elements (integer and/or floating point data elements) and tile registers for storing tensor/matrix values. In one embodiment, the tile registers are implemented as combined sets of vector registers.

One or more combined level 1 (L1) caches and shared memory units 373 store graphics data such as texture data, vertex data, pixel data, ray data, bounding volume data, etc., locally within each multi-core group 365A. One or more texture units 374 can also be used to perform texturing operations, such as texture mapping and sampling. A Level 2 (L2) cache 375 shared by all or a subset of the multi-core groups 365A-365N stores graphics data and/or instructions for multiple concurrent graphics threads. As illustrated, the L2 cache 375 may be shared across a plurality of multi-core groups 365A-365N. One or more memory controllers 367 couple the GPU 380 to a memory 366 which may be a system memory (e.g., DRAM) and/or a dedicated graphics memory (e.g., GDDR6 memory).

Input/output (I/O) circuitry 363 couples the GPU 380 to one or more I/O devices 362 such as digital signal processors (DSPs), network controllers, or user input devices. An on-chip interconnect may be used to couple the I/O devices 362 to the GPU 380 and memory 366. One or more I/O memory management units (IOMMUs) 364 of the I/O circuitry 363 couple the I/O devices 362 directly to the system memory 366. In one embodiment, the IOMMU 364 manages multiple sets of page tables to map virtual addresses to physical addresses in system memory 366. In this embodiment, the I/O devices 362, CPU(s) 361, and GPU(s) 380 may share the same virtual address space.

In one implementation, the IOMMU 364 supports virtualization. In this case, it may manage a first set of page tables to map guest/graphics virtual addresses to guest/graphics physical addresses and a second set of page tables to map the guest/graphics physical addresses to system/host physical addresses (e.g., within system memory 366). The base addresses of each of the first and second sets of page tables may be stored in control registers and swapped out on a context switch (e.g., so that the new context is provided with access to the relevant set of page tables). While not illustrated in FIG. 3C, each of the cores 370, 371, 372 and/or multi-core groups 365A-365N may include translation lookaside buffers (TLBs) to cache guest virtual to guest physical translations, guest physical to host physical translations, and guest virtual to host physical translations.

In one embodiment, the CPU(s) 361, GPU(s) 380, and I/O devices 362 are integrated on a single semiconductor chip and/or chip package. The illustrated memory 366 may be integrated on the same chip or may be coupled to the memory controllers 367 via an off-chip interface. In one implementation, the memory 366 comprises GDDR6 memory which shares the same virtual address space as other physical system-level memories, although the underlying principles of the invention are not limited to this specific implementation.

In one embodiment, the tensor cores 371 include a plurality of execution units specifically designed to perform matrix operations, which are the fundamental compute operation used to perform deep learning operations. For example, simultaneous matrix multiplication operations may be used for neural network training and inferencing. The tensor cores 371 may perform matrix processing using a variety of operand precisions including single precision floating-point (e.g., 32 bits), half-precision floating point (e.g., 16 bits), integer words (16 bits), bytes (8 bits), and half-bytes (4 bits). In one embodiment, a neural network implementation extracts features of each rendered scene, potentially combining details from multiple frames, to construct a high-quality final image.

In deep learning implementations, parallel matrix multiplication work may be scheduled for execution on the tensor cores 371. The training of neural networks, in particular, requires a significant number matrix dot product operations. In order to process an inner-product formulation of an N×N×N matrix multiply, the tensor cores 371 may include at least N dot-product processing elements. Before the matrix multiply begins, one entire matrix is loaded into tile registers and at least one column of a second matrix is loaded each cycle for N cycles. Each cycle, there are N dot products that are processed.

Matrix elements may be stored at different precisions depending on the particular implementation, including 16-bit words, 8-bit bytes (e.g., INT8) and 4-bit half-bytes (e.g., INT4). Different precision modes may be specified for the tensor cores 371 to ensure that the most efficient precision is used for different workloads (e.g., such as inferencing workloads which can tolerate quantization to bytes and half-bytes).

In one embodiment, the ray tracing cores 372 accelerate ray tracing operations for both real-time ray tracing and non-real-time ray tracing implementations. In particular, the ray tracing cores 372 include ray traversal/intersection circuitry for performing ray traversal using bounding volume hierarchies (BVHs) and identifying intersections between rays and primitives enclosed within the BVH volumes. The ray tracing cores 372 may also include circuitry for performing depth testing and culling (e.g., using a Z buffer or similar arrangement). In one implementation, the ray tracing cores 372 perform traversal and intersection operations in concert with the image denoising techniques described herein, at least a portion of which may be executed on the tensor cores 371. For example, in one embodiment, the tensor cores 371 implement a deep learning neural network to perform denoising of frames generated by the ray tracing cores 372. However, the CPU(s) 361, graphics cores 370, and/or ray tracing cores 372 may also implement all or a portion of the denoising and/or deep learning algorithms.

In addition, as described above, a distributed approach to denoising may be employed in which the GPU 380 is in a computing device coupled to other computing devices over a network or high speed interconnect. In this embodiment, the interconnected computing devices share neural network learning/training data to improve the speed with which the overall system learns to perform denoising for different types of image frames and/or different graphics applications.

In one embodiment, the ray tracing cores 372 process all BVH traversal and ray-primitive intersections, saving the graphics cores 370 from being overloaded with thousands of instructions per ray. In one embodiment, each ray tracing core 372 includes a first set of specialized circuitry for performing bounding box tests (e.g., for traversal operations) and a second set of specialized circuitry for performing the ray-triangle intersection tests (e.g., intersecting rays which have been traversed). Thus, in one embodiment, the multi-core group 365A can simply launch a ray probe, and the ray tracing cores 372 independently perform ray traversal and intersection and return hit data (e.g., a hit, no hit, multiple hits, etc.) to the thread context. The other cores 370, 371 are freed to perform other graphics or compute work while the ray tracing cores 372 perform the traversal and intersection operations.

In one embodiment, each ray tracing core 372 includes a traversal unit to perform BVH testing operations and an intersection unit which performs ray-primitive intersection tests. The intersection unit generates a "hit", "no hit", or "multiple hit" response, which it provides to the appropriate thread. During the traversal and intersection operations, the execution resources of the other cores (e.g., graphics cores 370 and tensor cores 371) are freed to perform other forms of graphics work.

In one particular embodiment described below, a hybrid rasterization/ray tracing approach is used in which work is distributed between the graphics cores 370 and ray tracing cores 372.

In one embodiment, the ray tracing cores 372 (and/or other cores 370, 371) include hardware support for a ray tracing instruction set such as Microsoft's DirectX Ray Tracing (DXR) which includes a DispatchRays command, as well as ray-generation, closest-hit, any-hit, and miss shaders, which enable the assignment of unique sets of shaders and textures for each object. Another ray tracing platform which may be supported by the ray tracing cores 372, graphics cores 370 and tensor cores 371 is Vulkan 1.1.85. Note, however, that the underlying principles of the invention are not limited to any particular ray tracing ISA.

In general, the various cores 372, 371, 370 may support a ray tracing instruction set that includes instructions/functions for ray generation, closest hit, any hit, ray-primitive intersection, per-primitive and hierarchical bounding box construction, miss, visit, and exceptions. More specifically, one embodiment includes ray tracing instructions to perform the following functions:

Ray Generation—Ray generation instructions may be executed for each pixel, sample, or other user-defined work assignment.

Closest Hit—A closest hit instruction may be executed to locate the closest intersection point of a ray with primitives within a scene.

Any Hit—An any hit instruction identifies multiple intersections between a ray and primitives within a scene, potentially to identify a new closest intersection point.

Intersection—An intersection instruction performs a ray-primitive intersection test and outputs a result.

Per-primitive Bounding box Construction—This instruction builds a bounding box around a given primitive or group of primitives (e.g., when building a new BVH or other acceleration data structure).

Miss—Indicates that a ray misses all geometry within a scene, or specified region of a scene.

Visit—Indicates the children volumes a ray will traverse.

Exceptions—Includes various types of exception handlers (e.g., invoked for various error conditions).

Techniques for GPU to Host Processor Interconnection

Figure 4A:
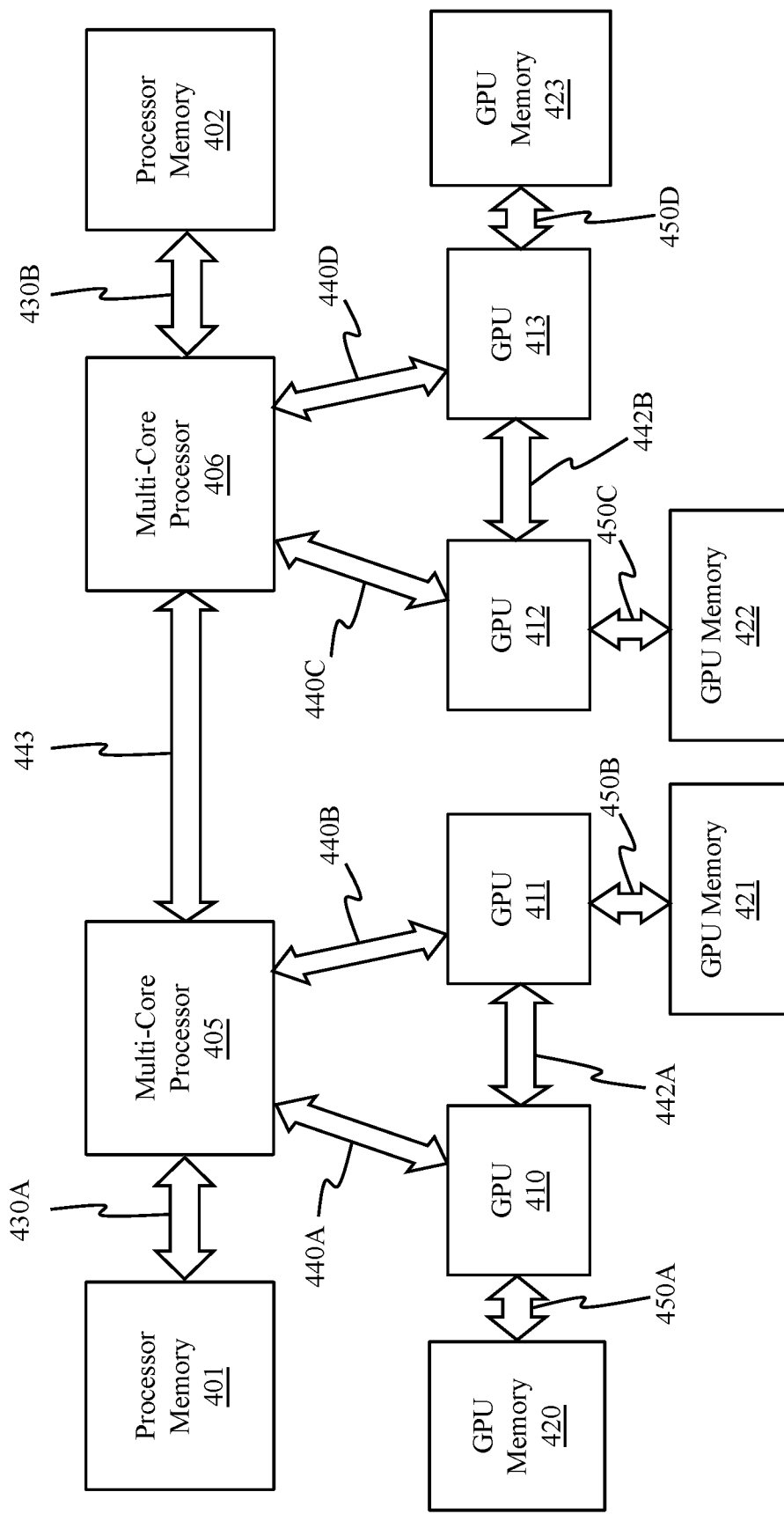
FIG. 4A-4F illustrate an exemplary architecture in which a plurality of GPUs is communicatively coupled to a plurality of multi-core processors.

FIG. 4A illustrates an exemplary architecture in which a plurality of GPUs 410-413 are communicatively coupled to a plurality of multi-core processors 405-406 over high-speed links 440A-440D (e.g., buses, point-to-point interconnects, etc.). In one embodiment, the high-speed links 440A-440D support a communication throughput of 4 GB/s, 30 GB/s, 80 GB/s or higher, depending on the implementation. Various interconnect protocols may be used including, but not limited to, PCIe 4.0 or 5.0 and NVLink 2.0. However, the underlying principles of the invention are not limited to any particular communication protocol or throughput.

In addition, in one embodiment, two or more of the GPUs 410-413 are interconnected over high-speed links 442A-442B, which may be implemented using the same or different protocols/links than those used for high-speed links 440A-440D. Similarly, two or more of the multi-core processors 405-406 may be connected over high speed link 443 which may be symmetric multi-processor (SMP) buses operating at 20 GB/s, 30 GB/s, 120 GB/s or higher. Alternatively, all communication between the various system components shown in FIG. 4A may be accomplished using the same protocols/links (e.g., over a common interconnection fabric). As mentioned, however, the underlying principles of the invention are not limited to any particular type of interconnect technology.

In one embodiment, each multi-core processor 405-406 is communicatively coupled to a processor memory 401-402, via memory interconnects 430A-430B, respectively, and each GPU 410-413 is communicatively coupled to GPU memory 420-423 over GPU memory interconnects 450A-450D, respectively. The memory interconnects 430A-430B and 450A-450D may utilize the same or different memory access technologies. By way of example, and not limitation, the processor memories 401-402 and GPU memories 420-423 may be volatile memories such as dynamic random access memories (DRAMs) (including stacked DRAMs), Graphics DDR SDRAM (GDDR) (e.g., GDDR5, GDDR6), or High Bandwidth Memory (HBM) and/or may be non-volatile memories such as 3D XPoint or Nano-Ram. In one embodiment, some portion of the memories may be volatile memory and another portion may be non-volatile memory (e.g., using a two-level memory (2LM) hierarchy).

As described below, although the various processors 405-406 and GPUs 410-413 may be physically coupled to a particular memory 401-402, 420-423, respectively, a unified memory architecture may be implemented in which the same virtual system address space (also referred to as the "effective address" space) is distributed among all of the various physical memories. For example, processor memories 401-402 may each comprise 64 GB of the system memory address space and GPU memories 420-423 may each comprise 32 GB of the system memory address space (resulting in a total of 256 GB addressable memory in this example).

Figure 4B:
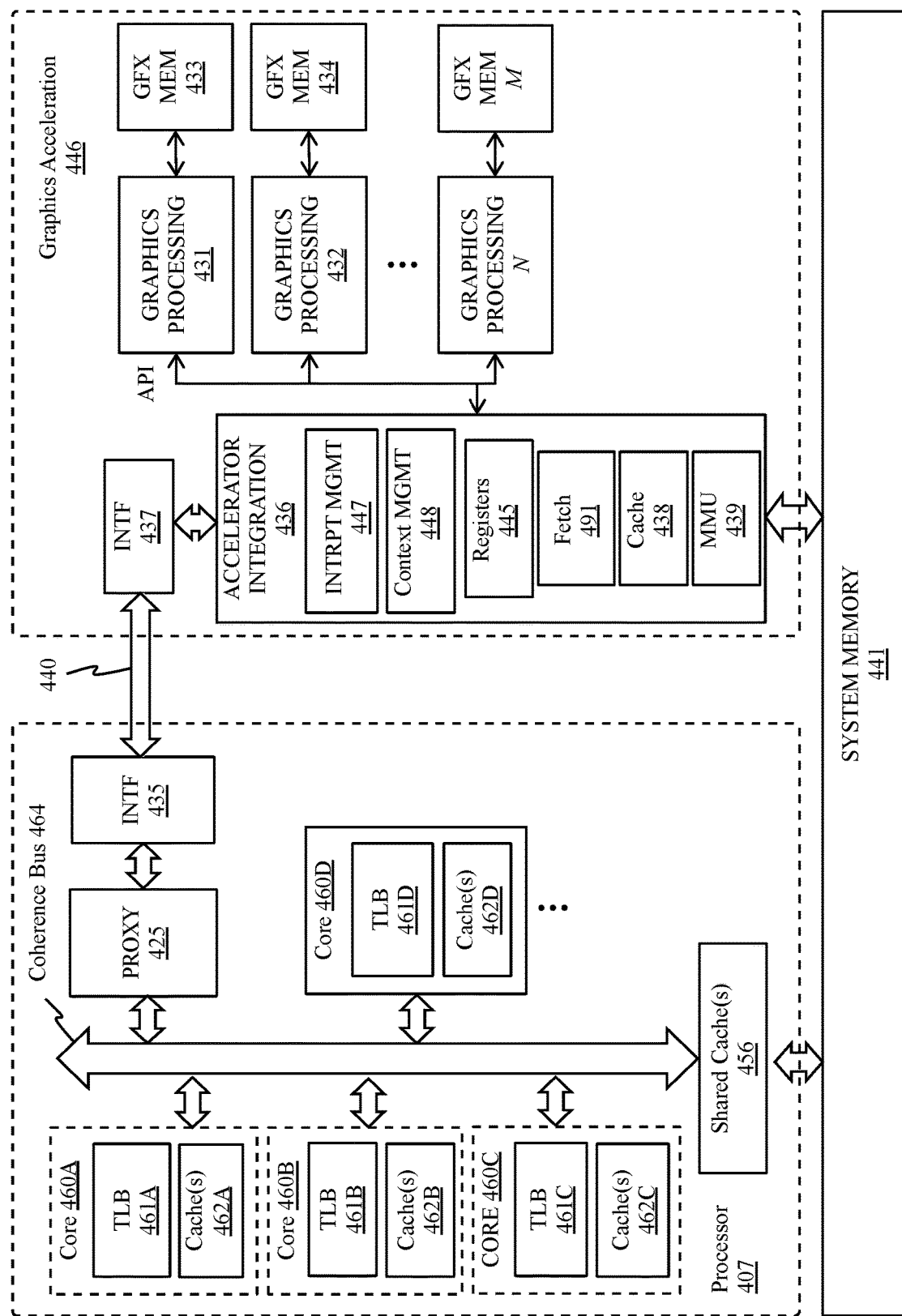

FIG. 4B illustrates additional details for an interconnection between a multi-core processor 407 and a graphics acceleration module 446 in accordance with one embodiment. The graphics acceleration module 446 may include one or more GPU chips integrated on a line card which is coupled to the processor 407 via the high-speed link 440. Alternatively, the graphics acceleration module 446 may be integrated on the same package or chip as the processor 407.

The illustrated processor 407 includes a plurality of cores 460A-460D, each with a translation lookaside buffer 461A-461D and one or more caches 462A-462D. The cores may include various other components for executing instructions and processing data which are not illustrated to avoid obscuring the underlying principles of the invention (e.g., instruction fetch units, branch prediction units, decoders, execution units, reorder buffers, etc.). The caches 462A-462D may comprise level 1 (L1) and level 2 (L2) caches. In addition, one or more shared caches 456 may be included in the caching hierarchy and shared by sets of the cores 460A-460D. For example, one embodiment of the processor 407 includes 24 cores, each with its own L1 cache, twelve shared L2 caches, and twelve shared L3 caches. In this embodiment, one of the L2 and L3 caches are shared by two adjacent cores. The processor 407 and the graphics accelerator integration module 446 connect with system memory 441, which may include processor memories 401-402.

Coherency is maintained for data and instructions stored in the various caches 462A-462D, 456 and system memory 441 via inter-core communication over a coherence bus 464. For example, each cache may have cache coherency logic/circuitry associated therewith to communicate to over the coherence bus 464 in response to detected reads or writes to particular cache lines. In one implementation, a cache snooping protocol is implemented over the coherence bus 464 to snoop cache accesses. Cache snooping/coherency techniques are well understood by those of skill in the art and will not be described in detail here to avoid obscuring the underlying principles of the invention.

In one embodiment, a proxy circuit 425 communicatively couples the graphics acceleration module 446 to the coherence bus 464, allowing the graphics acceleration module 446 to participate in the cache coherence protocol as a peer of the cores. In particular, an interface 435 provides connectivity to the proxy circuit 425 over high-speed link 440 (e.g., a PCIe bus, NVLink, etc.) and an interface 437 connects the graphics acceleration module 446 to the high-speed link 440.

In one implementation, an accelerator integration circuit 436 provides cache management, memory access, context management, and interrupt management services on behalf of a plurality of graphics processing engines 431, 432, N of the graphics acceleration module 446. The graphics processing engines 431, 432, N may each comprise a separate graphics processing unit (GPU). Alternatively, the graphics processing engines 431, 432, N may comprise different types of graphics processing engines within a GPU such as graphics execution units, media processing engines (e.g., video encoders/decoders), samplers, and blit engines. In other words, the graphics acceleration module may be a GPU with a plurality of graphics processing engines 431-432, N or the graphics processing engines 431-432, N may be individual GPUs integrated on a common package, line card, or chip.

In one embodiment, the accelerator integration circuit 436 includes a memory management unit (MMU) 439 for performing various memory management functions such as virtual-to-physical memory translations (also referred to as effective-to-real memory translations) and memory access protocols for accessing system memory 441. The MMU 439 may also include a translation lookaside buffer (TLB) (not shown) for caching the virtual/effective to physical/real address translations. In one implementation, a cache 438 stores commands and data for efficient access by the graphics processing engines 431-432, N. In one embodiment, the data stored in cache 438 and graphics memories 433-434, M is kept coherent with the core caches 462A-462D, 456 and system memory 411. As mentioned, this may be accomplished via proxy circuit 425 which takes part in the cache coherency mechanism on behalf of cache 438 and memories 433-434, M (e.g., sending updates to the cache 438 related to modifications/accesses of cache lines on processor caches 462A-462D, 456 and receiving updates from the cache 438).

A set of registers 445 store context data for threads executed by the graphics processing engines 431-432, N and a context management circuit 448 manages the thread contexts. For example, the context management circuit 448 may perform save and restore operations to save and restore contexts of the various threads during contexts switches (e.g., where a first thread is saved and a second thread is stored so that the second thread can be execute by a graphics processing engine). For example, on a context switch, the context management circuit 448 may store current register values to a designated region in memory (e.g., identified by a context pointer). It may then restore the register values when returning to the context. In one embodiment, an interrupt management circuit 447 receives and processes interrupts received from system devices.

In one implementation, virtual/effective addresses from a graphics processing engine 431 are translated to real/physical addresses in system memory 411 by the MMU 439. One embodiment of the accelerator integration circuit 436 supports multiple (e.g., 4, 8, 16) graphics accelerator modules 446 and/or other accelerator devices. The graphics accelerator module 446 may be dedicated to a single application executed on the processor 407 or may be shared between multiple applications. In one embodiment, a virtualized graphics execution environment is presented in which the resources of the graphics processing engines 431-432, N are shared with multiple applications or virtual machines (VMs). The resources may be subdivided into "slices" which are allocated to different VMs and/or applications based on the processing requirements and priorities associated with the VMs and/or applications.

Thus, the accelerator integration circuit acts as a bridge to the system for the graphics acceleration module 446 and provides address translation and system memory cache services. In addition, the accelerator integration circuit 436 may provide virtualization facilities for the host processor to manage virtualization of the graphics processing engines, interrupts, and memory management.

Because hardware resources of the graphics processing engines 431-432, N are mapped explicitly to the real address space seen by the host processor 407, any host processor can address these resources directly using an effective address value. One function of the accelerator integration circuit 436, in one embodiment, is the physical separation of the graphics processing engines 431-432, N so that they appear to the system as independent units.

As mentioned, in the illustrated embodiment, one or more graphics memories 433-434, M are coupled to each of the graphics processing engines 431-432, N, respectively. The graphics memories 433-434, M store instructions and data being processed by each of the graphics processing engines 431-432, N. The graphics memories 433-434, M may be volatile memories such as DRAMs (including stacked DRAMs), GDDR memory (e.g., GDDR5, GDDR6), or HBM, and/or may be non-volatile memories such as 3D XPoint or Nano-Ram.

In one embodiment, to reduce data traffic over the high-speed link 440, biasing techniques are used to ensure that the data stored in graphics memories 433-434, M is data which will be used most frequently by the graphics processing engines 431-432, N and preferably not used by the cores 460A-460D (at least not frequently). Similarly, the biasing mechanism attempts to keep data needed by the cores (and preferably not the graphics processing engines 431-432, N) within the caches 462A-462D, 456 of the cores and system memory 411.

Figure 4C:
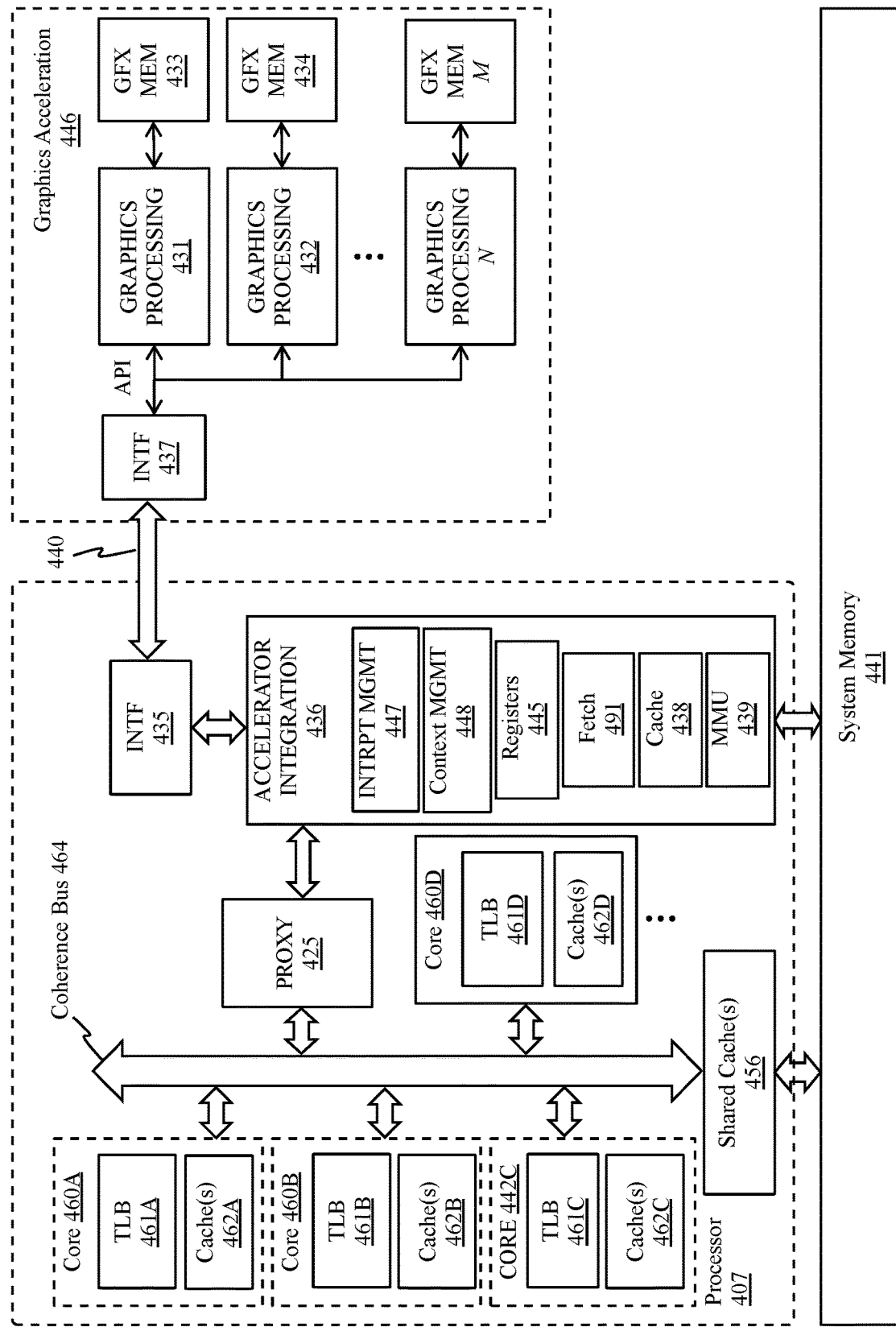

FIG. 4C illustrates another embodiment in which the accelerator integration circuit 436 is integrated within the processor 407. In this embodiment, the graphics processing engines 431-432, N communicate directly over the high-speed link 440 to the accelerator integration circuit 436 via interface 437 and interface 435 (which, again, may be utilize any form of bus or interface protocol). The accelerator integration circuit 436 may perform the same operations as those described with respect to FIG. 4B, but potentially at a higher throughput given its close proximity to the coherence bus 464 and caches 462A-462D, 456.

One embodiment supports different programming models including a dedicated-process programming model (no graphics acceleration module virtualization) and shared programming models (with virtualization). The latter may include programming models which are controlled by the accelerator integration circuit 436 and programming models which are controlled by the graphics acceleration module 446.

In one embodiment of the dedicated process model, graphics processing engines 431-432, N are dedicated to a single application or process under a single operating system. The single application can funnel other application requests to the graphics engines 431-432, N, providing virtualization within a VM/partition.

In the dedicated-process programming models, the graphics processing engines 431-432, N, may be shared by multiple VM/application partitions. The shared models require a system hypervisor to virtualize the graphics processing engines 431-432, N to allow access by each operating system. For single-partition systems without a hypervisor, the graphics processing engines 431-432, N are owned by the operating system. In both cases, the operating system can virtualize the graphics processing engines 431-432, N to provide access to each process or application.

For the shared programming model, the graphics acceleration module 446 or an individual graphics processing engine 431-432, N selects a process element using a process handle. In one embodiment, process elements are stored in system memory 411 and are addressable using the effective address to real address translation techniques described herein. The process handle may be an implementation-specific value provided to the host process when registering its context with the graphics processing engine 431-432, N (that is, calling system software to add the process element to the process element linked list). The lower 16-bits of the process handle may be the offset of the process element within the process element linked list.

Figure 4D:
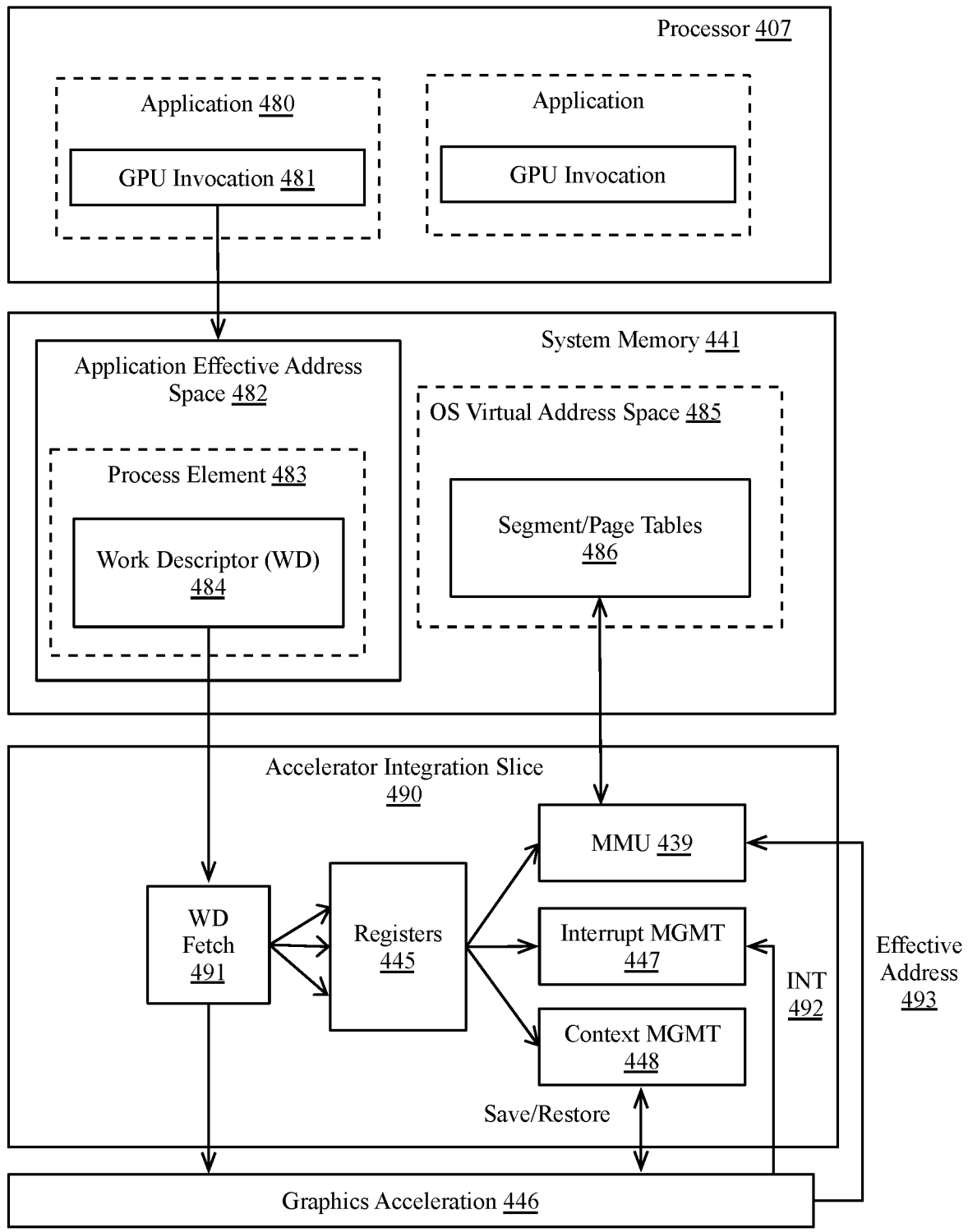

FIG. 4D illustrates an exemplary accelerator integration slice 490. As used herein, a "slice" comprises a specified portion of the processing resources of the accelerator integration circuit 436. Application effective address space 482 within system memory 411 stores process elements 483. In one embodiment, the process elements 483 are stored in response to GPU invocations 481 from applications 480 executed on the processor 407. A process element 483 contains the process state for the corresponding application 480. A work descriptor (WD) 484 contained in the process element 483 can be a single job requested by an application or may contain a pointer to a queue of jobs. In the latter case, the WD 484 is a pointer to the job request queue in the application's address space 482.

The graphics acceleration module 446 and/or the individual graphics processing engines 431-432, N can be shared by all or a subset of the processes in the system. Embodiments of the invention include an infrastructure for setting up the process state and sending a WD 484 to a graphics acceleration module 446 to start a job in a virtualized environment.

In one implementation, the dedicated-process programming model is implementation-specific. In this model, a single process owns the graphics acceleration module 446 or an individual graphics processing engine 431. Because the graphics acceleration module 446 is owned by a single process, the hypervisor initializes the accelerator integration circuit 436 for the owning partition and the operating system initializes the accelerator integration circuit 436 for the owning process at the time when the graphics acceleration module 446 is assigned.

In operation, a WD fetch unit 491 in the accelerator integration slice 490 fetches the next WD 484 which includes an indication of the work to be done by one of the graphics processing engines of the graphics acceleration module 446. Data from the WD 484 may be stored in registers 445 and used by the MMU 439, interrupt management circuit 447 and/or context management circuit 448 as illustrated. For example, one embodiment of the MMU 439 includes segment/page walk circuitry for accessing segment/page tables 486 within the OS virtual address space 485. The interrupt management circuit 447 may process interrupt events 492 received from the graphics acceleration module 446. When performing graphics operations, an effective address 493 generated by a graphics processing engine 431-432, N is translated to a real address by the MMU 439.

In one embodiment, the same set of registers 445 are duplicated for each graphics processing engine 431-432, N and/or graphics acceleration module 446 and may be initialized by the hypervisor or operating system. Each of these duplicated registers may be included in an accelerator integration slice 490. Exemplary registers that may be initialized by the hypervisor are shown in Table 1.

TABLE 1

Hypervisor Initialized Registers

| | |
|---|---|
| 1 | Slice Control Register |
| 2 | Real Address (RA) Scheduled Processes Area Pointer |
| 3 | Authority Mask Override Register |
| 4 | Interrupt Vector Table Entry Offset |
| 5 | Interrupt Vector Table Entry Limit |
| 6 | State Register |
| 7 | Logical Partition ID |
| 8 | Real address (RA) Hypervisor Accelerator Utilization Record Pointer |
| 9 | Storage Description Register |

Exemplary registers that may be initialized by the operating system are shown in Table 2.

TABLE 2

Operating System Initialized Registers

| | |
|---|---|
| 1 | Process and Thread Identification |
| 2 | Effective Address (EA) Context Save/Restore Pointer |
| 3 | Virtual Address (VA) Accelerator Utilization Record Pointer |
| 4 | Virtual Address (VA) Storage Segment Table Pointer |
| 5 | Authority Mask |
| 6 | Work descriptor |

In one embodiment, each WD 484 is specific to a particular graphics acceleration module 446 and/or graphics processing engine 431-432, N. It contains all the information a graphics processing engine 431-432, N requires to do its work or it can be a pointer to a memory location where the application has set up a command queue of work to be completed.

Figure 4E:
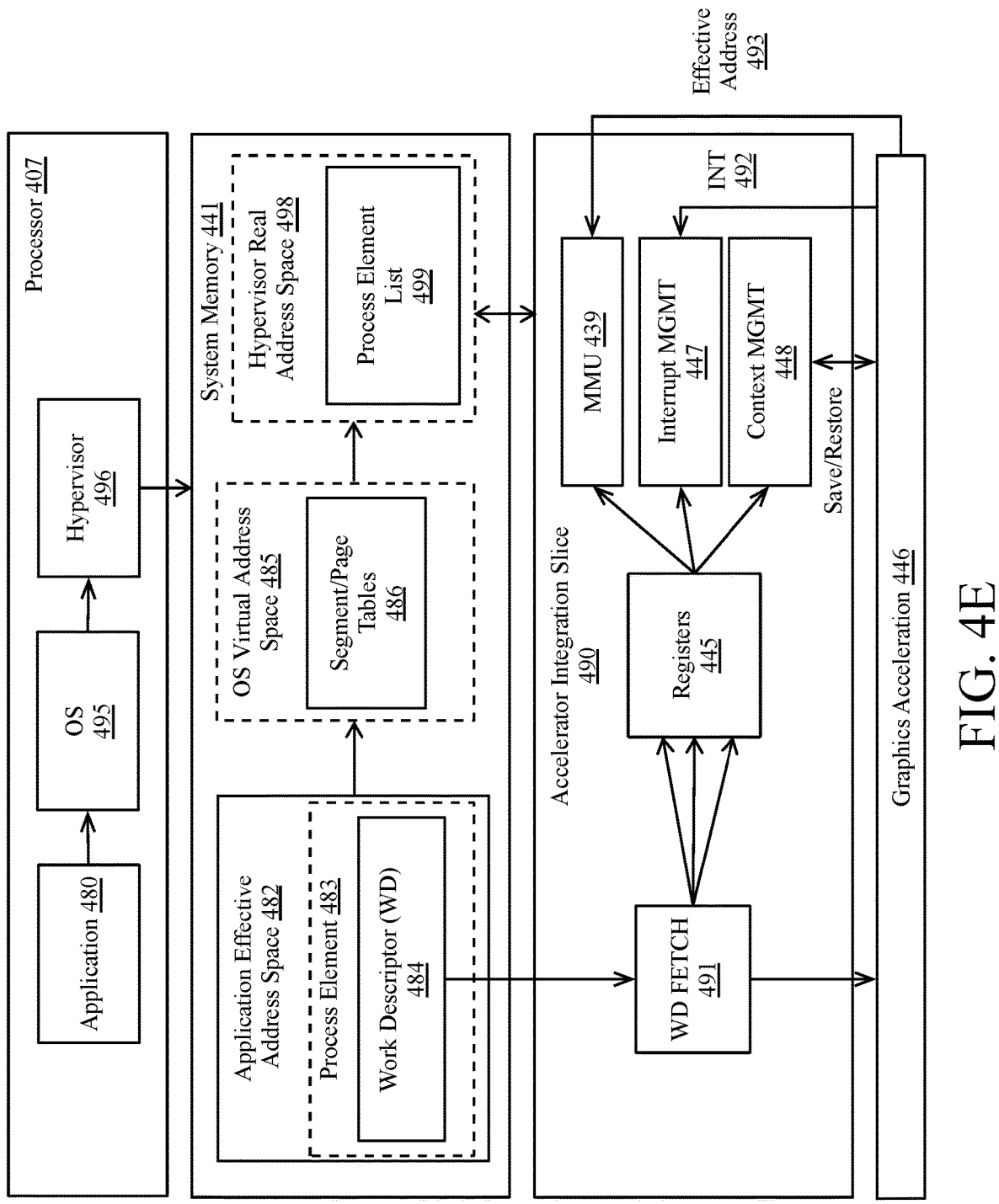

FIG. 4E illustrates additional details for one embodiment of a shared model. This embodiment includes a hypervisor real address space 498 in which a process element list 499 is stored. The hypervisor real address space 498 is accessible via a hypervisor 496 which virtualizes the graphics acceleration module engines for the operating system 495.

The shared programming models allow for all or a subset of processes from all or a subset of partitions in the system to use a graphics acceleration module 446. There are two programming models where the graphics acceleration module 446 is shared by multiple processes and partitions: time-sliced shared and graphics directed shared.

In this model, the system hypervisor 496 owns the graphics acceleration module 446 and makes its function available to all operating systems 495. For a graphics acceleration module 446 to support virtualization by the system hypervisor 496, the graphics acceleration module 446 may adhere to the following requirements: 1) An application's job request must be autonomous (that is, the state does not need to be maintained between jobs), or the graphics acceleration module 446 must provide a context save and restore mechanism. 2) An application's job request is guaranteed by the graphics acceleration module 446 to complete in a specified amount of time, including any translation faults, or the graphics acceleration module 446 provides the ability to preempt the processing of the job. 3) The graphics acceleration module 446 must be guaranteed fairness between processes when operating in the directed shared programming model.

In one embodiment, for the shared model, the application 480 is required to make an operating system 495 system call with a graphics acceleration module 446 type, a work descriptor (WD), an authority mask register (AMR) value, and a context save/restore area pointer (CSRP). The graphics acceleration module 446 type describes the targeted acceleration function for the system call. The graphics acceleration module 446 type may be a system-specific value. The WD is formatted specifically for the graphics acceleration module 446 and can be in the form of a graphics acceleration module 446 command, an effective address pointer to a user-defined structure, an effective address pointer to a queue of commands, or any other data structure to describe the work to be done by the graphics acceleration module 446. In one embodiment, the AMR value is the AMR state to use for the current process. The value passed to the operating system is similar to an application setting the AMR. If the accelerator integration circuit 436 and graphics acceleration module 446 implementations do not support a User Authority Mask Override Register (UAMOR), the operating system may apply the current UAMOR value to the AMR value before passing the AMR in the hypervisor call. The hypervisor 496 may optionally apply the current Authority Mask Override Register (AMOR) value before placing the AMR into the process element 483. In one embodiment, the CSRP is one of the registers 445 containing the effective address of an area in the application's address space 482 for the graphics acceleration module 446 to save and restore the context state. This pointer is optional if no state is required to be saved between jobs or when a job is preempted. The context save/restore area may be pinned system memory.

Upon receiving the system call, the operating system 495 may verify that the application 480 has registered and been given the authority to use the graphics acceleration module 446. The operating system 495 then calls the hypervisor 496 with the information shown in Table 3.

TABLE 3

OS to Hypervisor Call Parameters

| | |
|---|---|
| 1 | A work descriptor (WD) |
| 2 | An Authority Mask Register (AMR) value (potentially masked). |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | The virtual address of the storage segment table pointer (SSTP) |
| 7 | A logical interrupt service number (LISN) |

Upon receiving the hypervisor call, the hypervisor 496 verifies that the operating system 495 has registered and been given the authority to use the graphics acceleration module 446. The hypervisor 496 then puts the process element 483 into the process element linked list for the corresponding graphics acceleration module 446 type. The process element may include the information shown in Table 4.

TABLE 4

Process Element Information

1  A work descriptor (WD)
2  An Authority Mask Register (AMR) value (potentially masked).
3  An effective address (EA) Context Save/Restore Area Pointer (CSRP)
4  A process ID (PID) and optional thread ID (TID)
5  A virtual address (VA) accelerator utilization record pointer (AURP)
6  The virtual address of the storage segment table pointer (SSTP)
7  A logical interrupt service number (LISN)
8  Interrupt vector table, derived from the hypervisor call parameters.
9  A state register (SR) value
10 A logical partition ID (LPID)
11 A real address (RA) hypervisor accelerator utilization record pointer
12 The Storage Descriptor Register (SDR)

In one embodiment, the hypervisor initializes a plurality of accelerator integration slice 490 registers 445.

Figure 4F:
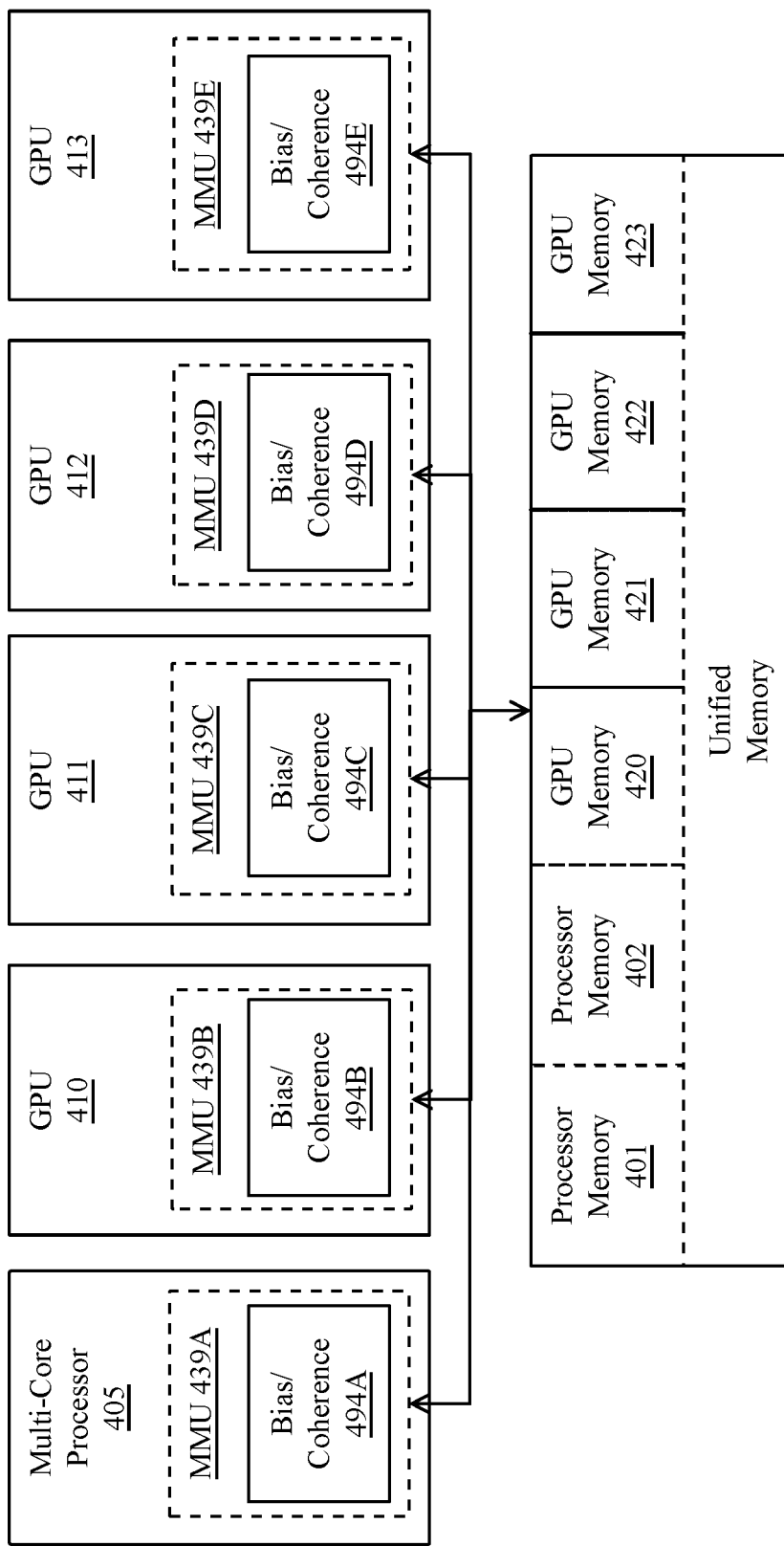

As illustrated in FIG. 4F, one embodiment of the invention employs a unified memory addressable via a common virtual memory address space used to access the physical processor memories 401-402 and GPU memories 420-423. In this implementation, operations executed on the GPUs 410-413 utilize the same virtual/effective memory address space to access the processors memories 401-402 and vice versa, thereby simplifying programmability. In one embodiment, a first portion of the virtual/effective address space is allocated to the processor memory 401, a second portion to the second processor memory 402, a third portion to the GPU memory 420, and so on. The entire virtual/effective memory space (sometimes referred to as the effective address space) is thereby distributed across each of the processor memories 401-402 and GPU memories 420-423, allowing any processor or GPU to access any physical memory with a virtual address mapped to that memory.

In one embodiment, bias/coherence management circuitry 494A-494E within one or more of the MMUs 439A-439E ensures cache coherence between the caches of the host processors (e.g., 405) and the GPUs 410-413 and implements biasing techniques indicating the physical memories in which certain types of data should be stored. While multiple instances of bias/coherence management circuitry 494A-494E are illustrated in FIG. 4F, the bias/coherence circuitry may be implemented within the MMU of one or more host processors 405 and/or within the accelerator integration circuit 436.

One embodiment allows GPU-attached memory 420-423 to be mapped as part of system memory, and accessed using shared virtual memory (SVM) technology, but without suffering the typical performance drawbacks associated with full system cache coherence. The ability to GPU-attached memory 420-423 to be accessed as system memory without onerous cache coherence overhead provides a beneficial operating environment for GPU offload. This arrangement allows the host processor 405 software to setup operands and access computation results, without the overhead of tradition I/O DMA data copies. Such traditional copies involve driver calls, interrupts and memory mapped I/O (MMIO) accesses that are all inefficient relative to simple memory accesses. At the same time, the ability to access GPU attached memory 420-423 without cache coherence overheads can be critical to the execution time of an offloaded computation. In cases with substantial streaming write memory traffic, for example, cache coherence overhead can significantly reduce the effective write bandwidth seen by a GPU 410-413. The efficiency of operand setup, the efficiency of results access, and the efficiency of GPU computation all play a role in determining the effectiveness of GPU offload.

In one implementation, the selection of between GPU bias and host processor bias is driven by a bias tracker data structure. A bias table may be used, for example, which may be a page-granular structure (i.e., controlled at the granularity of a memory page) that includes 1 or 2 bits per GPU-attached memory page. The bias table may be implemented in a stolen memory range of one or more GPU-attached memories 420-423, with or without a bias cache in the GPU 410-413 (e.g., to cache frequently/recently used entries of the bias table). Alternatively, the entire bias table may be maintained within the GPU.

In one implementation, the bias table entry associated with each access to the GPU-attached memory 420-423 is accessed prior the actual access to the GPU memory, causing the following operations. First, local requests from the GPU 410-413 that find their page in GPU bias are forwarded directly to a corresponding GPU memory 420-423. Local requests from the GPU that find their page in host bias are forwarded to the processor 405 (e.g., over a high-speed link as discussed above). In one embodiment, requests from the processor 405 that find the requested page in host processor bias complete the request like a normal memory read. Alternatively, requests directed to a GPU-biased page may be forwarded to the GPU 410-413. The GPU may then transition the page to a host processor bias if it is not currently using the page.

The bias state of a page can be changed either by a software-based mechanism, a hardware-assisted software-based mechanism, or, for a limited set of cases, a purely hardware-based mechanism.

One mechanism for changing the bias state employs an API call (e.g. OpenCL), which, in turn, calls the GPU's device driver which, in turn, sends a message (or enqueues a command descriptor) to the GPU directing it to change the bias state and, for some transitions, perform a cache flushing operation in the host. The cache flushing operation is required for a transition from host processor 405 bias to GPU bias, but is not required for the opposite transition.

In one embodiment, cache coherency is maintained by temporarily rendering GPU-biased pages uncacheable by the host processor 405. To access these pages, the processor 405 may request access from the GPU 410 which may or may not grant access right away, depending on the implementation. Thus, to reduce communication between the host processor 405 and GPU 410 it is beneficial to ensure that GPU-biased pages are those which are required by the GPU but not the host processor 405 and vice versa.

Graphics Processing Pipeline

Figure 5:
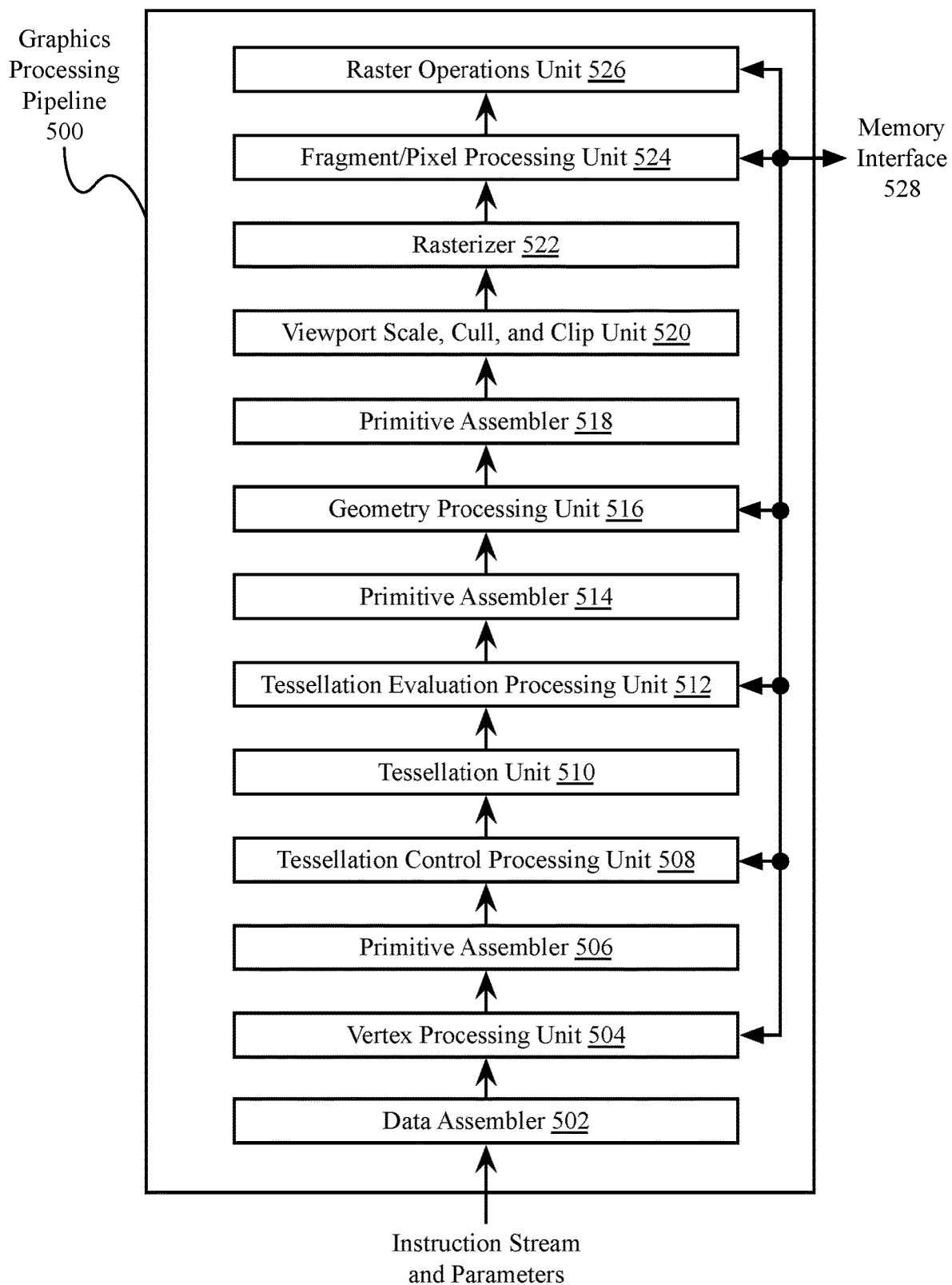
FIG. 5 illustrates a graphics processing pipeline, according to an embodiment.

FIG. 5 illustrates a graphics processing pipeline 500, according to an embodiment. In one embodiment a graphics processor can implement the illustrated graphics processing pipeline 500. The graphics processor can be included within the parallel processing subsystems as described herein, such as the parallel processor 200 of FIG. 2A, which, in one embodiment, is a variant of the parallel processor(s) 112 of FIG. 1. The various parallel processing systems can implement the graphics processing pipeline 500 via one or more instances of the parallel processing unit (e.g., parallel processing unit 202 of FIG. 2A) as described herein. For example, a shader unit (e.g., graphics multiprocessor 234 of FIG. 2C) may be configured to perform the functions of one or more of a vertex processing unit 504, a tessellation control processing unit 508, a tessellation evaluation processing unit 512, a geometry processing unit 516, and a fragment/pixel processing unit 524. The functions of data assembler 502, primitive assemblers 506, 514, 518, tessellation unit 510, rasterizer 522, and raster operations unit 526 may also be performed by other processing engines within a processing cluster (e.g., processing cluster 214 of FIG. 2A) and a corresponding partition unit (e.g., partition unit 220A-220N of FIG. 2A). The graphics processing pipeline 500 may also be implemented using dedicated processing units for one or more functions. In one embodiment, one or more portions of the graphics processing pipeline 500 can be performed by parallel processing logic within a general purpose processor (e.g., CPU). In one embodiment, one or more portions of the graphics processing pipeline 500 can access on-chip memory (e.g., parallel processor memory 222 as in FIG. 2A) via a memory interface 528, which may be an instance of the memory interface 218 of FIG. 2A.

In one embodiment the data assembler 502 is a processing unit that collects vertex data for surfaces and primitives. The data assembler 502 then outputs the vertex data, including the vertex attributes, to the vertex processing unit 504. The vertex processing unit 504 is a programmable execution unit that executes vertex shader programs, lighting and transforming vertex data as specified by the vertex shader programs. The vertex processing unit 504 reads data that is stored in cache, local or system memory for use in processing the vertex data and may be programmed to transform the vertex data from an object-based coordinate representation to a world space coordinate space or a normalized device coordinate space.

A first instance of a primitive assembler 506 receives vertex attributes from the vertex processing unit 504. The primitive assembler 506 readings stored vertex attributes as needed and constructs graphics primitives for processing by tessellation control processing unit 508. The graphics primitives include triangles, line segments, points, patches, and so forth, as supported by various graphics processing application programming interfaces (APIs).

The tessellation control processing unit 508 treats the input vertices as control points for a geometric patch. The control points are transformed from an input representation from the patch (e.g., the patch's bases) to a representation that is suitable for use in surface evaluation by the tessellation evaluation processing unit 512. The tessellation control processing unit 508 can also compute tessellation factors for edges of geometric patches. A tessellation factor applies to a single edge and quantifies a view-dependent level of detail associated with the edge. A tessellation unit 510 is configured to receive the tessellation factors for edges of a patch and to tessellate the patch into multiple geometric primitives such as line, triangle, or quadrilateral primitives, which are transmitted to a tessellation evaluation processing unit 512. The tessellation evaluation processing unit 512 operates on parameterized coordinates of the subdivided patch to generate a surface representation and vertex attributes for each vertex associated with the geometric primitives.

A second instance of a primitive assembler 514 receives vertex attributes from the tessellation evaluation processing unit 512, reading stored vertex attributes as needed, and constructs graphics primitives for processing by the geometry processing unit 516. The geometry processing unit 516 is a programmable execution unit that executes geometry shader programs to transform graphics primitives received from primitive assembler 514 as specified by the geometry shader programs. In one embodiment the geometry processing unit 516 is programmed to subdivide the graphics primitives into one or more new graphics primitives and calculate parameters used to rasterize the new graphics primitives.

In some embodiments the geometry processing unit 516 can add or delete elements in the geometry stream. The geometry processing unit 516 outputs the parameters and vertices specifying new graphics primitives to primitive assembler 518. The primitive assembler 518 receives the parameters and vertices from the geometry processing unit 516 and constructs graphics primitives for processing by a viewport scale, cull, and clip unit 520. The geometry processing unit 516 reads data that is stored in parallel processor memory or system memory for use in processing the geometry data. The viewport scale, cull, and clip unit 520 performs clipping, culling, and viewport scaling and outputs processed graphics primitives to a rasterizer 522.

The rasterizer 522 can perform depth culling and other depth-based optimizations. The rasterizer 522 also performs scan conversion on the new graphics primitives to generate fragments and output those fragments and associated coverage data to the fragment/pixel processing unit 524. The fragment/pixel processing unit 524 is a programmable execution unit that is configured to execute fragment shader programs or pixel shader programs. The fragment/pixel processing unit 524 transforming fragments or pixels received from rasterizer 522, as specified by the fragment or pixel shader programs. For example, the fragment/pixel processing unit 524 may be programmed to perform operations included but not limited to texture mapping, shading, blending, texture correction and perspective correction to produce shaded fragments or pixels that are output to a raster operations unit 526. The fragment/pixel processing unit 524 can read data that is stored in either the parallel processor memory or the system memory for use when processing the fragment data. Fragment or pixel shader programs may be configured to shade at sample, pixel, tile, or other granularities depending on the sampling rate configured for the processing units.

The raster operations unit 526 is a processing unit that performs raster operations including, but not limited to stencil, z-test, blending, and the like, and outputs pixel data as processed graphics data to be stored in graphics memory (e.g., parallel processor memory 222 as in FIG. 2A, and/or system memory 104 as in FIG. 1), to be displayed on the one or more display device(s) 110A-110B or for further processing by one of the one or more processor(s) 102 or parallel processor(s) 112. In some embodiments the raster operations unit 526 is configured to compress z or color data that is written to memory and decompress z or color data that is read from memory.

Machine Learning Overview

The architecture described above can be applied to perform training and inference operations using machine learning models. Machine learning has been successful at solving many kinds of tasks. The computations that arise when training and using machine learning algorithms (e.g., neural networks) lend themselves naturally to efficient parallel implementations. Accordingly, parallel processors such as general-purpose graphics processing units (GPGPUs) have played a significant role in the practical implementation of deep neural networks. Parallel graphics processors with single instruction, multiple thread (SIMT) architectures are designed to maximize the amount of parallel processing in the graphics pipeline. In an SIMT architecture, groups of parallel threads attempt to execute program instructions synchronously together as often as possible to increase processing efficiency. The efficiency provided by parallel machine learning algorithm implementations allows the use of high capacity networks and enables those networks to be trained on larger datasets.

A machine learning algorithm is an algorithm that can learn based on a set of data. Embodiments of machine learning algorithms can be designed to model high-level abstractions within a data set. For example, image recognition algorithms can be used to determine which of several categories to which a given input belong; regression algorithms can output a numerical value given an input; and pattern recognition algorithms can be used to generate translated text or perform text to speech and/or speech recognition.

An exemplary type of machine learning algorithm is a neural network. There are many types of neural networks; a simple type of neural network is a feedforward network. A feedforward network may be implemented as an acyclic graph in which the nodes are arranged in layers. Typically, a feedforward network topology includes an input layer and an output layer that are separated by at least one hidden layer. The hidden layer transforms input received by the input layer into a representation that is useful for generating output in the output layer. The network nodes are fully connected via edges to the nodes in adjacent layers, but there are no edges between nodes within each layer. Data received at the nodes of an input layer of a feedforward network are propagated (i.e., "fed forward") to the nodes of the output layer via an activation function that calculates the states of the nodes of each successive layer in the network based on coefficients ("weights") respectively associated with each of the edges connecting the layers. Depending on the specific model being represented by the algorithm being executed, the output from the neural network algorithm can take various forms.

Before a machine learning algorithm can be used to model a particular problem, the algorithm is trained using a training data set. Training a neural network involves selecting a network topology, using a set of training data representing a problem being modeled by the network, and adjusting the weights until the network model performs with a minimal error for all instances of the training data set. For example, during a supervised learning training process for a neural network, the output produced by the network in response to the input representing an instance in a training data set is compared to the "correct" labeled output for that instance, an error signal representing the difference between the output and the labeled output is calculated, and the weights associated with the connections are adjusted to minimize that error as the error signal is backward propagated through the layers of the network. The network is considered "trained" when the errors for each of the outputs generated from the instances of the training data set are minimized.

The accuracy of a machine learning algorithm can be affected significantly by the quality of the data set used to train the algorithm. The training process can be computationally intensive and may require a significant amount of time on a conventional general-purpose processor. Accordingly, parallel processing hardware is used to train many types of machine learning algorithms. This is particularly useful for optimizing the training of neural networks, as the computations performed in adjusting the coefficients in neural networks lend themselves naturally to parallel implementations. Specifically, many machine learning algorithms and software applications have been adapted to make use of the parallel processing hardware within general-purpose graphics processing devices.

Figure 6:
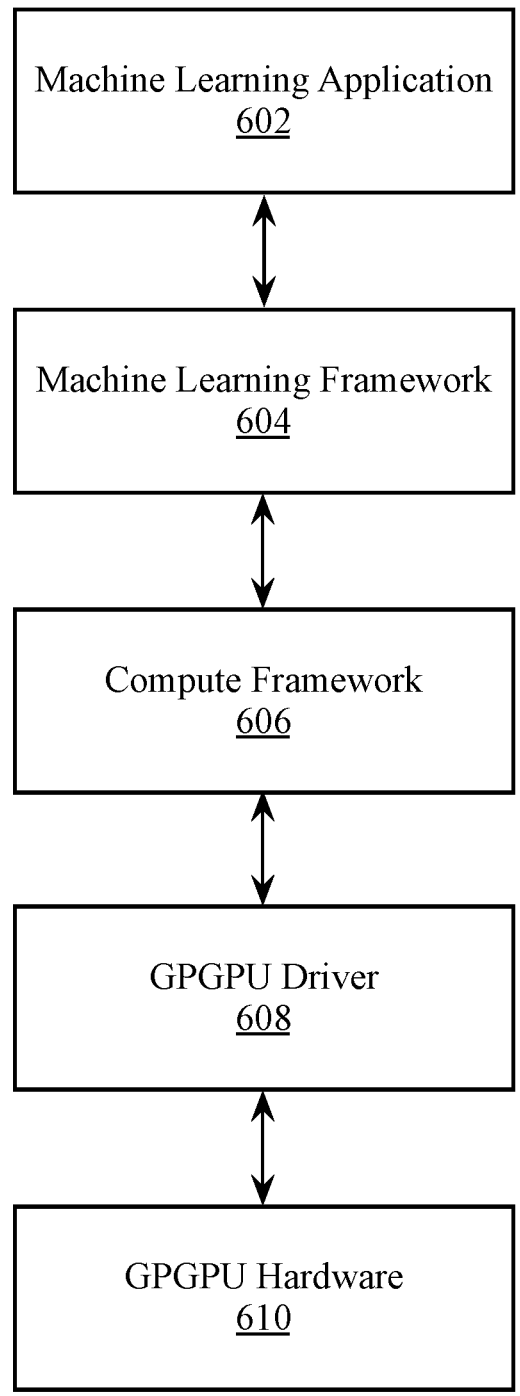
FIG. 6 illustrates a machine learning software stack, according to an embodiment.

FIG. 6 is a generalized diagram of a machine learning software stack 600. A machine learning application 602 can be configured to train a neural network using a training dataset or to use a trained deep neural network to implement machine intelligence. The machine learning application 602 can include training and inference functionality for a neural network and/or specialized software that can be used to train a neural network before deployment. The machine learning application 602 can implement any type of machine intelligence including but not limited to image recognition, mapping and localization, autonomous navigation, speech synthesis, medical imaging, or language translation.

Hardware acceleration for the machine learning application 602 can be enabled via a machine learning framework 604. The machine learning framework 604 can provide a library of machine learning primitives. Machine learning primitives are basic operations that are commonly performed by machine learning algorithms. Without the machine learning framework 604, developers of machine learning algorithms would be required to create and optimize the main computational logic associated with the machine learning algorithm, then re-optimize the computational logic as new parallel processors are developed. Instead, the machine learning application can be configured to perform the necessary computations using the primitives provided by the machine learning framework 604. Exemplary primitives include tensor convolutions, activation functions, and pooling, which are computational operations that are performed while training a convolutional neural network (CNN). The machine learning framework 604 can also provide primitives to implement basic linear algebra subprograms performed by many machine-learning algorithms, such as matrix and vector operations.

The machine learning framework 604 can process input data received from the machine learning application 602 and generate the appropriate input to a compute framework 606. The compute framework 606 can abstract the underlying instructions provided to the GPGPU driver 608 to enable the machine learning framework 604 to take advantage of hardware acceleration via the GPGPU hardware 610 without requiring the machine learning framework 604 to have intimate knowledge of the architecture of the GPGPU hardware 610. Additionally, the compute framework 606 can enable hardware acceleration for the machine learning framework 604 across a variety of types and generations of the GPGPU hardware 610.

GPGPU Machine Learning Acceleration

Figure 7:
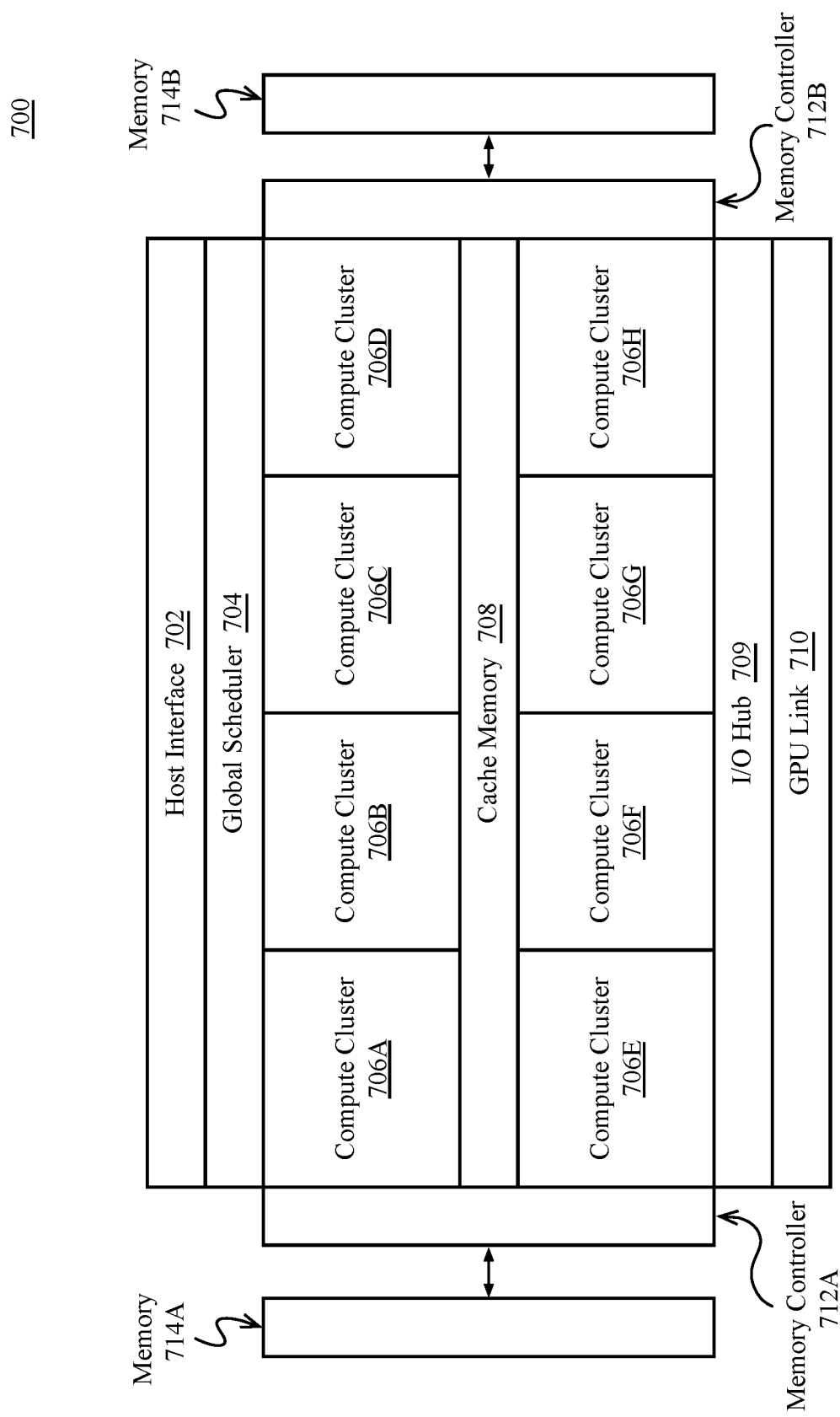
FIG. 7 illustrates a general-purpose graphics processing unit, according to an embodiment.

FIG. 7 illustrates a general-purpose graphics processing unit 700, according to an embodiment. In one embodiment, the general-purpose processing unit (GPGPU) 700 can be configured to be particularly efficient in processing the type of computational workloads associated with training deep neural networks. Additionally, the GPGPU 700 can be linked directly to other instances of the GPGPU to create a multi-GPU cluster to improve training speed for particularly deep neural networks.

The GPGPU 700 includes a host interface 702 to enable a connection with a host processor. In one embodiment the host interface 702 is a PCI Express interface. However, the host interface can also be a vendor specific communications interface or communications fabric. The GPGPU 700 receives commands from the host processor and uses a global scheduler 704 to distribute execution threads associated with those commands to a set of compute clusters 706A-706H. The compute clusters 706A-706H share a cache memory 708. The cache memory 708 can serve as a higher-level cache for cache memories within the compute clusters 706A-706H.

The GPGPU 700 includes memory 714A-B coupled with the compute clusters 706A-H via a set of memory controllers 712A-712B. In various embodiments, the memory 714A-714B can include various types of memory devices including dynamic random-access memory (DRAM) or graphics random access memory, such as synchronous graphics random access memory (SGRAM), including graphics double data rate (GDDR) memory. In one embodiment, the memory 714A-714N may also include 3D stacked memory, including but not limited to high bandwidth memory (HBM).

In one embodiment, each of the compute clusters 706A-706H includes a set of graphics multiprocessors, such as the graphics multiprocessor 325 of FIG. 3A. The graphics multiprocessors of the compute cluster multiple types of integer and floating-point logic units that can perform computational operations at a range of precisions including suited for machine learning computations. For example, and in one embodiment at least a subset of the floating-point units in each of the compute clusters 706A-H can be configured to perform 16-bit or 32-bit floating point operations, while a different subset of the floating-point units can be configured to perform 64-bit floating point operations.

Multiple instances of the GPGPU 700 can be configured to operate as a compute cluster. The communication mechanism used by the compute cluster for synchronization and data exchange varies across embodiments. In one embodiment, the multiple instances of the GPGPU 700 communicate over the host interface 702. In one embodiment the GPGPU 700 includes an I/O hub 709 that couples the GPGPU 700 with a GPU link 710 that enables a direct connection to other instances of the GPGPU. In one embodiment the GPU link 710 is coupled to a dedicated GPU-to-GPU bridge that enables communication and synchronization between multiple instances of the GPGPU 700. In one embodiment the GPU link 710 couples with a high-speed interconnect to transmit and receive data to other GPGPUs or parallel processors. In one embodiment the multiple instances of the GPGPU 700 are located in separate data processing systems and communicate via a network device that is accessible via the host interface 702. In one embodiment the GPU link 710 can be configured to enable a connection to a host processor in addition to or as an alternative to the host interface 702.

While the illustrated configuration of the GPGPU 700 can be configured to train neural networks, one embodiment provides alternate configuration of the GPGPU 700 that can be configured for deployment within a high performance or low power inferencing platform. In an inferencing configuration, the GPGPU 700 includes fewer of the compute clusters 706A-706H relative to the training configuration. Additionally, memory technology associated with the memory 714A-714B may differ between inferencing and training configurations. In one embodiment, the inferencing configuration of the GPGPU 700 can support inferencing specific instructions. For example, an inferencing configuration can provide support for one or more 8-bit integer dot product instructions, which are commonly used during inferencing operations for deployed neural networks.

Figure 8:
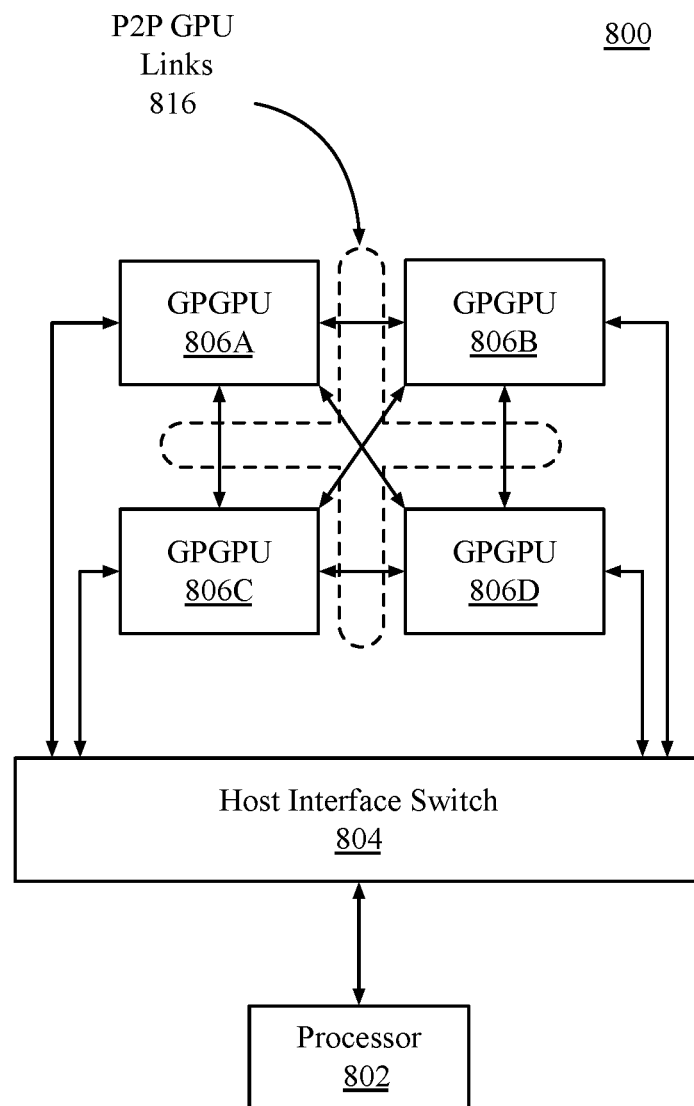
FIG. 8 illustrates a multi-GPU computing system, according to an embodiment.

FIG. 8 illustrates a multi-GPU computing system 800, according to an embodiment. The multi-GPU computing system 800 can include a processor 802 coupled to multiple GPGPUs 806A-806D via a host interface switch 804. The host interface switch 804, in one embodiment, is a PCI express switch device that couples the processor 802 to a PCI express bus over which the processor 802 can communicate with the set of GPGPUs 806A-806D. Each of the multiple GPGPUs 806A-806D can be an instance of the GPGPU 700 of FIG. 7. The GPGPUs 806A-806D can interconnect via a set of high-speed point to point GPU to GPU links 816. The high-speed GPU to GPU links can connect to each of the GPGPUs 806A-806D via a dedicated GPU link, such as the GPU link 710 as in FIG. 7. The P2P GPU links 816 enable direct communication between each of the GPGPUs 806A-806D without requiring communication over the host interface bus to which the processor 802 is connected. With GPU-to-GPU traffic directed to the P2P GPU links, the host interface bus remains available for system memory access or to communicate with other instances of the multi-GPU computing system 800, for example, via one or more network devices. While in the illustrated embodiment the GPGPUs 806A-D connect to the processor 802 via the host interface switch 804, in one embodiment the processor 802 includes direct support for the P2P GPU links 816 and can connect directly to the GPGPUs 806A-806D.

Machine Learning Neural Network Implementations

The computing architecture provided by embodiments described herein can be configured to perform the types of parallel processing that is particularly suited for training and deploying neural networks for machine learning. A neural network can be generalized as a network of functions having a graph relationship. As is well-known in the art, there are a variety of types of neural network implementations used in machine learning. One exemplary type of neural network is the feedforward network, as previously described.

A second exemplary type of neural network is the Convolutional Neural Network (CNN). A CNN is a specialized feedforward neural network for processing data having a known, grid-like topology, such as image data. Accordingly, CNNs are commonly used for compute vision and image recognition applications, but they also may be used for other types of pattern recognition such as speech and language processing. The nodes in the CNN input layer are organized into a set of "filters" (feature detectors inspired by the receptive fields found in the retina), and the output of each set of filters is propagated to nodes in successive layers of the network. The computations for a CNN include applying the convolution mathematical operation to each filter to produce the output of that filter. Convolution is a specialized kind of mathematical operation performed by two functions to produce a third function that is a modified version of one of the two original functions. In convolutional network terminology, the first function to the convolution can be referred to as the input, while the second function can be referred to as the convolution kernel. The output may be referred to as the feature map. For example, the input to a convolution layer can be a multidimensional array of data that defines the various color components of an input image. The convolution kernel can be a multidimensional array of parameters, where the parameters are adapted by the training process for the neural network.

Recurrent neural networks (RNNs) are a family of feedforward neural networks that include feedback connections between layers. RNNs enable modeling of sequential data by sharing parameter data across different parts of the neural network. The architecture for an RNN includes cycles. The cycles represent the influence of a present value of a variable on its own value at a future time, as at least a portion of the output data from the RNN is used as feedback for processing subsequent input in a sequence. This feature makes RNNs particularly useful for language processing due to the variable nature in which language data can be composed.

The figures described below present exemplary feedforward, CNN, and RNN networks, as well as describe a general process for respectively training and deploying each of those types of networks. It will be understood that these descriptions are exemplary and non-limiting as to any specific embodiment described herein and the concepts illustrated can be applied generally to deep neural networks and machine learning techniques in general.

The exemplary neural networks described above can be used to perform deep learning. Deep learning is machine learning using deep neural networks. The deep neural networks used in deep learning are artificial neural networks composed of multiple hidden layers, as opposed to shallow neural networks that include only a single hidden layer. Deeper neural networks are generally more computationally intensive to train. However, the additional hidden layers of the network enable multistep pattern recognition that results in reduced output error relative to shallow machine learning techniques.

Deep neural networks used in deep learning typically include a front-end network to perform feature recognition coupled to a back-end network which represents a mathematical model that can perform operations (e.g., object classification, speech recognition, etc.) based on the feature representation provided to the model. Deep learning enables machine learning to be performed without requiring hand crafted feature engineering to be performed for the model. Instead, deep neural networks can learn features based on statistical structure or correlation within the input data. The learned features can be provided to a mathematical model that can map detected features to an output. The mathematical model used by the network is generally specialized for the specific task to be performed, and different models will be used to perform different task.

Once the neural network is structured, a learning model can be applied to the network to train the network to perform specific tasks. The learning model describes how to adjust the weights within the model to reduce the output error of the network. Backpropagation of errors is a common method used to train neural networks. An input vector is presented to the network for processing. The output of the network is compared to the desired output using a loss function and an error value is calculated for each of the neurons in the output layer. The error values are then propagated backwards until each neuron has an associated error value which roughly represents its contribution to the original output. The network can then learn from those errors using an algorithm, such as the stochastic gradient descent algorithm, to update the weights of the of the neural network.

Figure 9A:
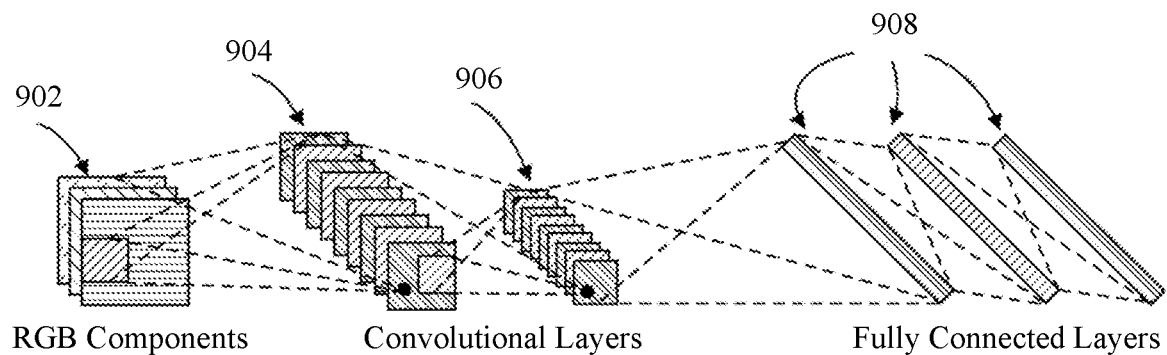
FIG. 9A-9B illustrate layers of exemplary deep neural networks.
Figure 9B:
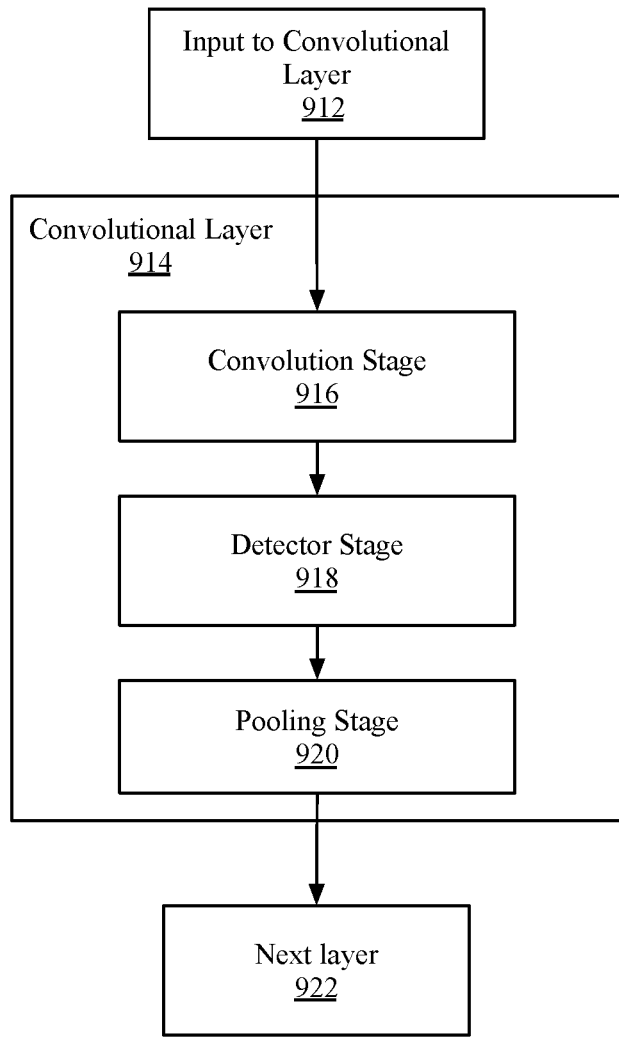

FIG. 9A-9B illustrate an exemplary convolutional neural network. FIG. 9A illustrates various layers within a CNN. As shown in FIG. 9A, an exemplary CNN used to model image processing can receive input 902 describing the red, green, and blue (RGB) components of an input image. The input 902 can be processed by multiple convolutional layers (e.g., convolutional layer 904, convolutional layer 906). The output from the multiple convolutional layers may optionally be processed by a set of fully connected layers 908. Neurons in a fully connected layer have full connections to all activations in the previous layer, as previously described for a feedforward network. The output from the fully connected layers 908 can be used to generate an output result from the network. The activations within the fully connected layers 908 can be computed using matrix multiplication instead of convolution. Not all CNN implementations make use of fully connected layers 908. For example, in some implementations the convolutional layer 906 can generate output for the CNN.

The convolutional layers are sparsely connected, which differs from traditional neural network configuration found in the fully connected layers 908. Traditional neural network layers are fully connected, such that every output unit interacts with every input unit. However, the convolutional layers are sparsely connected because the output of the convolution of a field is input (instead of the respective state value of each of the nodes in the field) to the nodes of the subsequent layer, as illustrated. The kernels associated with the convolutional layers perform convolution operations, the output of which is sent to the next layer. The dimensionality reduction performed within the convolutional layers is one aspect that enables the CNN to scale to process large images.

FIG. 9B illustrates exemplary computation stages within a convolutional layer of a CNN. Input to a convolutional layer 912 of a CNN can be processed in three stages of a convolutional layer 914. The three stages can include a convolution stage 916, a detector stage 918, and a pooling stage 920. The convolutional layer 914 can then output data to a successive convolutional layer. The final convolutional layer of the network can generate output feature map data or provide input to a fully connected layer, for example, to generate a classification value for the input to the CNN.

In the convolution stage 916 performs several convolutions in parallel to produce a set of linear activations. The convolution stage 916 can include an affine transformation, which is any transformation that can be specified as a linear transformation plus a translation. Affine transformations include rotations, translations, scaling, and combinations of these transformations. The convolution stage computes the output of functions (e.g., neurons) that are connected to specific regions in the input, which can be determined as the local region associated with the neuron. The neurons compute a dot product between the weights of the neurons and the region in the local input to which the neurons are connected. The output from the convolution stage 916 defines a set of linear activations that are processed by successive stages of the convolutional layer 914.

The linear activations can be processed by a detector stage 918. In the detector stage 918, each linear activation is processed by a non-linear activation function. The non-linear activation function increases the nonlinear properties of the overall network without affecting the receptive fields of the convolution layer. Several types of non-linear activation functions may be used. One particular type is the rectified linear unit (ReLU), which uses an activation function defined as $f(x)=\max(0, x)$, such that the activation is thresholded at zero.

The pooling stage 920 uses a pooling function that replaces the output of the convolutional layer 906 with a summary statistic of the nearby outputs. The pooling function can be used to introduce translation invariance into the neural network, such that small translations to the input do not change the pooled outputs. Invariance to local translation can be useful in scenarios where the presence of a feature in the input data is more important than the precise location of the feature. Various types of pooling functions can be used during the pooling stage 920, including max pooling, average pooling, and l2-norm pooling. Additionally, some CNN implementations do not include a pooling stage. Instead, such implementations substitute and additional convolution stage having an increased stride relative to previous convolution stages.

The output from the convolutional layer 914 can then be processed by the next layer 922. The next layer 922 can be an additional convolutional layer or one of the fully connected layers 908. For example, the first convolutional layer 904 of FIG. 9A can output to the second convolutional layer 906, while the second convolutional layer can output to a first layer of the fully connected layers 908.

Figure 10:
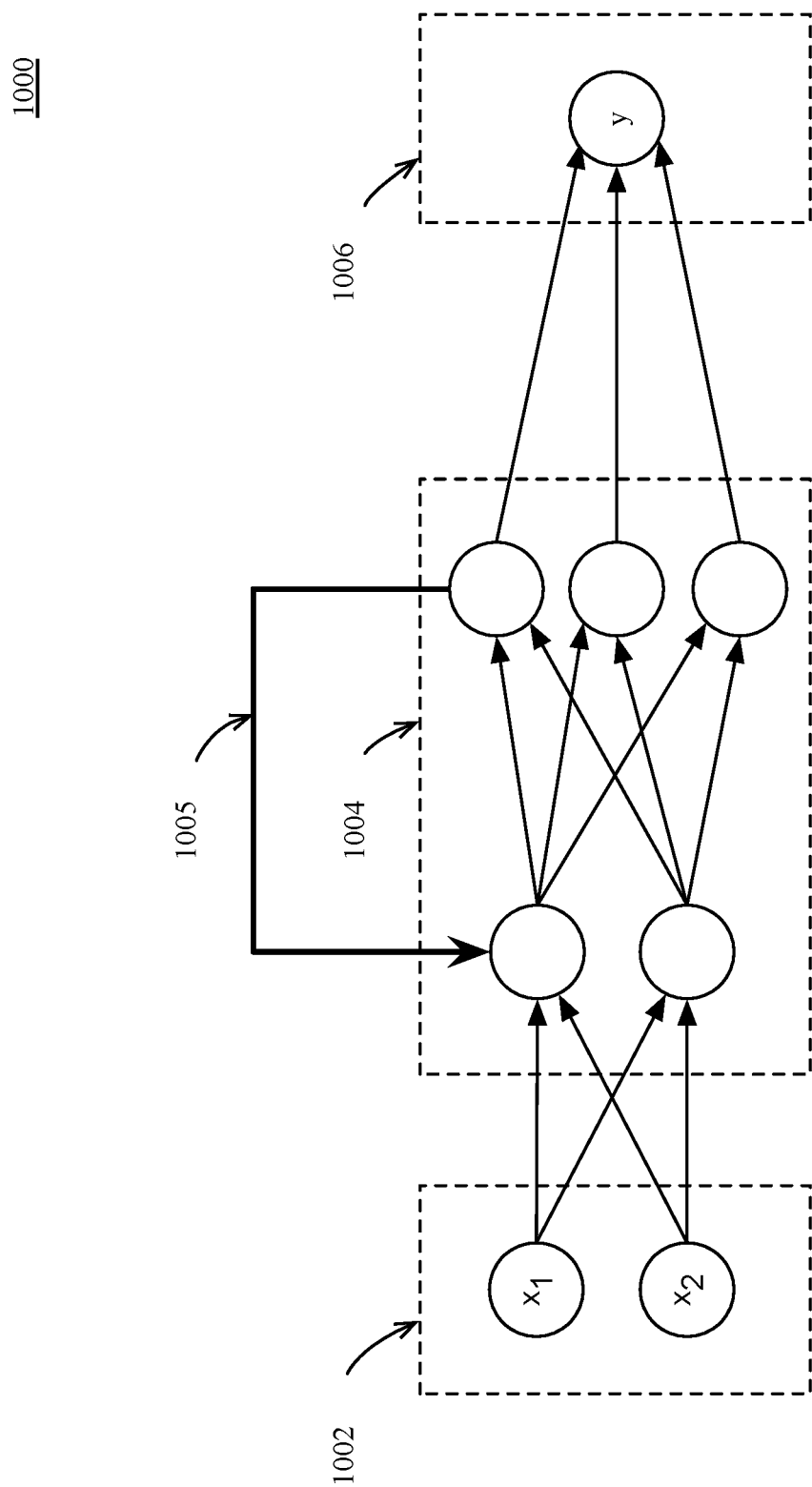
FIG. 10 illustrates an exemplary recurrent neural network.

FIG. 10 illustrates an exemplary recurrent neural network 1000. In a recurrent neural network (RNN), the previous state of the network influences the output of the current state of the network. RNNs can be built in a variety of ways using a variety of functions. The use of RNNs generally revolves around using mathematical models to predict the future based on a prior sequence of inputs. For example, an RNN may be used to perform statistical language modeling to predict an upcoming word given a previous sequence of words. The illustrated RNN 1000 can be described has having an input layer 1002 that receives an input vector, hidden layers 1004 to implement a recurrent function, a feedback mechanism 1005 to enable a 'memory' of previous states, and an output layer 1006 to output a result. The RNN 1000 operates based on time-steps. The state of the RNN at a given time step is influenced based on the previous time step via the feedback mechanism 1005. For a given time step, the state of the hidden layers 1004 is defined by the previous state and the input at the current time step. An initial input ($x_1$) at a first time step can be processed by the hidden layer 1004. A second input ($x_2$) can be processed by the hidden layer 1004 using state information that is determined during the processing of the initial input ($x_1$). A given state can be computed as $s_t = f(Ux_t + Ws_{t-1})$, where U and W are parameter matrices. The function $f$ is generally a non-linearity, such as the hyperbolic tangent function (Tanh) or a variant of the rectifier function $f(x) = \max(0, x)$. However, the specific mathematical function used in the hidden layers 1004 can vary depending on the specific implementation details of the RNN 1000.

In addition to the basic CNN and RNN networks described, variations on those networks may be enabled. One example RNN variant is the long short term memory (LSTM) RNN. LSTM RNNs are capable of learning long-term dependencies that may be necessary for processing longer sequences of language. A variant on the CNN is a convolutional deep belief network, which has a structure similar to a CNN and is trained in a manner similar to a deep belief network. A deep belief network (DBN) is a generative neural network that is composed of multiple layers of stochastic (random) variables. DBNs can be trained layer-by-layer using greedy unsupervised learning. The learned weights of the DBN can then be used to provide pre-train neural networks by determining an optimal initial set of weights for the neural network.

Figure 11:
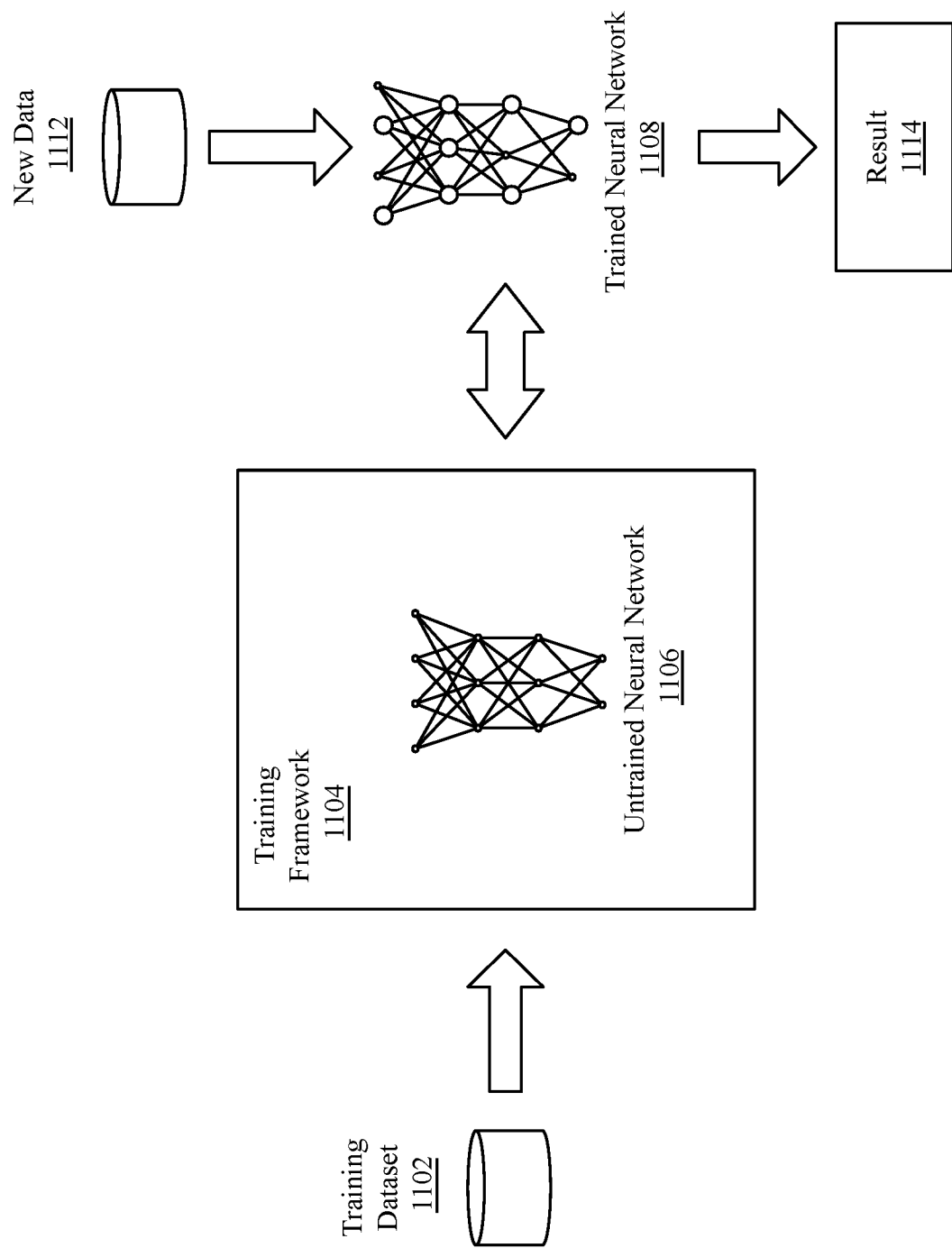
FIG. 11 illustrates training and deployment of a deep neural network.

FIG. 11 illustrates training and deployment of a deep neural network. Once a given network has been structured for a task the neural network is trained using a training dataset 1102. Various training frameworks 1104 have been developed to enable hardware acceleration of the training process. For example, the machine learning framework 604 of FIG. 6 may be configured as a training framework 1104. The training framework 1104 can hook into an untrained neural network 1106 and enable the untrained neural net to be trained using the parallel processing resources described herein to generate a trained neural network 1108.

To start the training process the initial weights may be chosen randomly or by pre-training using a deep belief network. The training cycle then be performed in either a supervised or unsupervised manner.

Supervised learning is a learning method in which training is performed as a mediated operation, such as when the training dataset 1102 includes input paired with the desired output for the input, or where the training dataset includes input having known output and the output of the neural network is manually graded. The network processes the inputs and compares the resulting outputs against a set of expected or desired outputs. Errors are then propagated back through the system. The training framework 1104 can adjust to adjust the weights that control the untrained neural network 1106. The training framework 1104 can provide tools to monitor how well the untrained neural network 1106 is converging towards a model suitable to generating correct answers based on known input data. The training process occurs repeatedly as the weights of the network are adjusted to refine the output generated by the neural network. The training process can continue until the neural network reaches a statistically desired accuracy associated with a trained neural network 1108. The trained neural network 1108 can then be deployed to implement any number of machine learning operations to generate an inference result 1114 based on input of new data 1112.

Unsupervised learning is a learning method in which the network attempts to train itself using unlabeled data. Thus, for unsupervised learning the training dataset 1102 will include input data without any associated output data. The untrained neural network 1106 can learn groupings within the unlabeled input and can determine how individual inputs are related to the overall dataset. Unsupervised training can be used to generate a self-organizing map, which is a type of trained neural network 1108 capable of performing operations useful in reducing the dimensionality of data. Unsupervised training can also be used to perform anomaly detection, which allows the identification of data points in an input dataset that deviate from the normal patterns of the data.

Variations on supervised and unsupervised training may also be employed. Semi-supervised learning is a technique in which in the training dataset 1102 includes a mix of labeled and unlabeled data of the same distribution. Incremental learning is a variant of supervised learning in which input data is continuously used to further train the model. Incremental learning enables the trained neural network 1108 to adapt to the new data 1112 without forgetting the knowledge instilled within the network during initial training.

Whether supervised or unsupervised, the training process for particularly deep neural networks may be too computationally intensive for a single compute node. Instead of using a single compute node, a distributed network of computational nodes can be used to accelerate the training process.

Figure 12:
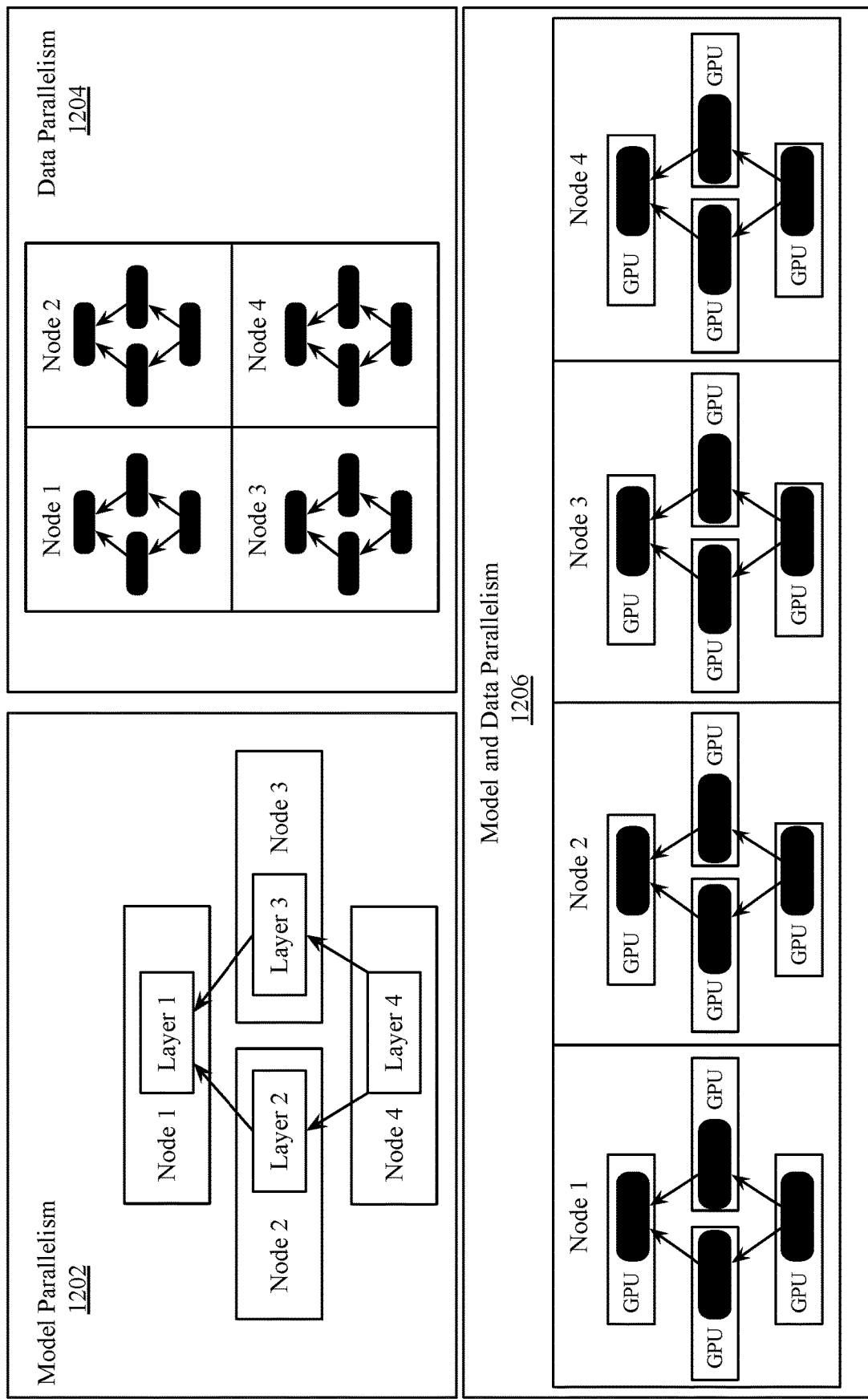
FIG. 12 is a block diagram illustrating distributed learning.

FIG. 12 is a block diagram illustrating distributed learning. Distributed learning is a training model that uses multiple distributed computing nodes to perform supervised or unsupervised training of a neural network. The distributed computational nodes can each include one or more host processors and one or more of the general-purpose processing nodes, such as the highly-parallel general-purpose graphics processing unit 700 as in FIG. 7. As illustrated, distributed learning can be performed model parallelism 1202, data parallelism 1204, or a combination of model and data parallelism 1204.

In model parallelism 1202, different computational nodes in a distributed system can perform training computations for different parts of a single network. For example, each layer of a neural network can be trained by a different processing node of the distributed system. The benefits of model parallelism include the ability to scale to particularly large models. Splitting the computations associated with different layers of the neural network enables the training of very large neural networks in which the weights of all layers would not fit into the memory of a single computational node. In some instances, model parallelism can be particularly useful in performing unsupervised training of large neural networks.

In data parallelism 1204, the different nodes of the distributed network have a complete instance of the model and each node receives a different portion of the data. The results from the different nodes are then combined. While different approaches to data parallelism are possible, data parallel training approaches all require a technique of combining results and synchronizing the model parameters between each node. Exemplary approaches to combining data include parameter averaging and update based data parallelism. Parameter averaging trains each node on a subset of the training data and sets the global parameters (e.g., weights, biases) to the average of the parameters from each node. Parameter averaging uses a central parameter server that maintains the parameter data. Update based data parallelism is similar to parameter averaging except that instead of transferring parameters from the nodes to the parameter server, the updates to the model are transferred. Additionally, update based data parallelism can be performed in a decentralized manner, where the updates are compressed and transferred between nodes.

Combined model and data parallelism 1206 can be implemented, for example, in a distributed system in which each computational node includes multiple GPUs. Each node can have a complete instance of the model with separate GPUs within each node are used to train different portions of the model.

Distributed training has increased overhead relative to training on a single machine. However, the parallel processors and GPGPUs described herein can each implement various techniques to reduce the overhead of distributed training, including techniques to enable high bandwidth GPU-to-GPU data transfer and accelerated remote data synchronization.

Exemplary Machine Learning Applications

Machine learning can be applied to solve a variety of technological problems, including but not limited to computer vision, autonomous driving and navigation, speech recognition, and language processing. Computer vision has traditionally been one of the most active research areas for machine learning applications. Applications of computer vision range from reproducing human visual abilities, such as recognizing faces, to creating new categories of visual abilities. For example, computer vision applications can be configured to recognize sound waves from the vibrations induced in objects visible in a video. Parallel processor accelerated machine learning enables computer vision applications to be trained using significantly larger training dataset than previously feasible and enables inferencing systems to be deployed using low power parallel processors.

Parallel processor accelerated machine learning has autonomous driving applications including lane and road sign recognition, obstacle avoidance, navigation, and driving control. Accelerated machine learning techniques can be used to train driving models based on datasets that define the appropriate responses to specific training input. The parallel processors described herein can enable rapid training of the increasingly complex neural networks used for autonomous driving solutions and enables the deployment of low power inferencing processors in a mobile platform suitable for integration into autonomous vehicles.

Parallel processor accelerated deep neural networks have enabled machine learning approaches to automatic speech recognition (ASR). ASR includes the creation of a function that computes the most probable linguistic sequence given an input acoustic sequence. Accelerated machine learning using deep neural networks have enabled the replacement of the hidden Markov models (HMMs) and Gaussian mixture models (GMMs) previously used for ASR.

Parallel processor accelerated machine learning can also be used to accelerate natural language processing. Automatic learning procedures can make use of statistical inference algorithms to produce models that are robust to erroneous or unfamiliar input. Exemplary natural language processor applications include automatic machine translation between human languages.

The parallel processing platforms used for machine learning can be divided into training platforms and deployment platforms. Training platforms are generally highly parallel and include optimizations to accelerate multi-GPU single node training and multi-node, multi-GPU training. Exemplary parallel processors suited for training include the general-purpose graphics processing unit 700 of FIG. 7 and the multi-GPU computing system 800 of FIG. 8. On the contrary, deployed machine learning platforms generally include lower power parallel processors suitable for use in products such as cameras, autonomous robots, and autonomous vehicles.

Figure 13:
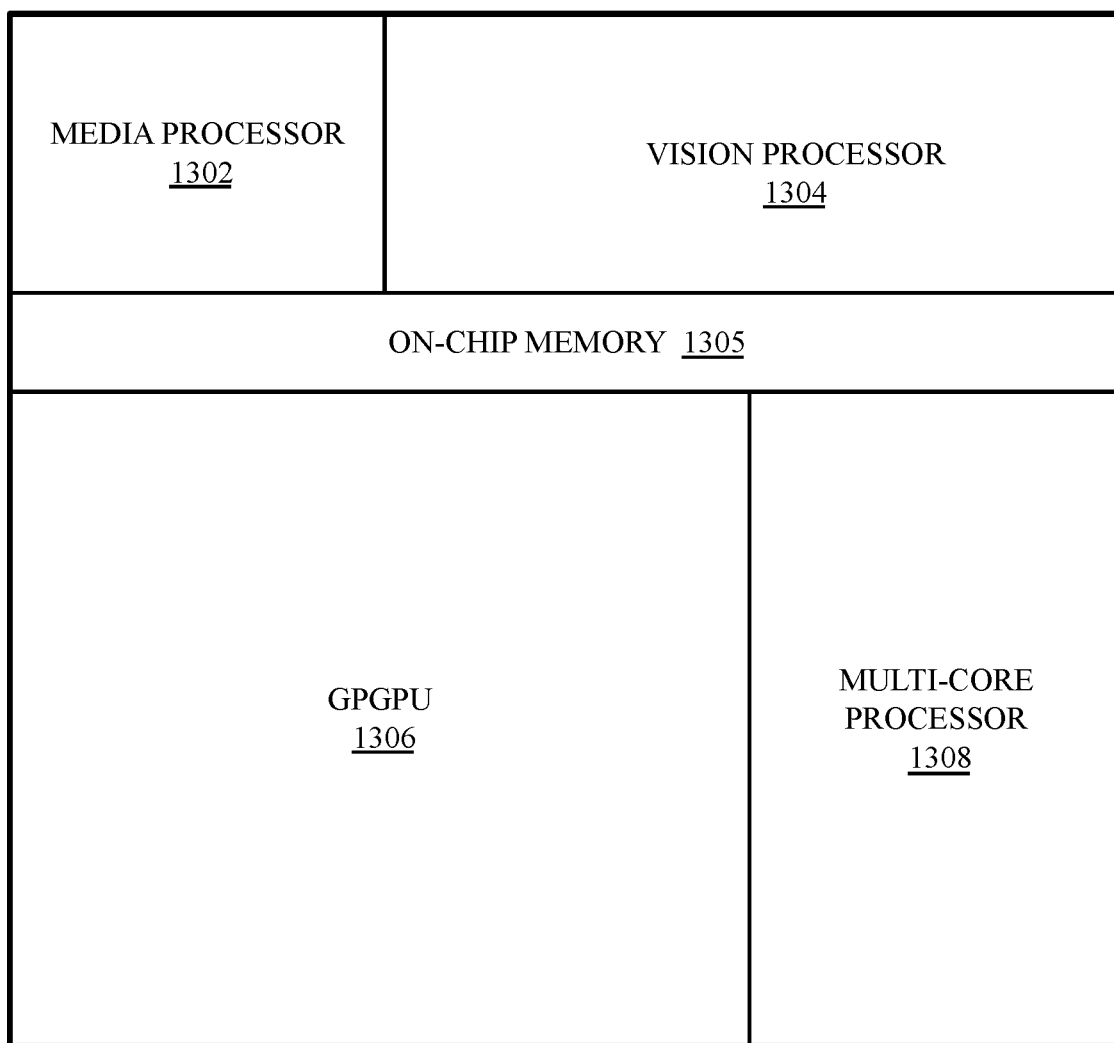
FIG. 13 illustrates an exemplary inferencing system on a chip (SOC) suitable for performing inferencing using a trained model.

FIG. 13 illustrates an exemplary inferencing system on a chip (SOC) 1300 suitable for performing inferencing using a trained model. The SOC 1300 can integrate processing components including a media processor 1302, a vision processor 1304, a GPGPU 1306 and a multi-core processor 1308. The SOC 1300 can additionally include on-chip memory 1305 that can enable a shared on-chip data pool that is accessible by each of the processing components. The processing components can be optimized for low power operation to enable deployment to a variety of machine learning platforms, including autonomous vehicles and autonomous robots. For example, one implementation of the SOC 1300 can be used as a portion of the main control system for an autonomous vehicle. Where the SOC 1300 is configured for use in autonomous vehicles the SOC is designed and configured for compliance with the relevant functional safety standards of the deployment jurisdiction.

During operation, the media processor 1302 and vision processor 1304 can work in concert to accelerate computer vision operations. The media processor 1302 can enable low latency decode of multiple high-resolution (e.g., 4K, 8K) video streams. The decoded video streams can be written to a buffer in the on-chip memory 1305. The vision processor 1304 can then parse the decoded video and perform preliminary processing operations on the frames of the decoded video in preparation of processing the frames using a trained image recognition model. For example, the vision processor 1304 can accelerate convolution operations for a CNN that is used to perform image recognition on the high-resolution video data, while back end model computations are performed by the GPGPU 1306.

The multi-core processor 1308 can include control logic to assist with sequencing and synchronization of data transfers and shared memory operations performed by the media processor 1302 and the vision processor 1304. The multi-core processor 1308 can also function as an application processor to execute software applications that can make use of the inferencing compute capability of the GPGPU 1306.

For example, at least a portion of the navigation and driving logic can be implemented in software executing on the multi-core processor 1308. Such software can directly issue computational workloads to the GPGPU 1306 or the computational workloads can be issued to the multi-core processor 1308, which can offload at least a portion of those operations to the GPGPU 1306.

The GPGPU 1306 can include compute clusters such as a low power configuration of the compute clusters 706A-706H within general-purpose graphics processing unit 700. The compute clusters within the GPGPU 1306 can support instruction that are specifically optimized to perform inferencing computations on a trained neural network. For example, the GPGPU 1306 can support instructions to perform low precision computations such as 8-bit and 4-bit integer vector operations.

Additional Exemplary Graphics Processing System

Details of the embodiments described above can be incorporated within graphics processing systems and devices described below. The graphics processing system and devices of FIG. 14 through FIG. 26A-26B illustrate alternative systems and graphics processing hardware that can implement any and all of the techniques described above.

Figure 14:
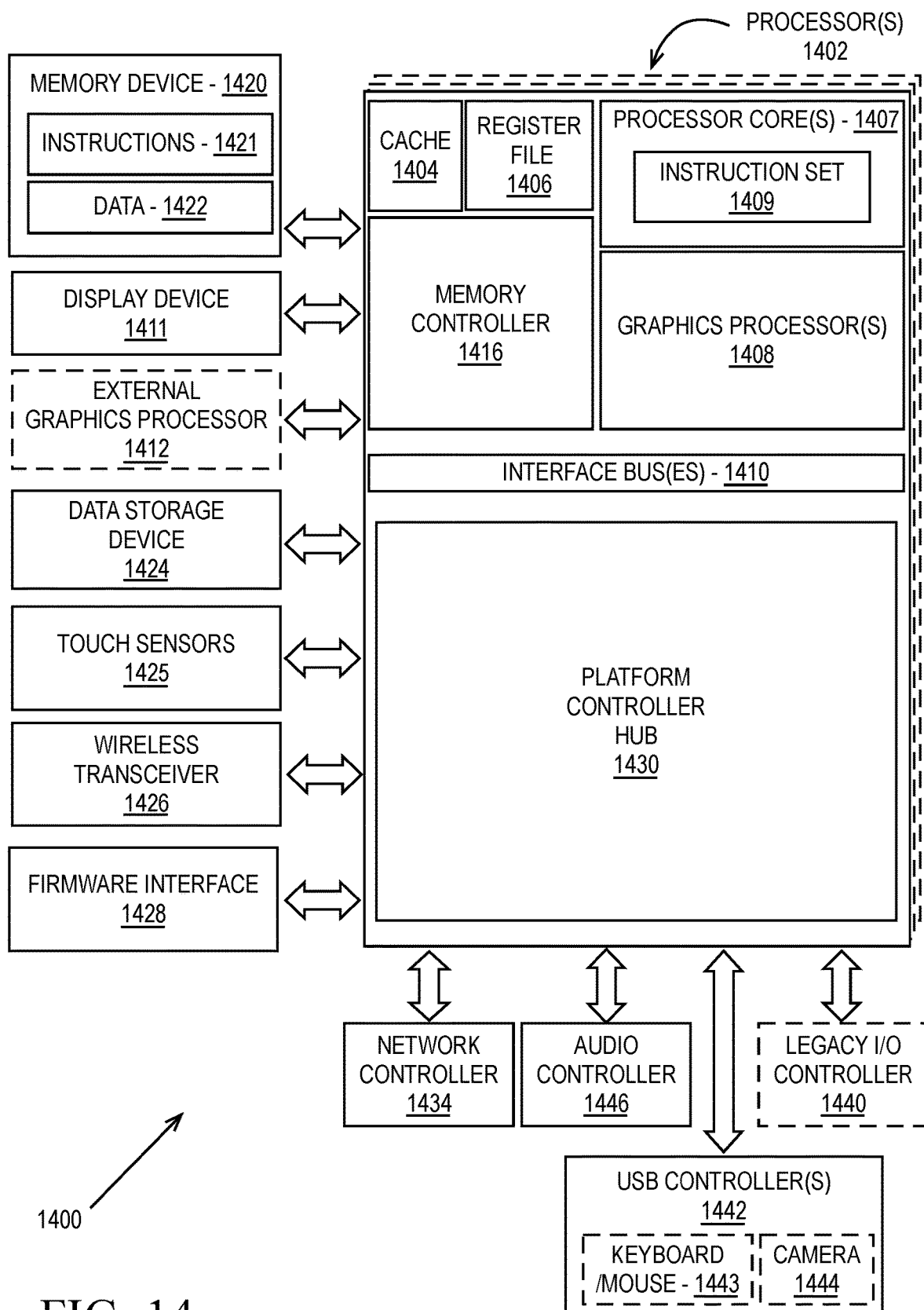
FIG. 14 is a block diagram of a processing system, according to an embodiment.

FIG. 14 is a block diagram of a processing system 1400, according to an embodiment. System 1400 may be used in a single processor desktop system, a multiprocessor workstation system, or a server system having a large number of processors 1402 or processor cores 1407. In one embodiment, the system 1400 is a processing platform incorporated within a system-on-a-chip (SoC) integrated circuit for use in mobile, handheld, or embedded devices such as within Internet-of-things (IoT) devices with wired or wireless connectivity to a local or wide area network.

In one embodiment, system 1400 can include, couple with, or be integrated within: a server-based gaming platform; a game console, including a game and media console; a mobile gaming console, a handheld game console, or an online game console. In some embodiments the system 1400 is part of a mobile phone, smart phone, tablet computing device or mobile Internet-connected device such as a laptop with low internal storage capacity. Processing system 1400 can also include, couple with, or be integrated within: a wearable device, such as a smart watch wearable device; smart eyewear or clothing enhanced with augmented reality (AR) or virtual reality (VR) features to provide visual, audio or tactile outputs to supplement real world visual, audio or tactile experiences or otherwise provide text, audio, graphics, video, holographic images or video, or tactile feedback; other augmented reality (AR) device; or other virtual reality (VR) device. In some embodiments, the processing system 1400 includes or is part of a television or set top box device.

In some embodiments, system 1400 can include, couple with, or be integrated within a self-driving vehicle such as a bus, tractor trailer, car, motor or electric power cycle, plane or glider (or any combination thereof). The self-driving vehicle may use system 1400 to process the environment sensed around the vehicle.

In some embodiments, the one or more processors 1402 each include one or more processor cores 1407 to process instructions which, when executed, perform operations for system or user software. In some embodiments, at least one of the one or more processor cores 1407 is configured to process a specific instruction set 1409. In some embodiments, instruction set 1409 may facilitate Complex Instruction Set Computing (CISC), Reduced Instruction Set Computing (RISC), or computing via a Very Long Instruction Word (VLIW). One or more processor cores 1407 may process a different instruction set 1409, which may include instructions to facilitate the emulation of other instruction sets. Processor core 1407 may also include other processing devices, such as a Digital Signal Processor (DSP).

In some embodiments, the processor 1402 includes cache memory 1404. Depending on the architecture, the processor 1402 can have a single internal cache or multiple levels of internal cache. In some embodiments, the cache memory is shared among various components of the processor 1402. In some embodiments, the processor 1402 also uses an external cache (e.g., a Level-3 (L3) cache or Last Level Cache (LLC)) (not shown), which may be shared among processor cores 1407 using known cache coherency techniques. A register file 1406 can be additionally included in processor 1402 and may include different types of registers for storing different types of data (e.g., integer registers, floating point registers, status registers, and an instruction pointer register). Some registers may be general-purpose registers, while other registers may be specific to the design of the processor 1402.

In some embodiments, one or more processor(s) 1402 are coupled with one or more interface bus(es) 1410 to transmit communication signals such as address, data, or control signals between processor 1402 and other components in the system 1400. The interface bus 1410, in one embodiment, can be a processor bus, such as a version of the Direct Media Interface (DMI) bus. However, processor busses are not limited to the DMI bus, and may include one or more Peripheral Component Interconnect buses (e.g., PCI, PCI Express), memory busses, or other types of interface busses. In one embodiment the processor(s) 1402 include an integrated memory controller 1416 and a platform controller hub 1430. The memory controller 1416 facilitates communication between a memory device and other components of the system 1400, while the platform controller hub (PCH) 1430 provides connections to I/O devices via a local I/O bus.

The memory device 1420 can be a dynamic random access memory (DRAM) device, a static random access memory (SRAM) device, flash memory device, phase-change memory device, or some other memory device having suitable performance to serve as process memory. In one embodiment the memory device 1420 can operate as system memory for the system 1400, to store data 1422 and instructions 1421 for use when the one or more processors 1402 executes an application or process. Memory controller 1416 also couples with an optional external graphics processor 1418, which may communicate with the one or more graphics processors 1408 in processors 1402 to perform graphics and media operations. In some embodiments, graphics, media, and or compute operations may be assisted by an accelerator 1412, which is a coprocessor that can be configured to perform a specialized set of graphics, media, or compute operations. For example, in one embodiment the accelerator 1412 is a matrix multiplication accelerator used to optimize machine learning or compute operations. In one embodiment the accelerator 1412 is a ray-tracing accelerator that can be used to perform ray-tracing operations in concert with the graphics processor 1408. In some embodiments a display device 1411 can connect to the processor(s) 1402. The display device 1411 can be one or more of an internal display device, as in a mobile electronic device or a laptop device or an external display device attached via a display interface (e.g., DisplayPort, etc.). In one embodiment the display device 1411 can be a head mounted display (HMD) such as a stereoscopic display device for use in virtual reality (VR) applications or augmented reality (AR) applications.

In some embodiments the platform controller hub 1430 enables peripherals to connect to memory device 1420 and processor 1402 via a high-speed I/O bus. The I/O peripherals include, but are not limited to, an audio controller 1446, a network controller 1434, a firmware interface 1428, a wireless transceiver 1426, touch sensors 1425, a data storage device 1424 (e.g., non-volatile memory, volatile memory, hard disk drive, flash memory, NAND, 3D NAND, 3D XPoint, etc.). The data storage device 1424 can connect via a storage interface (e.g., SATA) or via a peripheral bus, such as a Peripheral Component Interconnect bus (e.g., PCI, PCI Express). The touch sensors 1425 can include touch screen sensors, pressure sensors, or fingerprint sensors. The wireless transceiver 1426 can be a Wi-Fi transceiver, a Bluetooth transceiver, or a mobile network transceiver such as a 3G, 4G, 5G, or Long Term Evolution (LTE) transceiver. The firmware interface 1428 enables communication with system firmware, and can be, for example, a unified extensible firmware interface (UEFI). The network controller 1434 can enable a network connection to a wired network. In some embodiments, a high-performance network controller (not shown) couples with the interface bus 1410. The audio controller 1446, in one embodiment, is a multi-channel high definition audio controller. In one embodiment the system 1400 includes an optional legacy I/O controller 1440 for coupling legacy (e.g., Personal System 2 (PS/2)) devices to the system. The platform controller hub 1430 can also connect to one or more Universal Serial Bus (USB) controllers 1442 connect input devices, such as keyboard and mouse 1443 combinations, a camera 1444, or other USB input devices.

It will be appreciated that the system 1400 shown is exemplary and not limiting, as other types of data processing systems that are differently configured may also be used. For example, an instance of the memory controller 1416 and platform controller hub 1430 may be integrated into a discreet external graphics processor, such as the external graphics processor 1418. In one embodiment the platform controller hub 1430 and/or memory controller 1416 may be external to the one or more processor(s) 1402. For example, the system 1400 can include an external memory controller 1416 and platform controller hub 1430, which may be configured as a memory controller hub and peripheral controller hub within a system chipset that is in communication with the processor(s) 1402.

For example, circuit boards ("sleds") can be used on which components such as CPUs, memory, and other components are placed are designed for increased thermal performance. In some examples, processing components such as the processors are located on a top side of a sled while near memory, such as DIMMs, are located on a bottom side of the sled. As a result of the enhanced airflow provided by this design, the components may operate at higher frequencies and power levels than in typical systems, thereby increasing performance. Furthermore, the sleds are configured to blindly mate with power and data communication cables in a rack, thereby enhancing their ability to be quickly removed, upgraded, reinstalled, and/or replaced. Similarly, individual components located on the sleds, such as processors, accelerators, memory, and data storage drives, are configured to be easily upgraded due to their increased spacing from each other. In the illustrative embodiment, the components additionally include hardware attestation features to prove their authenticity.

A data center can utilize a single network architecture ("fabric") that supports multiple other network architectures including Ethernet and Omni-Path. The sleds can be coupled to switches via optical fibers, which provide higher bandwidth and lower latency than typical twisted pair cabling (e.g., Category 5, Category 5e, Category 6, etc.). Due to the high bandwidth, low latency interconnections and network architecture, the data center may, in use, pool resources, such as memory, accelerators (e.g., GPUs, graphics accelerators, FPGAs, ASICs, neural network and/or artificial intelligence accelerators, etc.), and data storage drives that are physically disaggregated, and provide them to compute resources (e.g., processors) on an as needed basis, enabling the compute resources to access the pooled resources as if they were local.

A power supply or source can provide voltage and/or current to system 1400 or any component or system described herein. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

Figure 15:
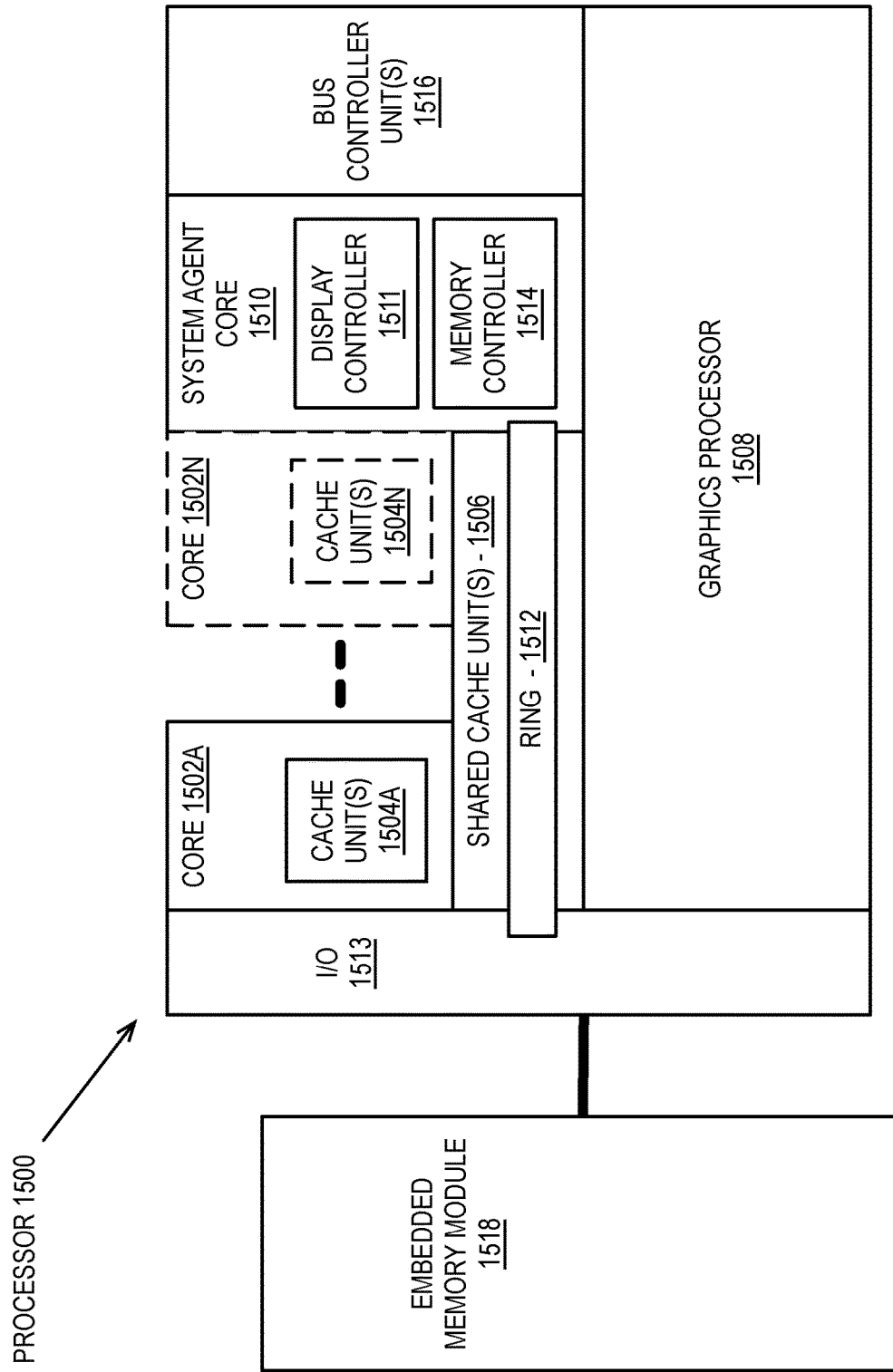
FIG. 15 is a block diagram of a processor according to an embodiment.

FIG. 15 is a block diagram of an embodiment of a processor 1500 having one or more processor cores 1502A-1502N, an integrated memory controller 1514, and an integrated graphics processor 1508. Those elements of FIG. 15 having the same reference numbers (or names) as the elements of any other figure herein can operate or function in any manner similar to that described elsewhere herein, but are not limited to such. Processor 1500 can include additional cores up to and including additional core 1502N represented by the dashed lined boxes. Each of processor cores 1502A-1502N includes one or more internal cache units 1504A-1504N. In some embodiments each processor core also has access to one or more shared cached units 1506.

The internal cache units 1504A-1504N and shared cache units 1506 represent a cache memory hierarchy within the processor 1500. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 1506 and 1504A-1504N.

In some embodiments, processor 1500 may also include a set of one or more bus controller units 1516 and a system agent core 1510. The one or more bus controller units 1516 manage a set of peripheral buses, such as one or more PCI or PCI express busses. System agent core 1510 provides management functionality for the various processor components. In some embodiments, system agent core 1510 includes one or more integrated memory controllers 1514 to manage access to various external memory devices (not shown).

In some embodiments, one or more of the processor cores 1502A-1502N include support for simultaneous multi-threading. In such embodiment, the system agent core 1510 includes components for coordinating and operating cores 1502A-1502N during multi-threaded processing. System agent core 1510 may additionally include a power control unit (PCU), which includes logic and components to regulate the power state of processor cores 1502A-1502N and graphics processor 1508.

In some embodiments, processor 1500 additionally includes graphics processor 1508 to execute graphics processing operations. In some embodiments, the graphics processor 1508 couples with the set of shared cache units 1506, and the system agent core 1510, including the one or more integrated memory controllers 1514. In some embodiments, the system agent core 1510 also includes a display controller 1511 to drive graphics processor output to one or more coupled displays. In some embodiments, display controller 1511 may also be a separate module coupled with the graphics processor via at least one interconnect, or may be integrated within the graphics processor 1508.

In some embodiments, a ring-based interconnect unit 1512 is used to couple the internal components of the processor 1500. However, an alternative interconnect unit may be used, such as a point-to-point interconnect, a switched interconnect, or other techniques, including techniques well known in the art. In some embodiments, graphics processor 1508 couples with the ring-based interconnect unit 1512 via an I/O link 1513.

The exemplary I/O link 1513 represents at least one of multiple varieties of I/O interconnects, including an on package I/O interconnect which facilitates communication between various processor components and a high-performance embedded memory module 1518, such as an eDRAM module. In some embodiments, each of the processor cores 1502A-1502N and graphics processor 1508 can use embedded memory modules 1518 as a shared Last Level Cache.

In some embodiments, processor cores 1502A-1502N are homogenous cores executing the same instruction set architecture. In another embodiment, processor cores 1502A-1502N are heterogeneous in terms of instruction set architecture (ISA), where one or more of processor cores 1502A-1502N execute a first instruction set, while at least one of the other cores executes a subset of the first instruction set or a different instruction set. In one embodiment, processor cores 1502A-1502N are heterogeneous in terms of microarchitecture, where one or more cores having a relatively higher power consumption couple with one or more power cores having a lower power consumption. In one embodiment, processor cores 1502A-1502N are heterogeneous in terms of computational capability. Additionally, processor 1500 can be implemented on one or more chips or as an SoC integrated circuit having the illustrated components, in addition to other components.

Figure 16:
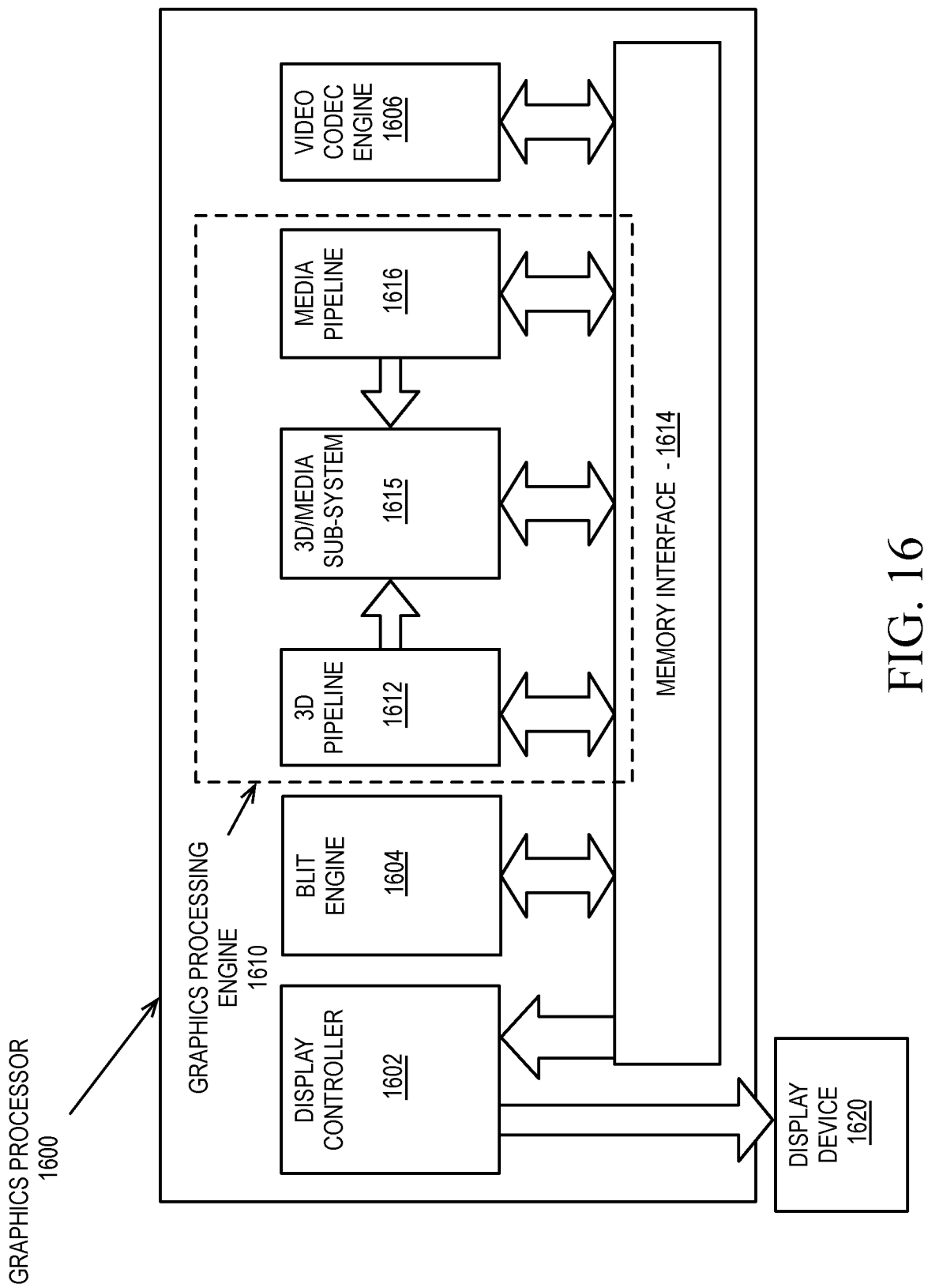
FIG. 16 is a block diagram of a graphics processor, according to an embodiment.

FIG. 16 is a block diagram of a graphics processor 1600, which may be a discrete graphics processing unit, or may be a graphics processor integrated with a plurality of processing cores, or other semiconductor devices such as, but not limited to, memory devices or network interfaces. In some embodiments, the graphics processor communicates via a memory mapped I/O interface to registers on the graphics processor and with commands placed into the processor memory. In some embodiments, graphics processor 1600 includes a memory interface 1614 to access memory. Memory interface 1614 can be an interface to local memory, one or more internal caches, one or more shared external caches, and/or to system memory.

In some embodiments, graphics processor 1600 also includes a display controller 1602 to drive display output data to a display device 1620. Display controller 1602 includes hardware for one or more overlay planes for the display and composition of multiple layers of video or user interface elements. The display device 1620 can be an internal or external display device. In one embodiment the display device 1620 is a head mounted display device, such as a virtual reality (VR) display device or an augmented reality (AR) display device. In some embodiments, graphics processor 1600 includes a video codec engine 1606 to encode, decode, or transcode media to, from, or between one or more media encoding formats, including, but not limited to Moving Picture Experts Group (MPEG) formats such as MPEG-2, Advanced Video Coding (AVC) formats such as H.265/MPEG-4 AVC, H.265/HEVC, Alliance for Open Media (AOMedia) VP8, VP9, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 1600 includes a block image transfer (BLIT) engine 1604 to perform two-dimensional (2D) rasterizer operations including, for example, bit-boundary block transfers. However, in one embodiment, 2D graphics operations are performed using one or more components of graphics processing engine (GPE) 1610. In some embodiments, GPE 1610 is a compute engine for performing graphics operations, including three-dimensional (3D) graphics operations and media operations.

In some embodiments, GPE 1610 includes a 3D pipeline 1612 for performing 3D operations, such as rendering three-dimensional images and scenes using processing functions that act upon 3D primitive shapes (e.g., rectangle, triangle, etc.). The 3D pipeline 1612 includes programmable and fixed function elements that perform various tasks within the element and/or spawn execution threads to a 3D/Media sub-system 1615. While 3D pipeline 1612 can be used to perform media operations, an embodiment of GPE 1610 also includes a media pipeline 1616 that is specifically used to perform media operations, such as video post-processing and image enhancement.

In some embodiments, media pipeline 1616 includes fixed function or programmable logic units to perform one or more specialized media operations, such as video decode acceleration, video de-interlacing, and video encode acceleration in place of, or on behalf of video codec engine 1606. In some embodiments, media pipeline 1616 additionally includes a thread spawning unit to spawn threads for execution on 3D/Media sub-system 1615. The spawned threads perform computations for the media operations on one or more graphics execution units included in 3D/Media sub-system 1615.

In some embodiments, 3D/Media sub-system 1615 includes logic for executing threads spawned by 3D pipeline 1612 and media pipeline 1616. In one embodiment, the pipelines send thread execution requests to 3D/Media sub-system 1615, which includes thread dispatch logic for arbitrating and dispatching the various requests to available thread execution resources. The execution resources include an array of graphics execution units to process the 3D and media threads. In some embodiments, 3D/Media sub-system 1615 includes one or more internal caches for thread instructions and data. In some embodiments, the subsystem also includes shared memory, including registers and addressable memory, to share data between threads and to store output data.

Graphics Processing Engine

Figure 17:
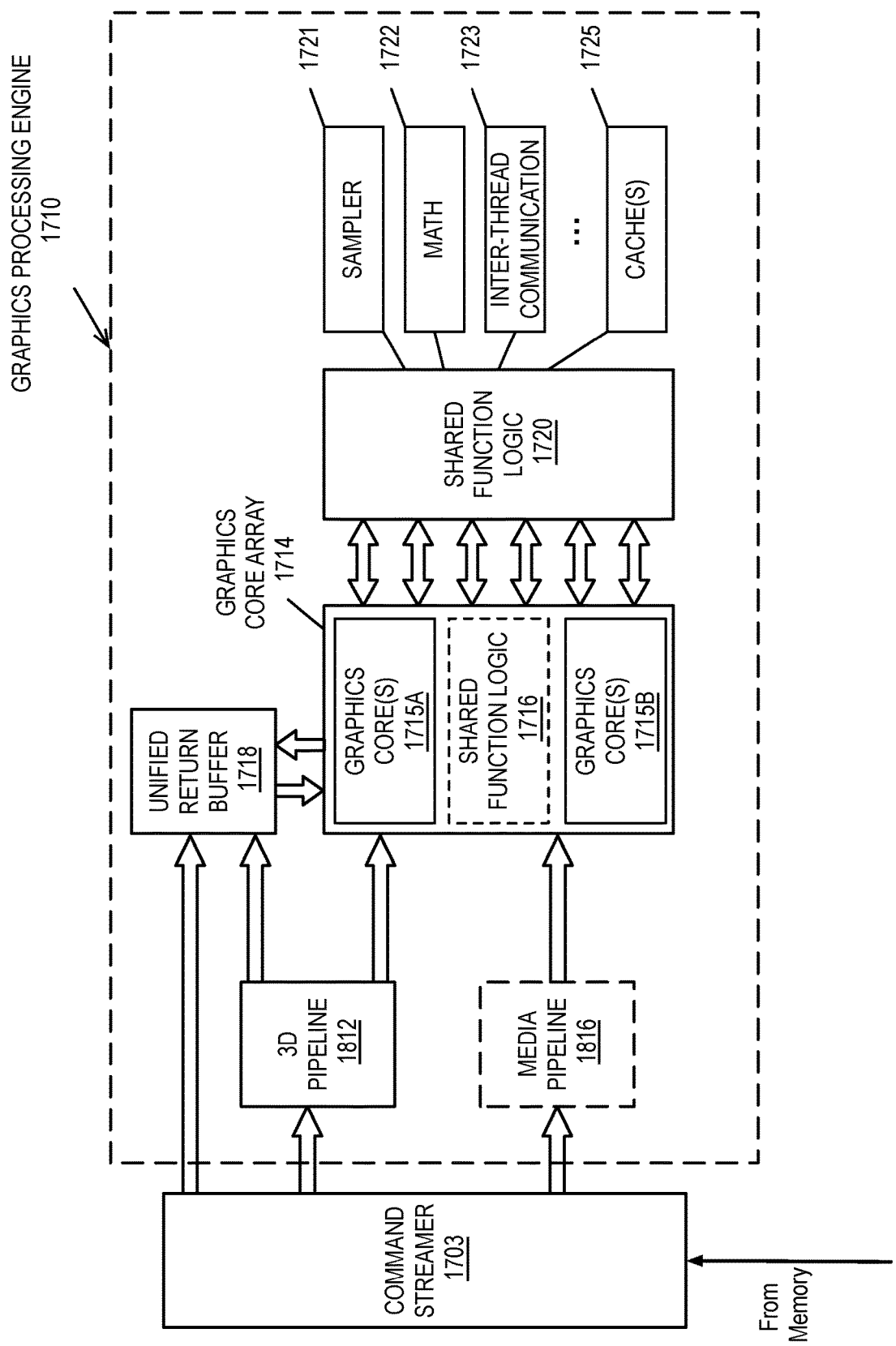
FIG. 17 is a block diagram of a graphics processing engine of a graphics processor in accordance with some embodiments.

FIG. 17 is a block diagram of a graphics processing engine 1710 of a graphics processor in accordance with some embodiments. In one embodiment, the graphics processing engine (GPE) 1710 is a version of the GPE 1610 shown in FIG. 16. Elements of FIG. 17 having the same reference numbers (or names) as the elements of any other figure herein can operate or function in any manner similar to that described elsewhere herein, but are not limited to such. For example, the 3D pipeline 1612 and media pipeline 1616 of FIG. 16 are illustrated. The media pipeline 1616 is optional in some embodiments of the GPE 1710 and may not be explicitly included within the GPE 1710. For example and in at least one embodiment, a separate media and/or image processor is coupled to the GPE 1710.

In some embodiments, GPE 1710 couples with or includes a command streamer 1703, which provides a command stream to the 3D pipeline 1612 and/or media pipelines 1616. In some embodiments, command streamer 1703 is coupled with memory, which can be system memory, or one or more of internal cache memory and shared cache memory. In some embodiments, command streamer 1703 receives commands from the memory and sends the commands to 3D pipeline 1612 and/or media pipeline 1616. The commands are directives fetched from a ring buffer, which stores commands for the 3D pipeline 1612 and media pipeline 1616. In one embodiment, the ring buffer can additionally include batch command buffers storing batches of multiple commands. The commands for the 3D pipeline 1612 can also include references to data stored in memory, such as but not limited to vertex and geometry data for the 3D pipeline 1612 and/or image data and memory objects for the media pipeline 1616. The 3D pipeline 1612 and media pipeline 1616 process the commands and data by performing operations via logic within the respective pipelines or by dispatching one or more execution threads to a graphics core array 1714. In one embodiment the graphics core array 1714 include one or more blocks of graphics cores (e.g., graphics core(s) 1715A, graphics core(s) 1715B), each block including one or more graphics cores. Each graphics core includes a set of graphics execution resources that includes general-purpose and graphics specific execution logic to perform graphics and compute operations, as well as fixed function texture processing and/or machine learning and artificial intelligence acceleration logic.

In various embodiments the 3D pipeline 1612 can include fixed function and programmable logic to process one or more shader programs, such as vertex shaders, geometry shaders, pixel shaders, fragment shaders, compute shaders, or other shader programs, by processing the instructions and dispatching execution threads to the graphics core array 1714. The graphics core array 1714 provides a unified block of execution resources for use in processing these shader programs. Multi-purpose execution logic (e.g., execution units) within the graphics core(s) 1715A-1714B of the graphics core array 1714 includes support for various 3D API shader languages and can execute multiple simultaneous execution threads associated with multiple shaders.

In some embodiments, the graphics core array 1714 includes execution logic to perform media functions, such as video and/or image processing. In one embodiment, the execution units include general-purpose logic that is programmable to perform parallel general-purpose computational operations, in addition to graphics processing operations. The general-purpose logic can perform processing operations in parallel or in conjunction with general-purpose logic within the processor core(s) 1407 of FIG. 14 or core 1502A-1502N as in FIG. 15.

Output data generated by threads executing on the graphics core array 1714 can output data to memory in a unified return buffer (URB) 1718. The URB 1718 can store data for multiple threads. In some embodiments the URB 1718 may be used to send data between different threads executing on the graphics core array 1714. In some embodiments the URB 1718 may additionally be used for synchronization between threads on the graphics core array and fixed function logic within the shared function logic 1720.

In some embodiments, graphics core array 1714 is scalable, such that the array includes a variable number of graphics cores, each having a variable number of execution units based on the target power and performance level of GPE 1710. In one embodiment the execution resources are dynamically scalable, such that execution resources may be enabled or disabled as needed.

The graphics core array 1714 couples with shared function logic 1720 that includes multiple resources that are shared between the graphics cores in the graphics core array. The shared functions within the shared function logic 1720 are hardware logic units that provide specialized supplemental functionality to the graphics core array 1714. In various embodiments, shared function logic 1720 includes but is not limited to sampler 1721, math 1722, and inter-thread communication (ITC) 1723 logic. Additionally, some embodiments implement one or more cache(s) 1725 within the shared function logic 1720.

A shared function is implemented at least in a case where the demand for a given specialized function is insufficient for inclusion within the graphics core array 1714. Instead a single instantiation of that specialized function is implemented as a stand-alone entity in the shared function logic 1720 and shared among the execution resources within the graphics core array 1714. The precise set of functions that are shared between the graphics core array 1714 and included within the graphics core array 1714 varies across embodiments. In some embodiments, specific shared functions within the shared function logic 1720 that are used extensively by the graphics core array 1714 may be included within shared function logic 1716 within the graphics core array 1714. In various embodiments, the shared function logic 1716 within the graphics core array 1714 can include some or all logic within the shared function logic 1720. In one embodiment, all logic elements within the shared function logic 1720 may be duplicated within the shared function logic 1716 of the graphics core array 1714. In one embodiment the shared function logic 1720 is excluded in favor of the shared function logic 1716 within the graphics core array 1714.

Figure 18:
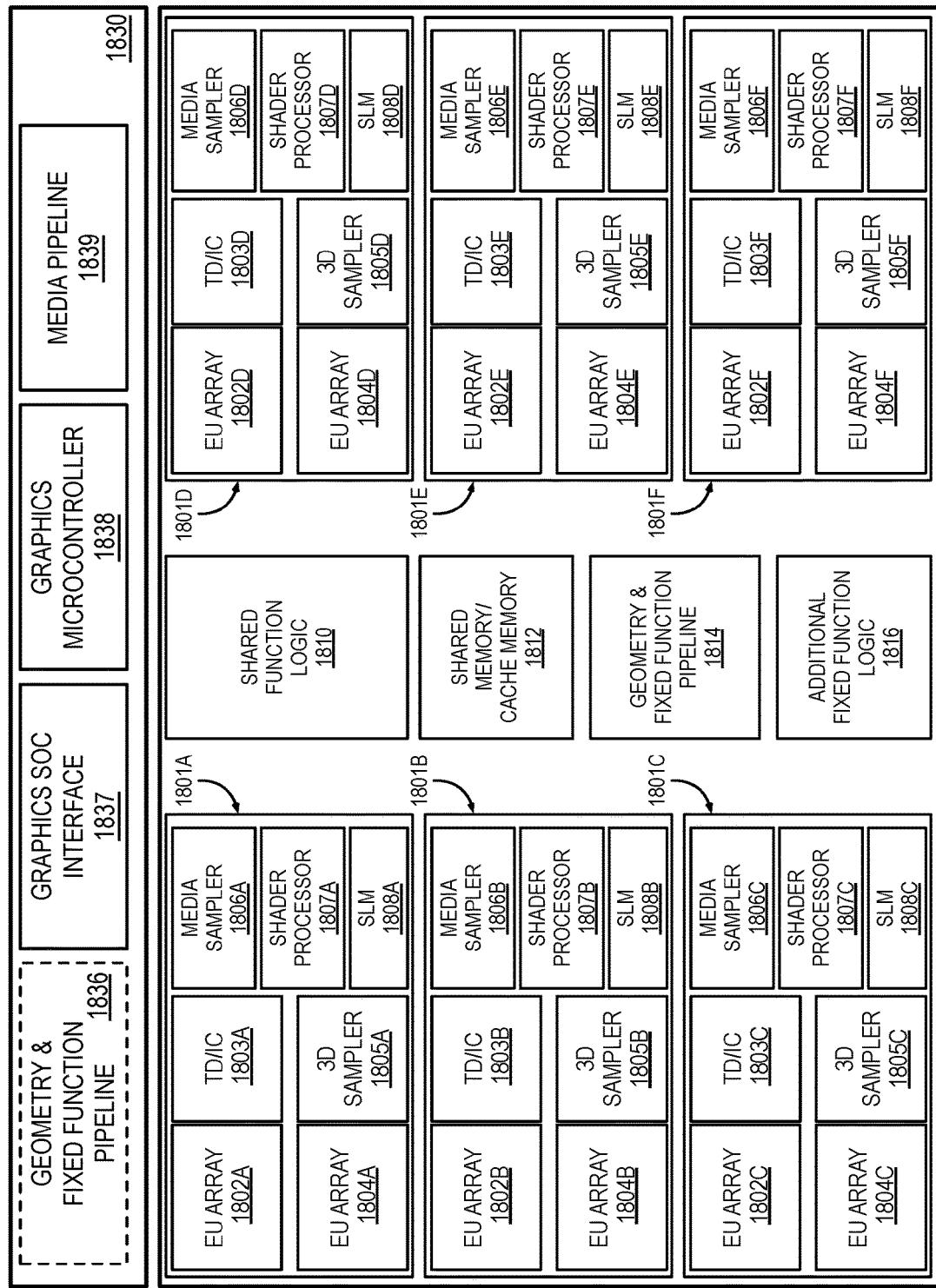
FIG. 18 is a block diagram of hardware logic of a graphics processor core, according to some embodiments described herein.

FIG. 18 is a block diagram of hardware logic of a graphics processor core 1800, according to some embodiments described herein. Elements of FIG. 18 having the same reference numbers (or names) as the elements of any other figure herein can operate or function in any manner similar to that described elsewhere herein, but are not limited to such. The illustrated graphics processor core 1800, in some embodiments, is included within the graphics core array 1714 of FIG. 17. The graphics processor core 1800, sometimes referred to as a core slice, can be one or multiple graphics cores within a modular graphics processor. The graphics processor core 1800 is exemplary of one graphics core slice, and a graphics processor as described herein may include multiple graphics core slices based on target power and performance envelopes. Each graphics processor core 1800 can include a fixed function block 1830 coupled with multiple sub-cores 1801A-1801F, also referred to as sub-slices, that include modular blocks of general-purpose and fixed function logic.

In some embodiments, the fixed function block 1830 includes a geometry/fixed function pipeline 1836 that can be shared by all sub-cores in the graphics processor core 1800, for example, in lower performance and/or lower power graphics processor implementations. In various embodiments, the geometry/fixed function pipeline 1836 includes a 3D fixed function pipeline (e.g., 3D pipeline 1612 as in FIG. 16 and FIG. 17) a video front-end unit, a thread spawner and thread dispatcher, and a unified return buffer manager, which manages unified return buffers, such as the unified return buffer 1718 of FIG. 17.

In one embodiment the fixed function block 1830 also includes a graphics SoC interface 1837, a graphics microcontroller 1838, and a media pipeline 1839. The graphics SoC interface 1837 provides an interface between the graphics processor core 1800 and other processor cores within a system on a chip integrated circuit. The graphics microcontroller 1838 is a programmable sub-processor that is configurable to manage various functions of the graphics processor core 1800, including thread dispatch, scheduling, and pre-emption. The media pipeline 1839 (e.g., media pipeline 1616 of FIG. 16 and FIG. 17) includes logic to facilitate the decoding, encoding, pre-processing, and/or post-processing of multimedia data, including image and video data. The media pipeline 1839 implement media operations via requests to compute or sampling logic within the sub-cores 1801-1801F.

In one embodiment the SoC interface 1837 enables the graphics processor core 1800 to communicate with general-purpose application processor cores (e.g., CPUs) and/or other components within an SoC, including memory hierarchy elements such as a shared last level cache memory, the system RAM, and/or embedded on-chip or on-package DRAM. The SoC interface 1837 can also enable communication with fixed function devices within the SoC, such as camera imaging pipelines, and enables the use of and/or implements global memory atomics that may be shared between the graphics processor core 1800 and CPUs within the SoC. The SoC interface 1837 can also implement power management controls for the graphics processor core 1800 and enable an interface between a clock domain of the graphics core 1800 and other clock domains within the SoC. In one embodiment the SoC interface 1837 enables receipt of command buffers from a command streamer and global thread dispatcher that are configured to provide commands and instructions to each of one or more graphics cores within a graphics processor. The commands and instructions can be dispatched to the media pipeline 1839, when media operations are to be performed, or a geometry and fixed function pipeline (e.g., geometry and fixed function pipeline 1836, geometry and fixed function pipeline 1814) when graphics processing operations are to be performed.

The graphics microcontroller 1838 can be configured to perform various scheduling and management tasks for the graphics processor core 1800. In one embodiment the graphics microcontroller 1838 can perform graphics and/or compute workload scheduling on the various graphics parallel engines within execution unit (EU) arrays 1802A-1802F, 1804A-1804F within the sub-cores 1801A-1801F. In this scheduling model, host software executing on a CPU core of an SoC including the graphics processor core 1800 can submit workloads one of multiple graphics processor doorbells, which invokes a scheduling operation on the appropriate graphics engine. Scheduling operations include determining which workload to run next, submitting a workload to a command streamer, pre-empting existing workloads running on an engine, monitoring progress of a workload, and notifying host software when a workload is complete. In one embodiment the graphics microcontroller 1838 can also facilitate low-power or idle states for the graphics processor core 1800, providing the graphics processor core 1800 with the ability to save and restore registers within the graphics processor core 1800 across low-power state transitions independently from the operating system and/or graphics driver software on the system.

The graphics processor core 1800 may have greater than or fewer than the illustrated sub-cores 1801A-1801F, up to N modular sub-cores. For each set of N sub-cores, the graphics processor core 1800 can also include shared function logic 1810, shared and/or cache memory 1812, a geometry/fixed function pipeline 1814, as well as additional fixed function logic 1816 to accelerate various graphics and compute processing operations. The shared function logic 1810 can include logic units associated with the shared function logic 1720 of FIG. 17 (e.g., sampler, math, and/or inter-thread communication logic) that can be shared by each N sub-cores within the graphics processor core 1800. The shared and/or cache memory 1812 can be a last-level cache for the set of N sub-cores 1801A-1801F within the graphics processor core 1800, and can also serve as shared memory that is accessible by multiple sub-cores. The geometry/fixed function pipeline 1814 can be included instead of the geometry/fixed function pipeline 1836 within the fixed function block 1830 and can include the same or similar logic units.

In one embodiment the graphics processor core 1800 includes additional fixed function logic 1816 that can include various fixed function acceleration logic for use by the graphics processor core 1800. In one embodiment the additional fixed function logic 1816 includes an additional geometry pipeline for use in position only shading. In position-only shading, two geometry pipelines exist, the full geometry pipeline within the geometry/fixed function pipeline 1816, 1836, and a cull pipeline, which is an additional geometry pipeline which may be included within the additional fixed function logic 1816. In one embodiment the cull pipeline is a trimmed down version of the full geometry pipeline. The full pipeline and the cull pipeline can execute different instances of the same application, each instance having a separate context. Position only shading can hide long cull runs of discarded triangles, enabling shading to be completed earlier in some instances. For example and in one embodiment the cull pipeline logic within the additional fixed function logic 1816 can execute position shaders in parallel with the main application and generally generates critical results faster than the full pipeline, as the cull pipeline fetches and shades only the position attribute of the vertices, without performing rasterization and rendering of the pixels to the frame buffer. The cull pipeline can use the generated critical results to compute visibility information for all the triangles without regard to whether those triangles are culled. The full pipeline (which in this instance may be referred to as a replay pipeline) can consume the visibility information to skip the culled triangles to shade only the visible triangles that are finally passed to the rasterization phase.

In one embodiment the additional fixed function logic 1816 can also include machine-learning acceleration logic, such as fixed function matrix multiplication logic, for implementations including optimizations for machine learning training or inferencing.

Within each graphics sub-core 1801A-1801F includes a set of execution resources that may be used to perform graphics, media, and compute operations in response to requests by graphics pipeline, media pipeline, or shader programs. The graphics sub-cores 1801A-1801F include multiple EU arrays 1802A-1802F, 1804A-1804F, thread dispatch and inter-thread communication (TD/IC) logic 1803A-1803F, a 3D (e.g., texture) sampler 1805A-1805F, a media sampler 1806A-1806F, a shader processor 1807A-1807F, and shared local memory (SLM) 1808A-1808F. The EU arrays 1802A-1802F, 1804A-1804F each include multiple execution units, which are general-purpose graphics processing units capable of performing floating-point and integer/fixed-point logic operations in service of a graphics, media, or compute operation, including graphics, media, or compute shader programs. The TD/IC logic 1803A-1803F performs local thread dispatch and thread control operations for the execution units within a sub-core and facilitate communication between threads executing on the execution units of the sub-core. The 3D sampler 1805A-1805F can read texture or other 3D graphics related data into memory. The 3D sampler can read texture data differently based on a configured sample state and the texture format associated with a given texture. The media sampler 1806A-1806F can perform similar read operations based on the type and format associated with media data. In one embodiment, each graphics sub-core 1801A-1801F can alternately include a unified 3D and media sampler. Threads executing on the execution units within each of the sub-cores 1801A-1801F can make use of shared local memory 1808A-1808F within each sub-core, to enable threads executing within a thread group to execute using a common pool of on-chip memory.

Execution Units

Figure 19A:
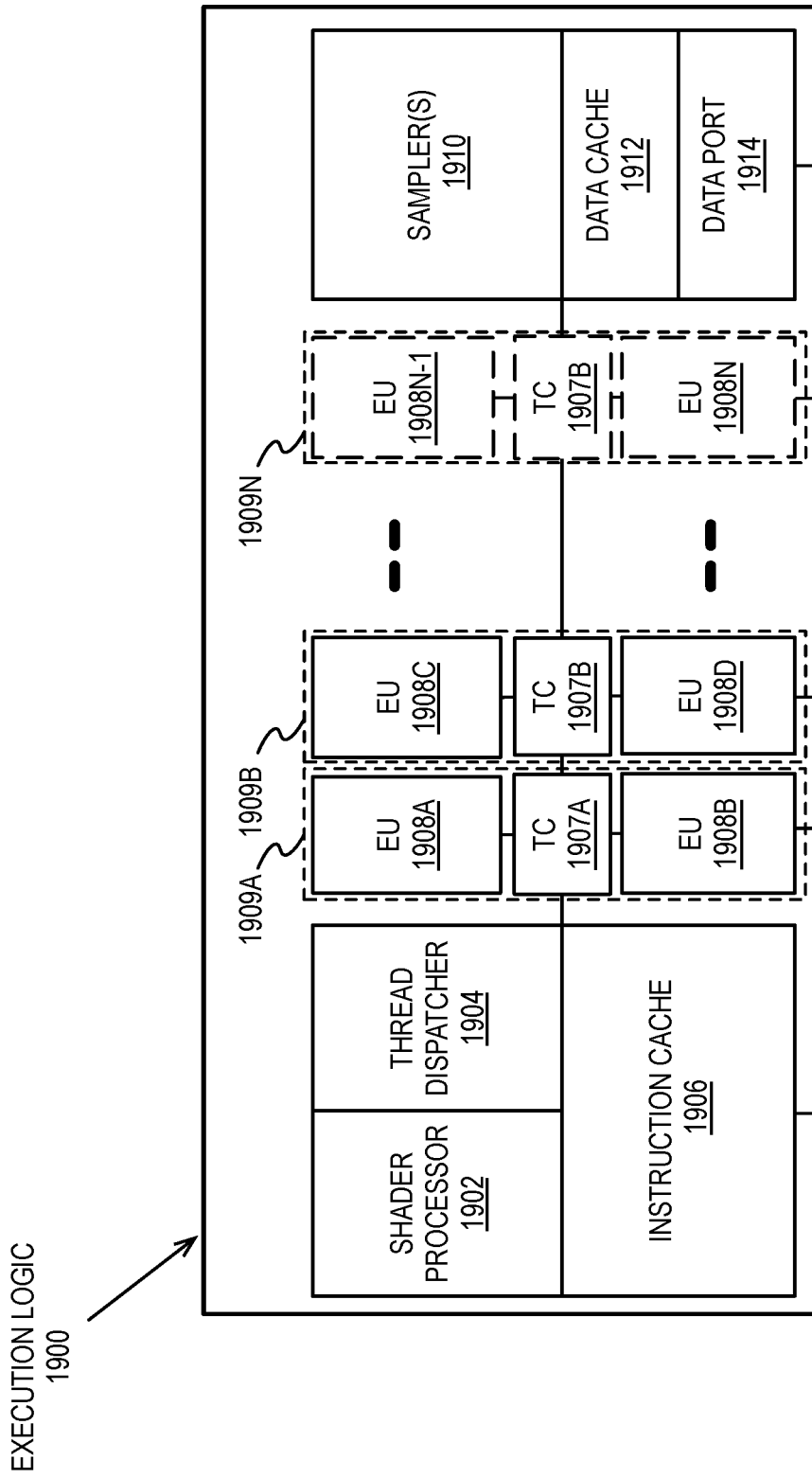
FIG. 19A-19B illustrate thread execution logic including an array of processing elements employed in a graphics processor core according to embodiments described herein.
Figure 19B:
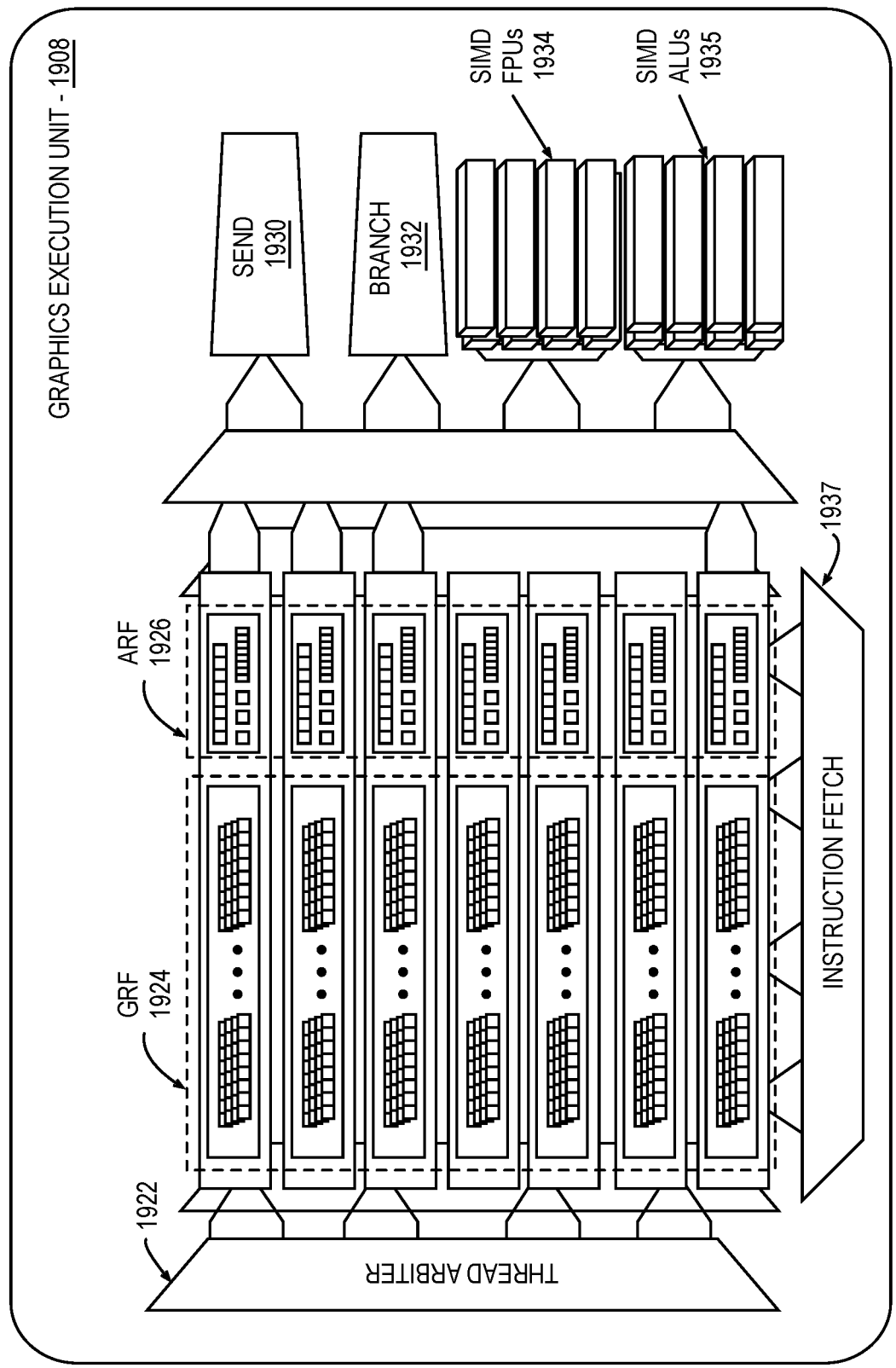

FIG. 19A-19B illustrate thread execution logic 1900 including an array of processing elements employed in a graphics processor core according to embodiments described herein. Elements of FIG. 19A-19B having the same reference numbers (or names) as the elements of any other figure herein can operate or function in any manner similar to that described elsewhere herein, but are not limited to such. FIG. 19A illustrates an overview of thread execution logic 1900, which can include a variant of the hardware logic illustrated with each sub-core 1801A-1801F of FIG. 18. FIG. 19B illustrates exemplary internal details of an execution unit.

As illustrated in FIG. 19A, in some embodiments thread execution logic 1900 includes a shader processor 1902, a thread dispatcher 1904, instruction cache 1906, a scalable execution unit array including a plurality of execution units 1908A-1908N, a sampler 1910, a data cache 1912, and a data port 1914. In one embodiment the scalable execution unit array can dynamically scale by enabling or disabling one or more execution units (e.g., any of execution unit 1908A, 1908B, 1908C, 1908D, through 1908N-1 and 1908N) based on the computational requirements of a workload. In one embodiment the included components are interconnected via an interconnect fabric that links to each of the components. In some embodiments, thread execution logic 1900 includes one or more connections to memory, such as system memory or cache memory, through one or more of instruction cache 1906, data port 1914, sampler 1910, and execution units 1908A-1908N. In some embodiments, each execution unit (e.g. 1908A) is a stand-alone programmable general-purpose computational unit that is capable of executing multiple simultaneous hardware threads while processing multiple data elements in parallel for each thread. In various embodiments, the array of execution units 1908A-1908N is scalable to include any number individual execution units.

In some embodiments, the execution units 1908A-1908N are primarily used to execute shader programs. A shader processor 1902 can process the various shader programs and dispatch execution threads associated with the shader programs via a thread dispatcher 1904. In one embodiment the thread dispatcher includes logic to arbitrate thread initiation requests from the graphics and media pipelines and instantiate the requested threads on one or more execution unit in the execution units 1908A-1908N. For example, a geometry pipeline can dispatch vertex, tessellation, or geometry shaders to the thread execution logic for processing. In some embodiments, thread dispatcher 1904 can also process runtime thread spawning requests from the executing shader programs.

In some embodiments, the execution units 1908A-1908N support an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders). Each of the execution units 1908A-1908N is capable of multi-issue single instruction multiple data (SIMD) execution and multi-threaded operation enables an efficient execution environment in the face of higher latency memory accesses. Each hardware thread within each execution unit has a dedicated high-bandwidth register file and associated independent thread-state. Execution is multi-issue per clock to pipelines capable of integer, single and double precision floating point operations, SIMD branch capability, logical operations, transcendental operations, and other miscellaneous operations. While waiting for data from memory or one of the shared functions, dependency logic within the execution units 1908A-1908N causes a waiting thread to sleep until the requested data has been returned. While the waiting thread is sleeping, hardware resources may be devoted to processing other threads. For example, during a delay associated with a vertex shader operation, an execution unit can perform operations for a pixel shader, fragment shader, or another type of shader program, including a different vertex shader. Various embodiments can apply to use execution by use of Single Instruction Multiple Thread (SIMT) as an alternate to use of SIMD or in addition to use of SIMD. Reference to a SIMD core or operation can apply also to SIMT or apply to SIMD in combination with SIMT.

Each execution unit in execution units 1908A-1908N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs) or Floating Point Units (FPUs) for a particular graphics processor. In some embodiments, execution units 1908A-1908N support integer and floating-point data types.

The execution unit instruction set includes SIMD instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible.

In one embodiment one or more execution units can be combined into a fused execution unit 1909A-1909N having thread control logic (1907A-1907N) that is common to the fused EUs. Multiple EUs can be fused into an EU group. Each EU in the fused EU group can be configured to execute a separate SIMD hardware thread. The number of EUs in a fused EU group can vary according to embodiments. Additionally, various SIMD widths can be performed per-EU, including but not limited to SIMD8, SIMD16, and SIMD32. Each fused graphics execution unit 1909A-1909N includes at least two execution units. For example, fused execution unit 1909A includes a first EU 1908A, second EU 1908B, and thread control logic 1907A that is common to the first EU 1908A and the second EU 1908B. The thread control logic 1907A controls threads executed on the fused graphics execution unit 1909A, allowing each EU within the fused execution units 1909A-1909N to execute using a common instruction pointer register.

One or more internal instruction caches (e.g., 1906) are included in the thread execution logic 1900 to cache thread instructions for the execution units. In some embodiments, one or more data caches (e.g., 1912) are included to cache thread data during thread execution. In some embodiments, a sampler 1910 is included to provide texture sampling for 3D operations and media sampling for media operations. In some embodiments, sampler 1910 includes specialized texture or media sampling functionality to process texture or media data during the sampling process before providing the sampled data to an execution unit.

During execution, the graphics and media pipelines send thread initiation requests to thread execution logic 1900 via thread spawning and dispatch logic. Once a group of geometric objects has been processed and rasterized into pixel data, pixel processor logic (e.g., pixel shader logic, fragment shader logic, etc.) within the shader processor 1902 is invoked to further compute output information and cause results to be written to output surfaces (e.g., color buffers, depth buffers, stencil buffers, etc.). In some embodiments, a pixel shader or fragment shader calculates the values of the various vertex attributes that are to be interpolated across the rasterized object. In some embodiments, pixel processor logic within the shader processor 1902 then executes an application programming interface (API)-supplied pixel or fragment shader program. To execute the shader program, the shader processor 1902 dispatches threads to an execution unit (e.g., 1908A) via thread dispatcher 1904. In some embodiments, shader processor 1902 uses texture sampling logic in the sampler 1910 to access texture data in texture maps stored in memory. Arithmetic operations on the texture data and the input geometry data compute pixel color data for each geometric fragment, or discards one or more pixels from further processing.

In some embodiments, the data port 1914 provides a memory access mechanism for the thread execution logic 1900 to output processed data to memory for further processing on a graphics processor output pipeline. In some embodiments, the data port 1914 includes or couples to one or more cache memories (e.g., data cache 1912) to cache data for memory access via the data port.

As illustrated in FIG. 19B, a graphics execution unit 1908 can include an instruction fetch unit 1937, a general register file array (GRF) 1924, an architectural register file array (ARF) 1926, a thread arbiter 1922, a send unit 1930, a branch unit 1932, a set of SIMD floating point units (FPUs) 1934, and in one embodiment a set of dedicated integer SIMD ALUs 1935. The GRF 1924 and ARF 1926 includes the set of general register files and architecture register files associated with each simultaneous hardware thread that may be active in the graphics execution unit 1908. In one embodiment, per thread architectural state is maintained in the ARF 1926, while data used during thread execution is stored in the GRF 1924. The execution state of each thread, including the instruction pointers for each thread, can be held in thread-specific registers in the ARF 1926.

In one embodiment the graphics execution unit 1908 has an architecture that is a combination of Simultaneous Multi-Threading (SMT) and fine-grained Interleaved Multi-Threading (IMT). The architecture has a modular configuration that can be fine-tuned at design time based on a target number of simultaneous threads and number of registers per execution unit, where execution unit resources are divided across logic used to execute multiple simultaneous threads.

In one embodiment, the graphics execution unit 1908 can co-issue multiple instructions, which may each be different instructions. The thread arbiter 1922 of the graphics execution unit 1908 can dispatch the instructions to one of the send unit 1930, branch unit 1932, or SIMD FPU(s) 1934 for execution. Each execution thread can access 128 general-purpose registers within the GRF 1924, where each register can store 32 bytes, accessible as an 8-element vector of 32-bit data elements. In one embodiment, each execution unit thread has access to 4 Kbytes within the GRF 1924, although embodiments are not so limited, and greater or fewer register resources may be provided in other embodiments. In one embodiment up to seven threads can execute simultaneously, although the number of threads per execution unit can also vary according to embodiments. In an embodiment in which seven threads may access 4 Kbytes, the GRF 1924 can store a total of 28 Kbytes. Flexible addressing modes can permit registers to be addressed together to build effectively wider registers or to represent strided rectangular block data structures.

In one embodiment, memory operations, sampler operations, and other longer-latency system communications are dispatched via "send" instructions that are executed by the message passing send unit 1930. In one embodiment, branch instructions are dispatched to a dedicated branch unit 1932 to facilitate SIMD divergence and eventual convergence.

In one embodiment the graphics execution unit 1908 includes one or more SIMD floating point units (FPU(s)) 1934 to perform floating-point operations. In one embodiment, the FPU(s) 1934 also support integer computation. In one embodiment the FPU(s) 1934 can SIMD execute up to M number of 32-bit floating-point (or integer) operations, or SIMD execute up to 2M 16-bit integer or 16-bit floating-point operations. In one embodiment, at least one of the FPU(s) provides extended math capability to support high-throughput transcendental math functions and double precision 64-bit floating-point. In some embodiments, a set of 8-bit integer SIMD ALUs 1935 are also present and may be specifically optimized to perform operations associated with machine learning computations.

In one embodiment, arrays of multiple instances of the graphics execution unit 1908 can be instantiated in a graphics sub-core grouping (e.g., a sub-slice). For scalability, product architects can choose the exact number of execution units per sub-core grouping. In one embodiment the execution unit 1908 can execute instructions across a plurality of execution channels. In a further embodiment, each thread executed on the graphics execution unit 1908 is executed on a different channel.

FIG. 20 is a block diagram illustrating graphics processor instruction formats 2000 according to some embodiments. In one or more embodiment, the graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments, the graphics processor instruction formats 2000 described and illustrated are macro-instructions, in that they are instructions supplied to the execution unit, as opposed to micro-operations resulting from instruction decode once the instruction is processed.

In some embodiments, the graphics processor execution units natively support instructions in a 128-bit instruction format 2010. A 64-bit compacted instruction format 2030 is available for some instructions based on the selected instruction, instruction options, and number of operands. The native 128-bit instruction format 2010 provides access to all instruction options, while some options and operations are restricted in the 64-bit format 2030. The native instructions available in the 64-bit format 2030 vary by embodiment. In some embodiments, the instruction is compacted in part using a set of index values in an index field 2013. The execution unit hardware references a set of compaction tables based on the index values and uses the compaction table outputs to reconstruct a native instruction in the 128-bit instruction format 2010. Other sizes and formats of instruction can be used.

For each format, instruction opcode 2012 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. In some embodiments, instruction control field 2014 enables control over certain execution options, such as channels selection (e.g., predication) and data channel order (e.g., swizzle). For instructions in the 128-bit instruction format 2010 an exec-size field 2016 limits the number of data channels that will be executed in parallel. In some embodiments, exec-size field 2016 is not available for use in the 64-bit compact instruction format 2030.

Some execution unit instructions have up to three operands including two source operands, src0 2020, src1 2022, and one destination 2018. In some embodiments, the execution units support dual destination instructions, where one of the destinations is implied. Data manipulation instructions can have a third source operand (e.g., SRC2 2024), where the instruction opcode 2012 determines the number of source operands. An instruction's last source operand can be an immediate (e.g., hard-coded) value passed with the instruction.

In some embodiments, the 128-bit instruction format 2010 includes an access/address mode field 2026 specifying, for example, whether direct register addressing mode or indirect register addressing mode is used. When direct register addressing mode is used, the register address of one or more operands is directly provided by bits in the instruction.

In some embodiments, the 128-bit instruction format 2010 includes an access/address mode field 2026, which specifies an address mode and/or an access mode for the instruction. In one embodiment the access mode is used to define a data access alignment for the instruction. Some embodiments support access modes including a 16-byte aligned access mode and a 1-byte aligned access mode, where the byte alignment of the access mode determines the access alignment of the instruction operands. For example, when in a first mode, the instruction may use byte-aligned addressing for source and destination operands and when in a second mode, the instruction may use 16-byte-aligned addressing for all source and destination operands.

In one embodiment, the address mode portion of the access/address mode field 2026 determines whether the instruction is to use direct or indirect addressing. When direct register addressing mode is used bits in the instruction directly provide the register address of one or more operands. When indirect register addressing mode is used, the register address of one or more operands may be computed based on an address register value and an address immediate field in the instruction.

In some embodiments instructions are grouped based on opcode 2012 bit-fields to simplify Opcode decode 2040. For an 8-bit opcode, bits 4, 5, and 6 allow the execution unit to determine the type of opcode. The precise opcode grouping shown is merely an example. In some embodiments, a move and logic opcode group 2042 includes data movement and logic instructions (e.g., move (mov), compare (cmp)). In some embodiments, move and logic group 2042 shares the five most significant bits (MSB), where move (mov) instructions are in the form of 0000xxxxb and logic instructions are in the form of 0001xxxxb. A flow control instruction group 2044 (e.g., call, jump (jmp)) includes instructions in the form of 0010xxxxb (e.g., 0x20). A miscellaneous instruction group 2046 includes a mix of instructions, including synchronization instructions (e.g., wait, send) in the form of 0011xxxxb (e.g., 0x30). A parallel math instruction group 2048 includes component-wise arithmetic instructions (e.g., add, multiply (mul)) in the form of 0100xxxxb (e.g., 0x40). The parallel math group 2048 performs the arithmetic operations in parallel across data channels. The vector math group 2050 includes arithmetic instructions (e.g., dp4) in the form of 0101xxxxb (e.g., 0x50). The vector math group performs arithmetic such as dot product calculations on vector operands.

Graphics Pipeline

Figure 21:
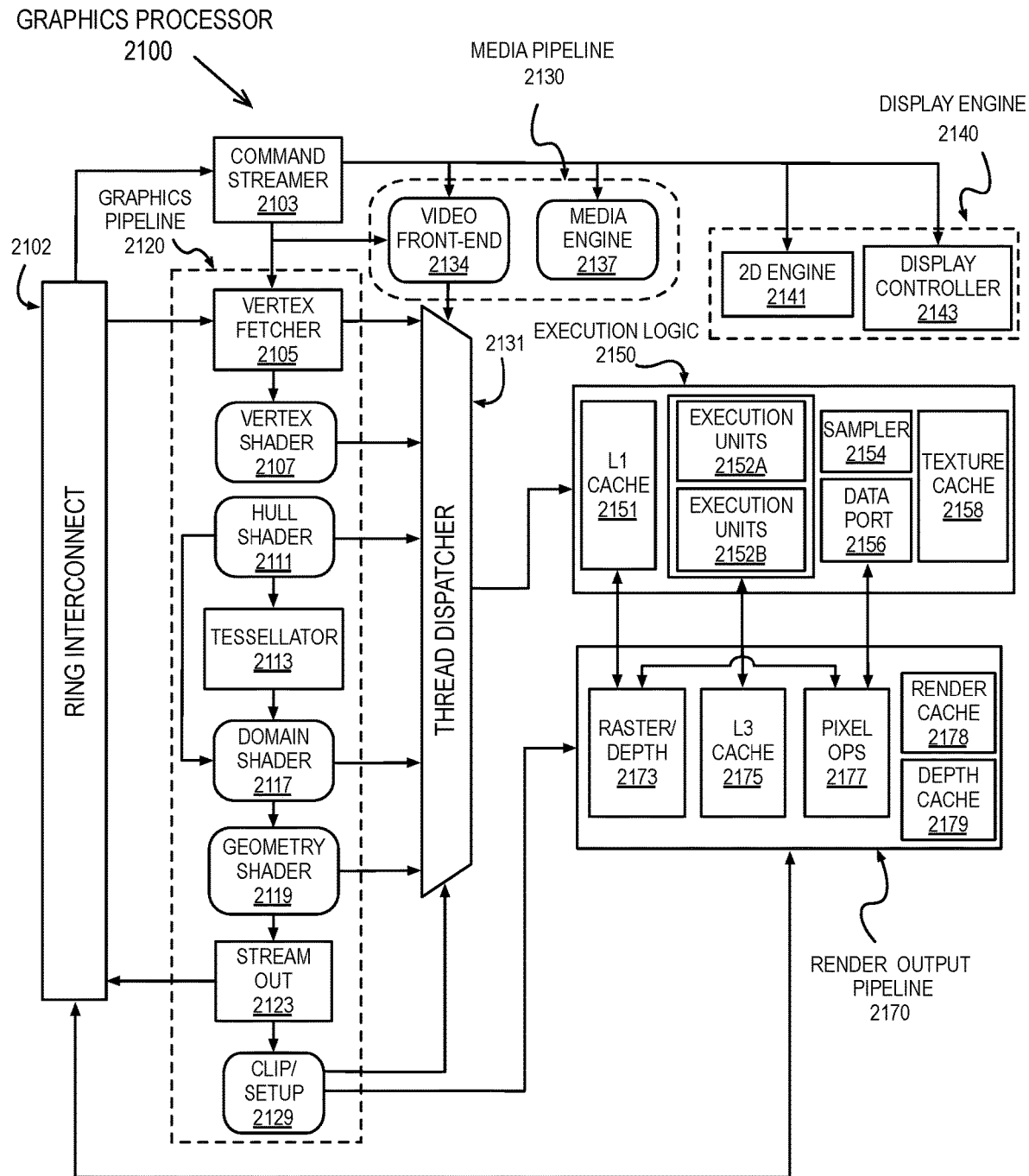
FIG. 21 is a block diagram of a graphics processor according to another embodiment.
Figure 22:
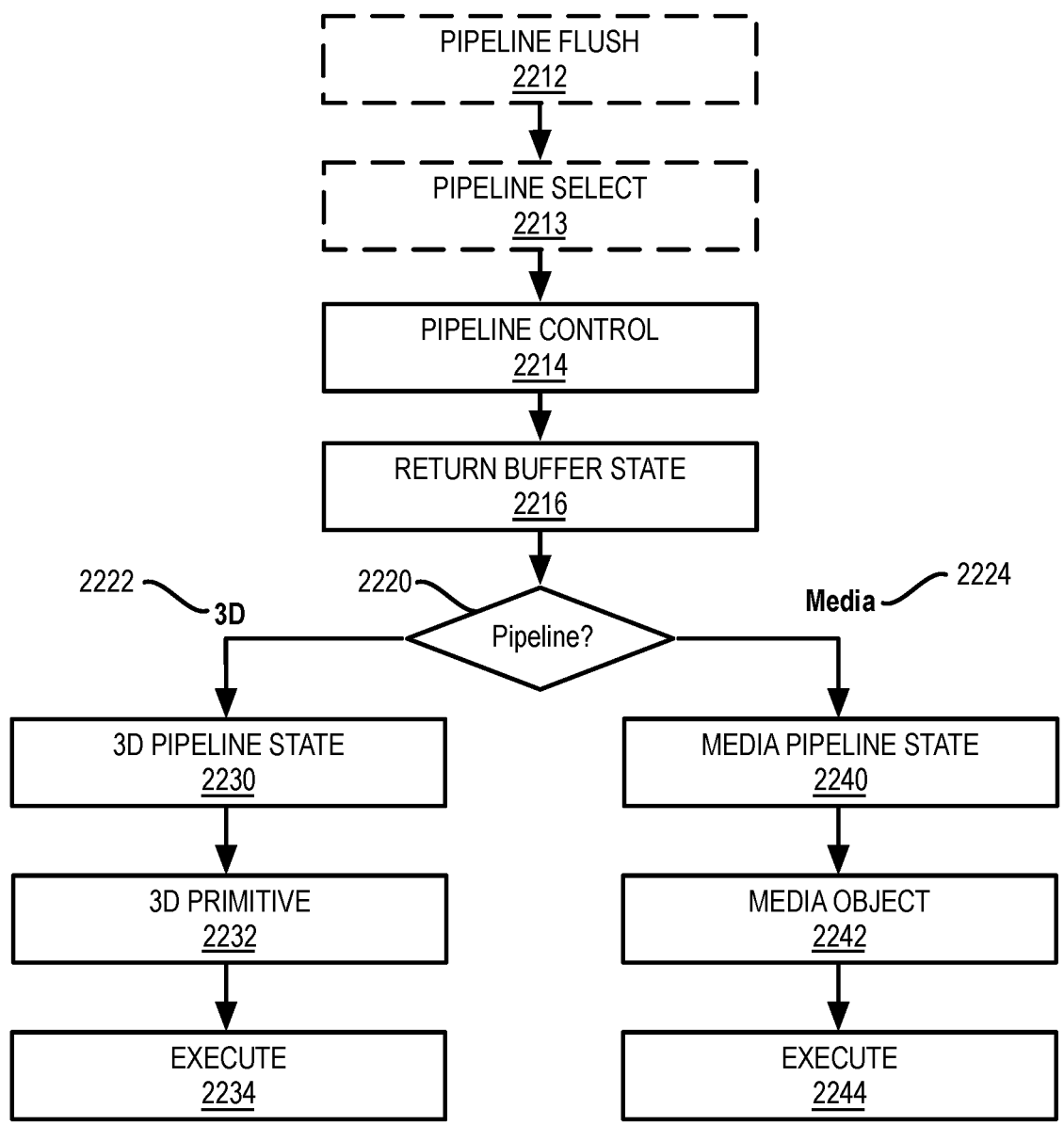
FIG. 22A-22B illustrate a graphics processor command format and command sequence, according to some embodiments.

FIG. 21 is a block diagram of another embodiment of a graphics processor 2100. Elements of FIG. 21 having the same reference numbers (or names) as the elements of any other figure herein can operate or function in any manner similar to that described elsewhere herein, but are not limited to such.

In some embodiments, graphics processor 2100 includes a geometry pipeline 2120, a media pipeline 2130, a display engine 2140, thread execution logic 2150, and a render output pipeline 2170. In some embodiments, graphics processor 2100 is a graphics processor within a multi-core processing system that includes one or more general-purpose processing cores. The graphics processor is controlled by register writes to one or more control registers (not shown) or via commands issued to graphics processor 2100 via a ring interconnect 2102. In some embodiments, ring interconnect 2102 couples graphics processor 2100 to other processing components, such as other graphics processors or general-purpose processors. Commands from ring interconnect 2102 are interpreted by a command streamer 2103, which supplies instructions to individual components of the geometry pipeline 2120 or the media pipeline 2130.

In some embodiments, command streamer 2103 directs the operation of a vertex fetcher 2105 that reads vertex data from memory and executes vertex-processing commands provided by command streamer 2103. In some embodiments, vertex fetcher 2105 provides vertex data to a vertex shader 2107, which performs coordinate space transformation and lighting operations to each vertex. In some embodiments, vertex fetcher 2105 and vertex shader 2107 execute vertex-processing instructions by dispatching execution threads to execution units 2152A-2152B via a thread dispatcher 2131.

In some embodiments, execution units 2152A-2152B are an array of vector processors having an instruction set for performing graphics and media operations. In some embodiments, execution units 2152A-2152B have an attached L1 cache 2151 that is specific for each array or shared between the arrays. The cache can be configured as a data cache, an instruction cache, or a single cache that is partitioned to contain data and instructions in different partitions.

In some embodiments, geometry pipeline 2120 includes tessellation components to perform hardware-accelerated tessellation of 3D objects. In some embodiments, a programmable hull shader 2111 configures the tessellation operations. A programmable domain shader 2117 provides back-end evaluation of tessellation output. A tessellator 2113 operates at the direction of hull shader 2111 and contains special purpose logic to generate a set of detailed geometric objects based on a coarse geometric model that is provided as input to geometry pipeline 2120. In some embodiments, if tessellation is not used, tessellation components (e.g., hull shader 2111, tessellator 2113, and domain shader 2117) can be bypassed.

In some embodiments, complete geometric objects can be processed by a geometry shader 2119 via one or more threads dispatched to execution units 2152A-2152B, or can proceed directly to the clipper 2129. In some embodiments, the geometry shader operates on entire geometric objects, rather than vertices or patches of vertices as in previous stages of the graphics pipeline. If the tessellation is disabled the geometry shader 2119 receives input from the vertex shader 2107. In some embodiments, geometry shader 2119 is programmable by a geometry shader program to perform geometry tessellation if the tessellation units are disabled.

Before rasterization, a clipper 2129 processes vertex data. The clipper 2129 may be a fixed function clipper or a programmable clipper having clipping and geometry shader functions. In some embodiments, a rasterizer and depth test component 2173 in the render output pipeline 2170 dispatches pixel shaders to convert the geometric objects into per pixel representations. In some embodiments, pixel shader logic is included in thread execution logic 2150. In some embodiments, an application can bypass the rasterizer and depth test component 2173 and access un-rasterized vertex data via a stream out unit 2123.

The graphics processor 2100 has an interconnect bus, interconnect fabric, or some other interconnect mechanism that allows data and message passing amongst the major components of the processor. In some embodiments, execution units 2152A-2152B and associated logic units (e.g., L1 cache 2151, sampler 2154, texture cache 2158, etc.) interconnect via a data port 2156 to perform memory access and communicate with render output pipeline components of the processor. In some embodiments, sampler 2154, L1 cache 2151, texture cache 2158, and execution units 2152A-2152B each have separate memory access paths. In one embodiment the texture cache 2158 can also be configured as a sampler cache.

In some embodiments, render output pipeline 2170 contains a rasterizer and depth test component 2173 that converts vertex-based objects into an associated pixel-based representation. In some embodiments, the rasterizer logic includes a windower/masker unit to perform fixed function triangle and line rasterization. An associated render cache 2178 and depth cache 2179 are also available in some embodiments. A pixel operations component 2177 performs pixel-based operations on the data, though in some instances, pixel operations associated with 2D operations (e.g. bit block image transfers with blending) are performed by the 2D engine 2141, or substituted at display time by the display controller 2143 using overlay display planes. In some embodiments, a shared L3 cache 2175 is available to all graphics components, allowing the sharing of data without the use of main system memory.

In some embodiments, graphics processor media pipeline 2130 includes a media engine 2137 and a video front-end 2134. In some embodiments, video front-end 2134 receives pipeline commands from the command streamer 2103. In some embodiments, media pipeline 2130 includes a separate command streamer. In some embodiments, video front-end 2134 processes media commands before sending the command to the media engine 2137. In some embodiments, media engine 2137 includes thread spawning functionality to spawn threads for dispatch to thread execution logic 2150 via thread dispatcher 2131.

In some embodiments, graphics processor 2100 includes a display engine 2140. In some embodiments, display engine 2140 is external to processor 2100 and couples with the graphics processor via the ring interconnect 2102, or some other interconnect bus or fabric. In some embodiments, display engine 2140 includes a 2D engine 2141 and a display controller 2143. In some embodiments, display engine 2140 contains special purpose logic capable of operating independently of the 3D pipeline. In some embodiments, display controller 2143 couples with a display device (not shown), which may be a system integrated display device, as in a laptop computer, or an external display device attached via a display device connector.

In some embodiments, the geometry pipeline 2120 and media pipeline 2130 are configurable to perform operations based on multiple graphics and media programming interfaces and are not specific to any one application programming interface (API). In some embodiments, driver software for the graphics processor translates API calls that are specific to a particular graphics or media library into commands that can be processed by the graphics processor. In some embodiments, support is provided for the Open Graphics Library (OpenGL), Open Computing Language (OpenCL), and/or Vulkan graphics and compute API, all from the Khronos Group. In some embodiments, support may also be provided for the Direct3D library from the Microsoft Corporation. In some embodiments, a combination of these libraries may be supported. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

FIG. 22A is a block diagram illustrating a graphics processor command format 2200 according to some embodiments. FIG. 22B is a block diagram illustrating a graphics processor command sequence 2210 according to an embodiment. The solid lined boxes in FIG. 22A illustrate the components that are generally included in a graphics command while the dashed lines include components that are optional or that are only included in a sub-set of the graphics commands. The exemplary graphics processor command format 2200 of FIG. 22A includes data fields to identify a client 2202, a command operation code (opcode) 2204, and data 2206 for the command. A sub-opcode 2205 and a command size 2208 are also included in some commands.

In some embodiments, client 2202 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads the opcode 2204 and, if present, sub-opcode 2205 to determine the operation to perform. The client unit performs the command using information in data field 2206. For some commands an explicit command size 2208 is expected to specify the size of the command. In some embodiments, the command parser automatically determines the size of at least some of the commands based on the command opcode. In some embodiments commands are aligned via multiples of a double word. Other command formats can be used.

The flow diagram in FIG. 22B illustrates an exemplary graphics processor command sequence 2210. In some embodiments, software or firmware of a data processing system that features an embodiment of a graphics processor uses a version of the command sequence shown to set up, execute, and terminate a set of graphics operations. A sample command sequence is shown and described for purposes of example only as embodiments are not limited to these specific commands or to this command sequence. Moreover, the commands may be issued as batch of commands in a command sequence, such that the graphics processor will process the sequence of commands in at least partially concurrence.

In some embodiments, the graphics processor command sequence 2210 may begin with a pipeline flush command 2212 to cause any active graphics pipeline to complete the currently pending commands for the pipeline. In some embodiments, the 3D pipeline 2222 and the media pipeline 2224 do not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 2212 can be used for pipeline synchronization or before placing the graphics processor into a low power state.

In some embodiments, a pipeline select command 2213 is used when a command sequence requires the graphics processor to explicitly switch between pipelines. In some embodiments, a pipeline select command 2213 is required only once within an execution context before issuing pipeline commands unless the context is to issue commands for both pipelines. In some embodiments, a pipeline flush command 2212 is required immediately before a pipeline switch via the pipeline select command 2213.

In some embodiments, a pipeline control command 2214 configures a graphics pipeline for operation and is used to program the 3D pipeline 2222 and the media pipeline 2224. In some embodiments, pipeline control command 2214 configures the pipeline state for the active pipeline. In one embodiment, the pipeline control command 2214 is used for pipeline synchronization and to clear data from one or more cache memories within the active pipeline before processing a batch of commands.

In some embodiments, commands to configure the return buffer state 2216 are used to configure a set of return buffers for the respective pipelines to write data. Some pipeline operations require the allocation, selection, or configuration of one or more return buffers into which the operations write intermediate data during processing. In some embodiments, the graphics processor also uses one or more return buffers to store output data and to perform cross thread communication. In some embodiments, the return buffer state 2216 includes selecting the size and number of return buffers to use for a set of pipeline operations.

The remaining commands in the command sequence differ based on the active pipeline for operations. Based on a pipeline determination 2220, the command sequence is tailored to the 3D pipeline 2222 beginning with the 3D pipeline state 2230 or the media pipeline 2224 beginning at the media pipeline state 2240.

The commands to configure the 3D pipeline state 2230 include 3D state setting commands for vertex buffer state, vertex element state, constant color state, depth buffer state, and other state variables that are to be configured before 3D primitive commands are processed. The values of these commands are determined at least in part based on the particular 3D API in use. In some embodiments, 3D pipeline state 2230 commands are also able to selectively disable or bypass certain pipeline elements if those elements will not be used.

In some embodiments, 3D primitive 2232 command is used to submit 3D primitives to be processed by the 3D pipeline. Commands and associated parameters that are passed to the graphics processor via the 3D primitive 2232 command are forwarded to the vertex fetch function in the graphics pipeline. The vertex fetch function uses the 3D primitive 2232 command data to generate vertex data structures. The vertex data structures are stored in one or more return buffers. In some embodiments, 3D primitive 2232 command is used to perform vertex operations on 3D primitives via vertex shaders. To process vertex shaders, 3D pipeline 2222 dispatches shader execution threads to graphics processor execution units.

In some embodiments, 3D pipeline 2222 is triggered via an execute 2234 command or event. In some embodiments, a register write triggers command execution. In some embodiments execution is triggered via a 'go' or 'kick' command in the command sequence. In one embodiment, command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, the graphics processor command sequence 2210 follows the media pipeline 2224 path when performing media operations. In general, the specific use and manner of programming for the media pipeline 2224 depends on the media or compute operations to be performed. Specific media decode operations may be offloaded to the media pipeline during media decode. In some embodiments, the media pipeline can also be bypassed and media decode can be performed in whole or in part using resources provided by one or more general-purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 2224 is configured in a similar manner as the 3D pipeline 2222. A set of commands to configure the media pipeline state 2240 are dispatched or placed into a command queue before the media object commands 2242. In some embodiments, commands for the media pipeline state 2240 include data to configure the media pipeline elements that will be used to process the media objects. This includes data to configure the video decode and video encode logic within the media pipeline, such as encode or decode format. In some embodiments, commands for the media pipeline state 2240 also support the use of one or more pointers to "indirect" state elements that contain a batch of state settings.

In some embodiments, media object commands 2242 supply pointers to media objects for processing by the media pipeline. The media objects include memory buffers containing video data to be processed. In some embodiments, all media pipeline states must be valid before issuing a media object command 2242. Once the pipeline state is configured and media object commands 2242 are queued, the media pipeline 2224 is triggered via an execute command 2244 or an equivalent execute event (e.g., register write). Output from media pipeline 2224 may then be post processed by operations provided by the 3D pipeline 2222 or the media pipeline 2224. In some embodiments, GPGPU operations are configured and executed in a similar manner as media operations.

Graphics Software Architecture

Figure 23:
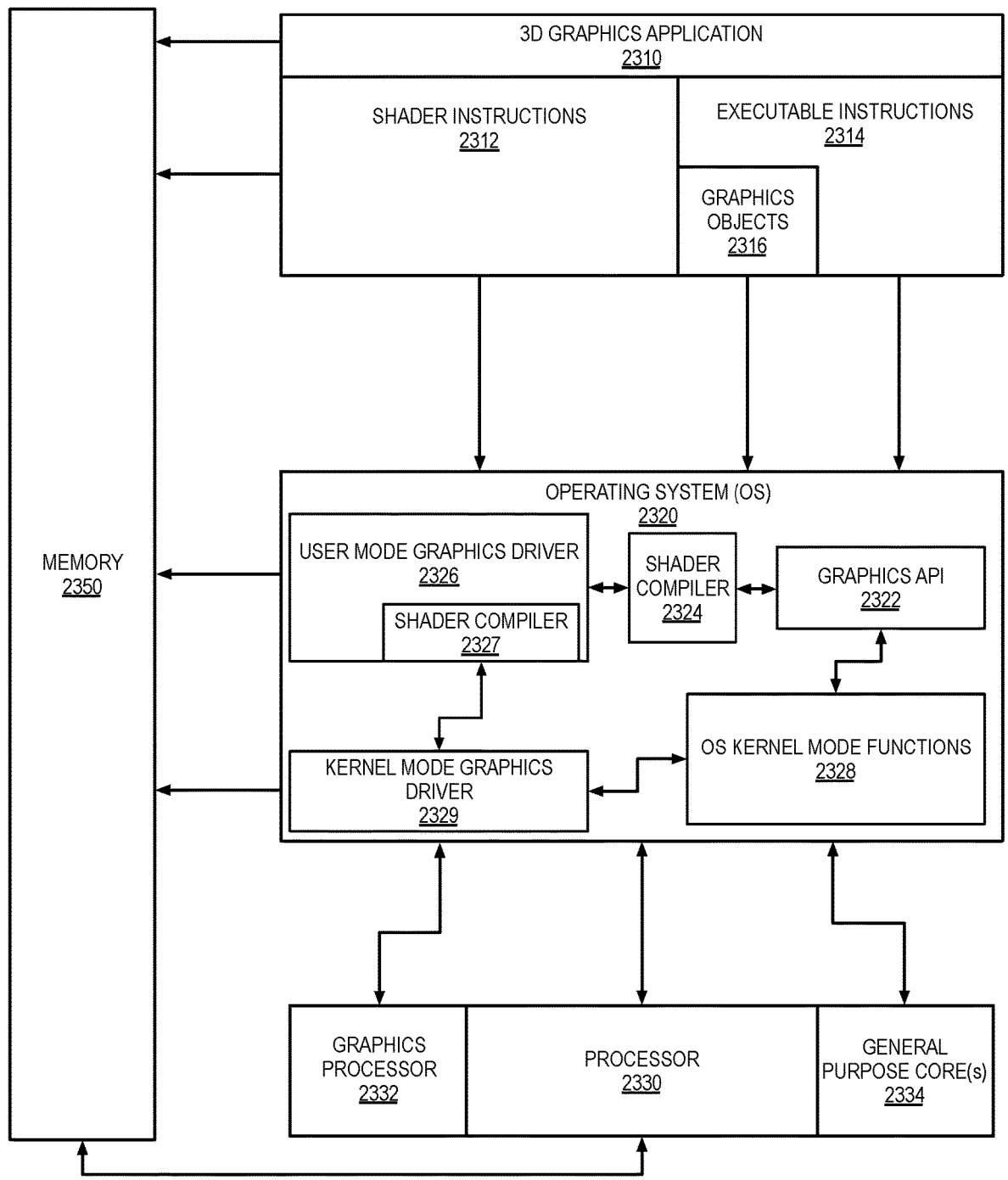
FIG. 23 illustrates exemplary graphics software architecture for a data processing system according to some embodiments.

FIG. 23 illustrates an exemplary graphics software architecture for a data processing system 2300 according to some embodiments. In some embodiments, software architecture includes a 3D graphics application 2310, an operating system 2320, and at least one processor 2330. In some embodiments, processor 2330 includes a graphics processor 2332 and one or more general-purpose processor core(s) 2334. The graphics application 2310 and operating system 2320 each execute in the system memory 2350 of the data processing system.

In some embodiments, 3D graphics application 2310 contains one or more shader programs including shader instructions 2312. The shader language instructions may be in a high-level shader language, such as the High-Level Shader Language (HLSL) of Direct3D, the OpenGL Shader Language (GLSL), and so forth. The application also includes executable instructions 2314 in a machine language suitable for execution by the general-purpose processor core 2334. The application also includes graphics objects 2316 defined by vertex data.

In some embodiments, operating system 2320 is a Microsoft® Windows® operating system from the Microsoft Corporation, a proprietary UNIX-like operating system, or an open source UNIX-like operating system using a variant of the Linux kernel. The operating system 2320 can support a graphics API 2322 such as the Direct3D API, the OpenGL API, or the Vulkan API. When the Direct3D API is in use, the operating system 2320 uses a front-end shader compiler 2324 to compile any shader instructions 2312 in HLSL into a lower-level shader language. The compilation may be a just-in-time (JIT) compilation or the application can perform shader pre-compilation. In some embodiments, high-level shaders are compiled into low-level shaders during the compilation of the 3D graphics application 2310. In some embodiments, the shader instructions 2312 are provided in an intermediate form, such as a version of the Standard Portable Intermediate Representation (SPIR) used by the Vulkan API.

In some embodiments, user mode graphics driver 2326 contains a back-end shader compiler 2327 to convert the shader instructions 2312 into a hardware specific representation. When the OpenGL API is in use, shader instructions 2312 in the GLSL high-level language are passed to a user mode graphics driver 2326 for compilation. In some embodiments, user mode graphics driver 2326 uses operating system kernel mode functions 2328 to communicate with a kernel mode graphics driver 2329. In some embodiments, kernel mode graphics driver 2329 communicates with graphics processor 2332 to dispatch commands and instructions.

IP Core Implementations

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 24A:
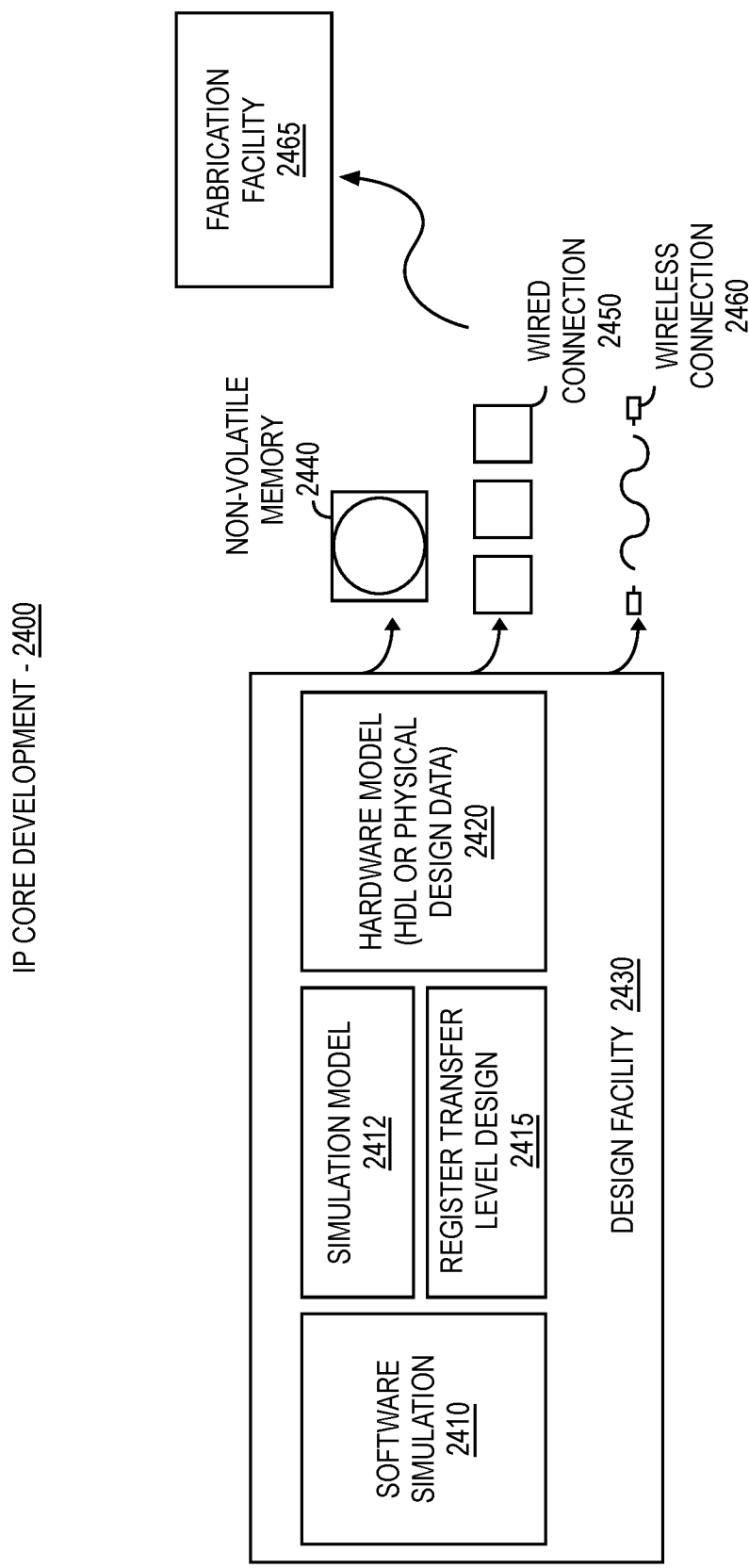
FIG. 24A is a block diagram illustrating an IP core development system, according to an embodiment.

FIG. 24A is a block diagram illustrating an IP core development system 2400 that may be used to manufacture an integrated circuit to perform operations according to an embodiment. The IP core development system 2400 may be used to generate modular, re-usable designs that can be incorporated into a larger design or used to construct an entire integrated circuit (e.g., an SOC integrated circuit). A design facility 2430 can generate a software simulation 2410 of an IP core design in a high-level programming language (e.g., C/C++). The software simulation 2410 can be used to design, test, and verify the behavior of the IP core using a simulation model 2412. The simulation model 2412 may include functional, behavioral, and/or timing simulations. A register transfer level (RTL) design 2415 can then be created or synthesized from the simulation model 2412. The RTL design 2415 is an abstraction of the behavior of the integrated circuit that models the flow of digital signals between hardware registers, including the associated logic performed using the modeled digital signals. In addition to an RTL design 2415, lower-level designs at the logic level or transistor level may also be created, designed, or synthesized. Thus, the particular details of the initial design and simulation may vary.

The RTL design 2415 or equivalent may be further synthesized by the design facility into a hardware model 2420, which may be in a hardware description language (HDL), or some other representation of physical design data. The HDL may be further simulated or tested to verify the IP core design. The IP core design can be stored for delivery to a 3rd party fabrication facility 2465 using non-volatile memory 2440 (e.g., hard disk, flash memory, or any non-volatile storage medium). Alternatively, the IP core design may be transmitted (e.g., via the Internet) over a wired connection 2450 or wireless connection 2460. The fabrication facility 2465 may then fabricate an integrated circuit that is based at least in part on the IP core design. The fabricated integrated circuit can be configured to perform operations in accordance with at least one embodiment described herein.

Figure 24B:
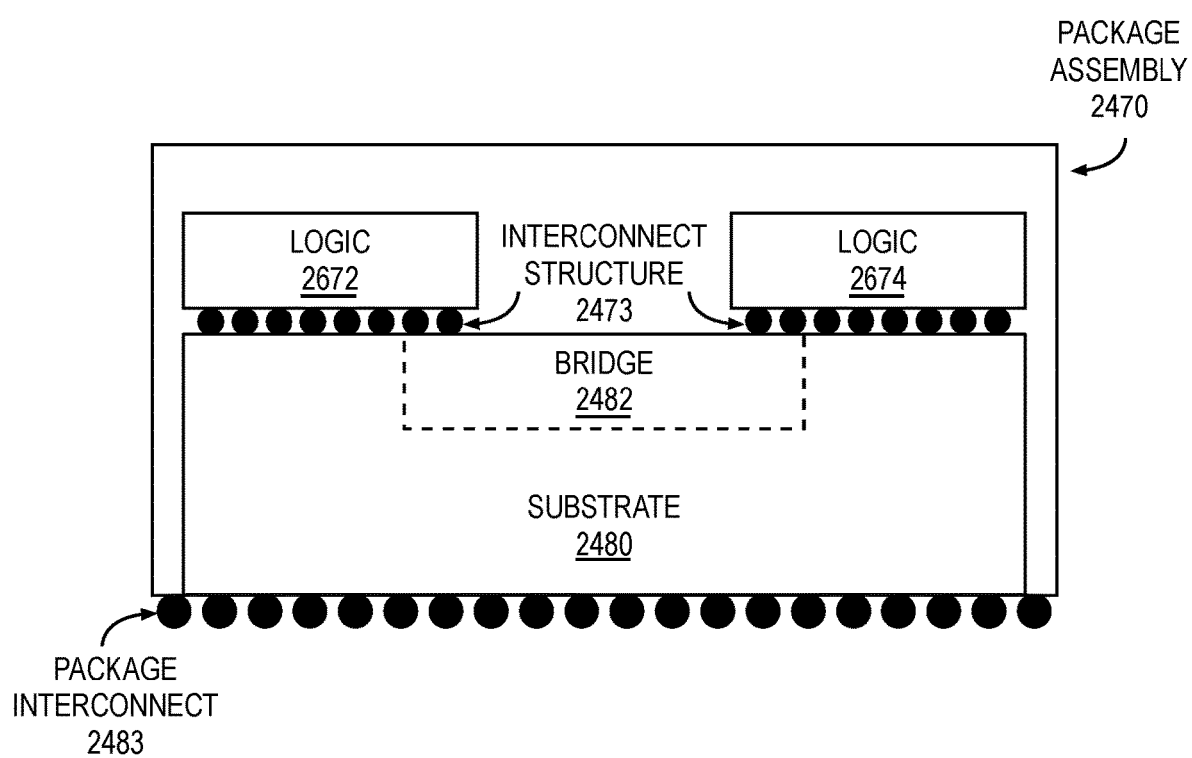
FIG. 24B illustrates a cross-section side view of an integrated circuit package assembly, according to some embodiments described herein.

FIG. 24B illustrates a cross-section side view of n integrated circuit package assembly 2470, according to some embodiments described herein. The integrated circuit package assembly 2470 illustrates an implementation of one or more processor or accelerator devices as described herein. The package assembly 2470 includes multiple units of hardware logic 2472, 2474 connected to a substrate 2480. The logic 2472, 2474 may be implemented at least partly in configurable logic or fixed-functionality logic hardware, and can include one or more portions of any of the processor core(s), graphics processor(s), or other accelerator devices described herein. Each unit of logic 2472, 2474 can be implemented within a semiconductor die and coupled with the substrate 2480 via an interconnect structure 2473. The interconnect structure 2473 may be configured to route electrical signals between the logic 2472, 2474 and the substrate 2480, and can include interconnects such as, but not limited to bumps or pillars. In some embodiments, the interconnect structure 2473 may be configured to route electrical signals such as, for example, input/output (I/O) signals and/or power or ground signals associated with the operation of the logic 2472, 2474. In some embodiments, the substrate 2480 is an epoxy-based laminate substrate. The substrate 2480 may include other suitable types of substrates in other embodiments. The package assembly 2470 can be connected to other electrical devices via a package interconnect 2483. The package interconnect 2483 may be coupled to a surface of the substrate 2480 to route electrical signals to other electrical devices, such as a motherboard, other chipset, or multi-chip module.

In some embodiments, the units of logic 2472, 2474 are electrically coupled with a bridge 2482 that is configured to route electrical signals between the logic 2472, 2474. The bridge 2482 may be a dense interconnect structure that provides a route for electrical signals. The bridge 2482 may include a bridge substrate composed of glass or a suitable semiconductor material. Electrical routing features can be formed on the bridge substrate to provide a chip-to-chip connection between the logic 2472, 2474.

Although two units of logic 2472, 2474 and a bridge 2482 are illustrated, embodiments described herein may include more or fewer logic units on one or more dies. The one or more dies may be connected by zero or more bridges, as the bridge 2482 may be excluded when the logic is included on a single die. Alternatively, multiple dies or units of logic can be connected by one or more bridges. Additionally, multiple logic units, dies, and bridges can be connected together in other possible configurations, including three-dimensional configurations.

Exemplary System on a Chip Integrated Circuit

Figure 25:
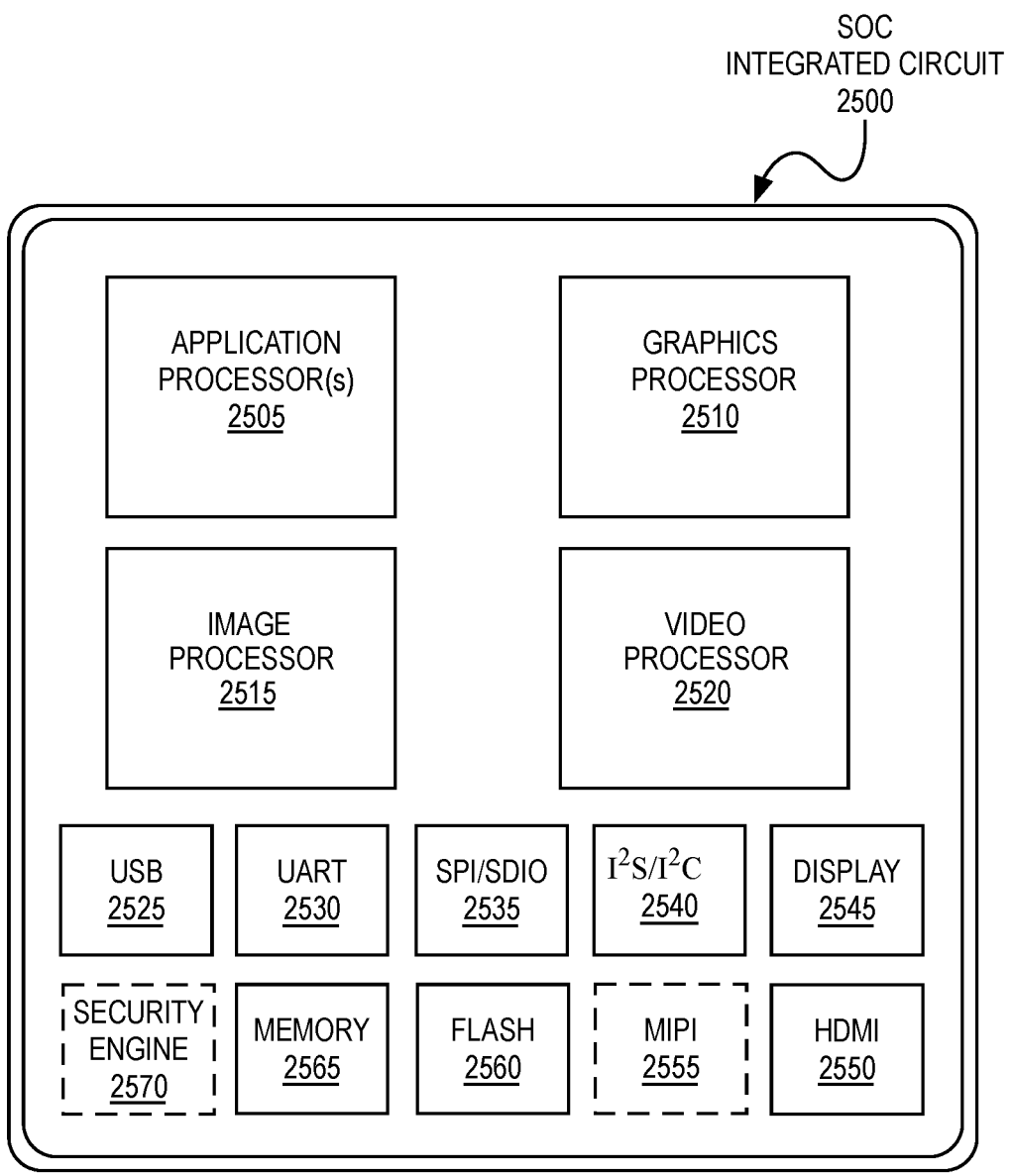
FIG. 25 is a block diagram illustrating an exemplary system on a chip integrated circuit, according to an embodiment.
Figure 26A:
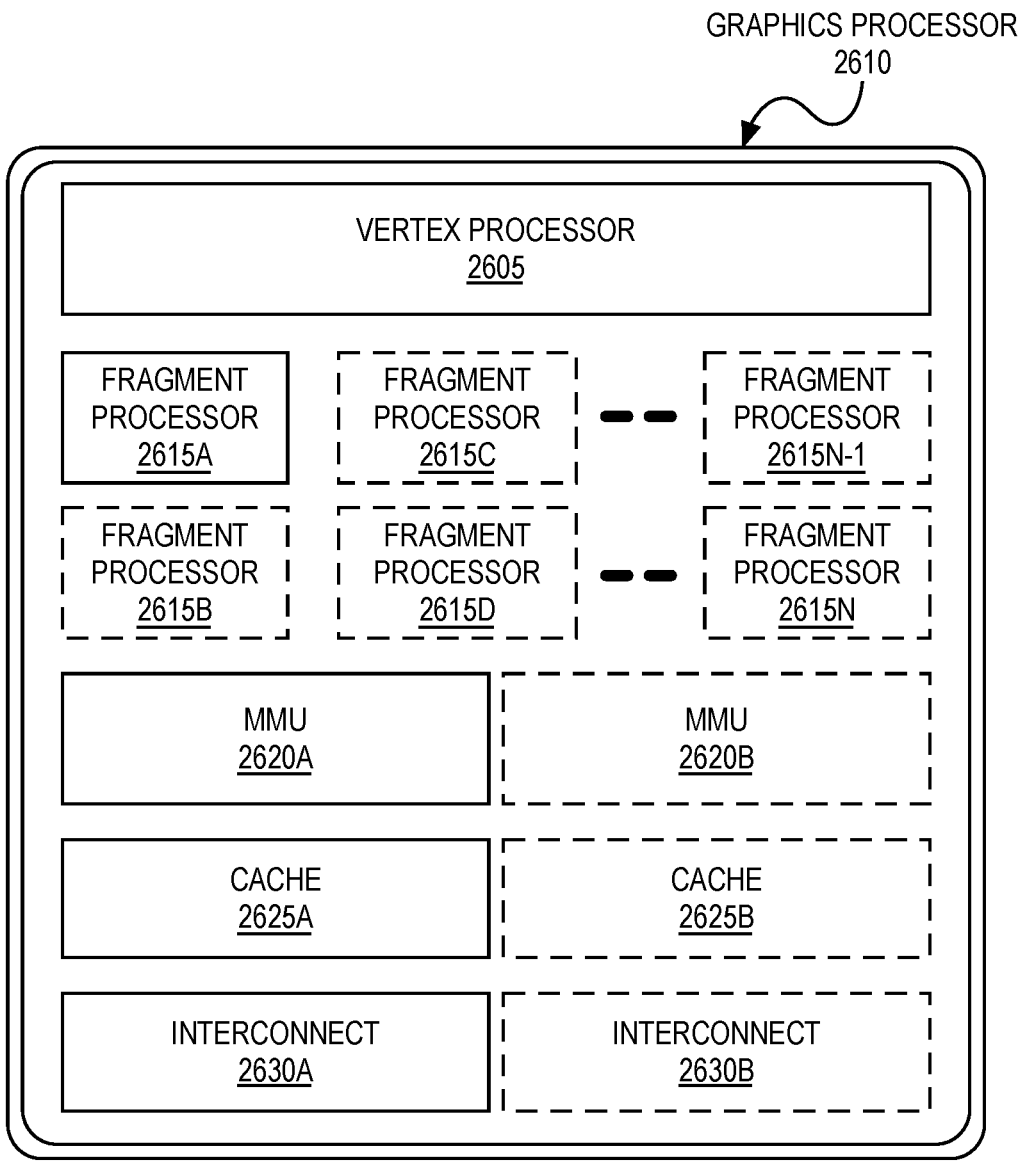
FIG. 26A-26B are block diagrams illustrating exemplary graphics processors for use within an SoC, according to embodiments described herein.
Figure 26B:
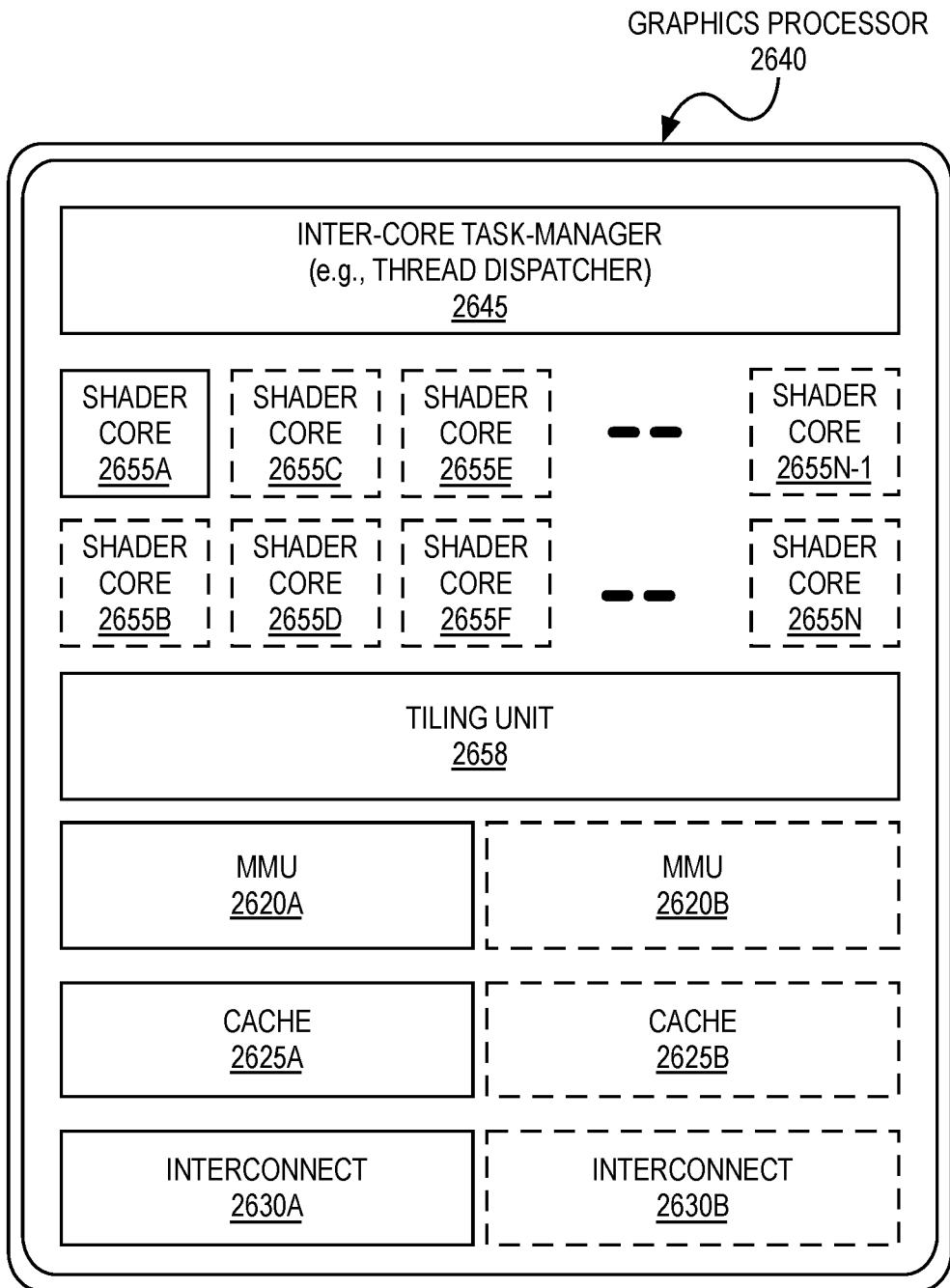

FIG. 25 and FIG. 26A-26B illustrated exemplary integrated circuits and associated graphics processors that may be fabricated using one or more IP cores, according to various embodiments described herein. In addition to what is illustrated, other logic and circuits may be included, including additional graphics processors/cores, peripheral interface controllers, or general-purpose processor cores.

FIG. 25 is a block diagram illustrating an exemplary system on a chip integrated circuit 2500 that may be fabricated using one or more IP cores, according to an embodiment. Exemplary integrated circuit 2500 includes one or more application processor(s) 2505 (e.g., CPUs), at least one graphics processor 2510, and may additionally include an image processor 2515 and/or a video processor 2520, any of which may be a modular IP core from the same or multiple different design facilities. Integrated circuit 2500 includes peripheral or bus logic including a USB controller 2525, UART controller 2530, an SPI/SDIO controller 2535, and an I²S/I²C controller 2540. Additionally, the integrated circuit can include a display device 2545 coupled to one or more of a high-definition multimedia interface (HDMI) controller 2550 and a mobile industry processor interface (MIPI) display interface 2555. Storage may be provided by a flash memory subsystem 2560 including flash memory and a flash memory controller. Memory interface may be provided via a memory controller 2565 for access to SDRAM or SRAM memory devices. Some integrated circuits additionally include an embedded security engine 2570.

FIG. 26A-26B are block diagrams illustrating exemplary graphics processors for use within an SoC, according to embodiments described herein. FIG. 26A illustrates an exemplary graphics processor 2610 of a system on a chip integrated circuit that may be fabricated using one or more IP cores, according to an embodiment. FIG. 26B illustrates an additional exemplary graphics processor 2640 of a system on a chip integrated circuit that may be fabricated using one or more IP cores, according to an embodiment. Graphics processor 2610 of FIG. 26A is an example of a low power graphics processor core. Graphics processor 2640 of FIG. 26B is an example of a higher performance graphics processor core. Each of the graphics processors 2610, 2640 can be variants of the graphics processor 2510 of FIG. 25.

As shown in FIG. 26A, graphics processor 2610 includes a vertex processor 2605 and one or more fragment processor(s) 2615A-2615N (e.g., 2615A, 2615B, 2615C, 2615D, through 2615N-1, and 2615N). Graphics processor 2610 can execute different shader programs via separate logic, such that the vertex processor 2605 is optimized to execute operations for vertex shader programs, while the one or more fragment processor(s) 2615A-2615N execute fragment (e.g., pixel) shading operations for fragment or pixel shader programs. The vertex processor 2605 performs the vertex processing stage of the 3D graphics pipeline and generates primitives and vertex data. The fragment processor(s) 2615A-2615N use the primitive and vertex data generated by the vertex processor 2605 to produce a framebuffer that is displayed on a display device. In one embodiment, the fragment processor(s) 2615A-2615N are optimized to execute fragment shader programs as provided for in the OpenGL API, which may be used to perform similar operations as a pixel shader program as provided for in the Direct 3D API.

Graphics processor 2610 additionally includes one or more memory management units (MMUs) 2620A-2620B, cache(s) 2625A-2625B, and circuit interconnect(s) 2630A-2630B. The one or more MMU(s) 2620A-2620B provide for virtual to physical address mapping for the graphics processor 2610, including for the vertex processor 2605 and/or fragment processor(s) 2615A-2615N, which may reference vertex or image/texture data stored in memory, in addition to vertex or image/texture data stored in the one or more cache(s) 2625A-2625B. In one embodiment the one or more MMU(s) 2620A-2620B may be synchronized with other MMUs within the system, including one or more MMUs associated with the one or more application processor(s) 2505, image processor 2515, and/or video processor 2520 of FIG. 25, such that each processor 2505-2520 can participate in a shared or unified virtual memory system. The one or more circuit interconnect(s) 2630A-2630B enable graphics processor 2610 to interface with other IP cores within the SoC, either via an internal bus of the SoC or via a direct connection, according to embodiments.

As shown FIG. 26B, graphics processor 2640 includes the one or more MMU(s) 2620A-2620B, cache(s) 2625A-2625B, and circuit interconnect(s) 2630A-2630B of the graphics processor 2610 of FIG. 26A. Graphics processor 2640 includes one or more shader cores 2655A-2655N (e.g., 2655A, 2655B, 2655C, 2655D, 2655E, 2655F, through 2655N-1, and 2655N), which provides for a unified shader core architecture in which a single core or type or core can execute all types of programmable shader code, including shader program code to implement vertex shaders, fragment shaders, and/or compute shaders. The exact number of shader cores present can vary among embodiments and implementations. Additionally, graphics processor 2640 includes an inter-core task manager 2645, which acts as a thread dispatcher to dispatch execution threads to one or more shader cores 2655A-2655N and a tiling unit 2658 to accelerate tiling operations for tile-based rendering, in which rendering operations for a scene are subdivided in image space, for example to exploit local spatial coherence within a scene or to optimize use of internal caches.

Disaggregation of SoC Architecture

Building larger and larger silicon dies is challenging for a variety of reasons. As silicon dies become larger, manufacturing yields become smaller and process technology requirements for different components may diverge. On the other hand, in order to have a high-performance system, key components should be interconnected by high speed, high bandwidth, low latency interfaces. These contradicting needs pose a challenge to high performance chip development.

Embodiments described herein provide techniques to disaggregate an architecture of a system on a chip integrated circuit into multiple distinct chiplets that can be packaged onto a common chassis. In one embodiment, a graphics processing unit or parallel processor is composed from diverse silicon chiplets that are separately manufactured. A chiplet is an at least partially packaged integrated circuit that includes distinct units of logic that can be assembled with other chiplets into a larger package. A diverse set of chiplets with different IP core logic can be assembled into a single device. Additionally the chiplets can be integrated into a base die or base chiplet using active interposer technology. The concepts described herein enable the interconnection and communication between the different forms of IP within the GPU. The development of IPs on different process may be mixed. This avoids the complexity of converging multiple IPs, especially on a large SoC with several flavors IPs, to the same process.

Enabling the use of multiple process technologies improves the time to market and provides a cost-effective way to create multiple product SKUs. For customers, this means getting products that are more tailored to their requirements in a cost effective and timely manner. Additionally, the disaggregated IPs are more amenable to being power gated independently, components that are not in use on a given workload can be powered off, reducing overall power consumption.

Figure 27:
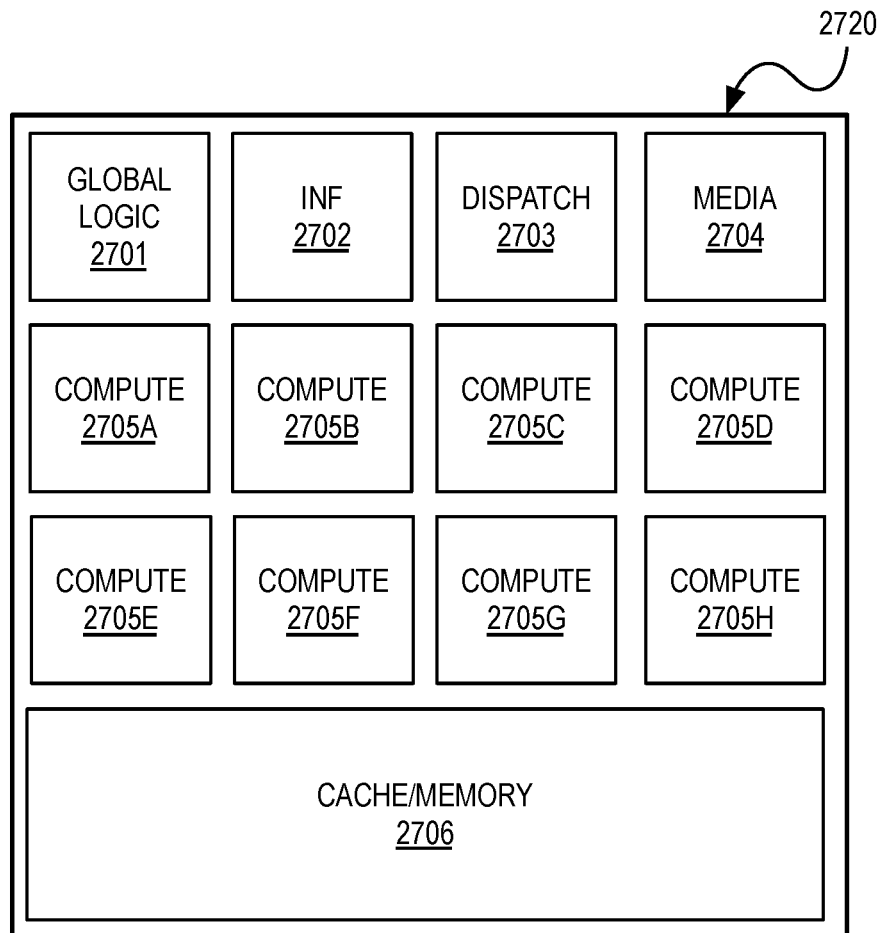
FIG. 27 shows a parallel compute system, according to an embodiment.

FIG. 27 shows a parallel compute system 2700, according to an embodiment. In one embodiment the parallel compute system 2700 includes a parallel processor 2720, which can be a graphics processor or compute accelerator as described herein. The parallel processor 2720 includes a global logic unit 2701, an interface 2702, a thread dispatcher 2703, a media unit 2704, a set of compute units 2705A-2705H, and a cache/memory units 2706. The global logic unit 2701, in one embodiment, includes global functionality for the parallel processor 2720, including device configuration registers, global schedulers, power management logic, and the like. The interface 2702 can include a front-end interface for the parallel processor 2720. The thread dispatcher 2703 can receive workloads from the interface 2702 and dispatch threads for the workload to the compute units 2705A-2705H. If the workload includes any media operations, at least a portion of those operations can be performed by the media unit 2704. The media unit can also offload some operations to the compute units 2705A-2705H. The cache/memory units 2706 can include cache memory (e.g., L3 cache) and local memory (e.g., HBM, GDDR) for the parallel processor 2720.

Figure 28A:
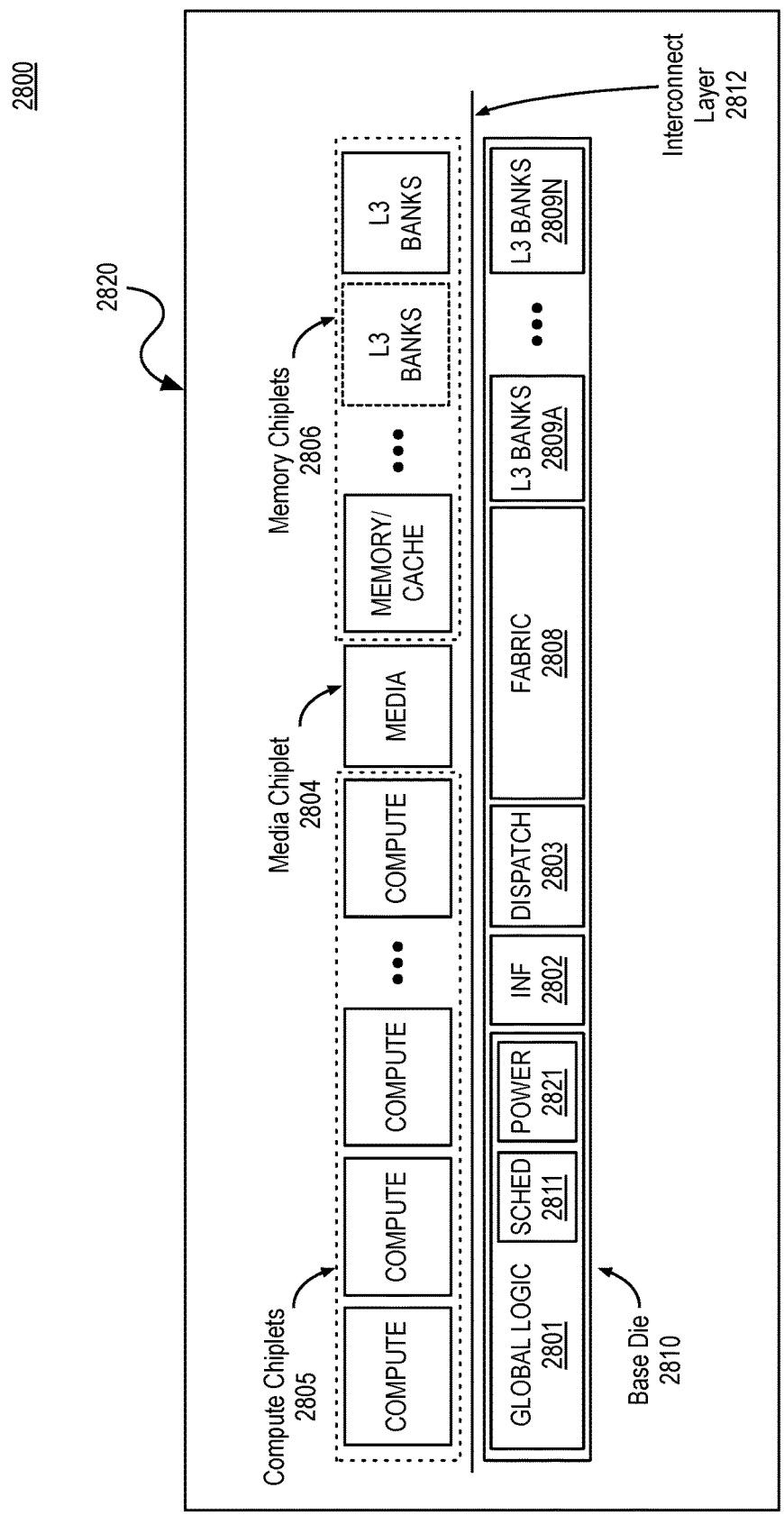
FIG. 28A-28B illustrate a hybrid logical/physical view of a disaggregated parallel processor, according to embodiments described herein.
Figure 28B:
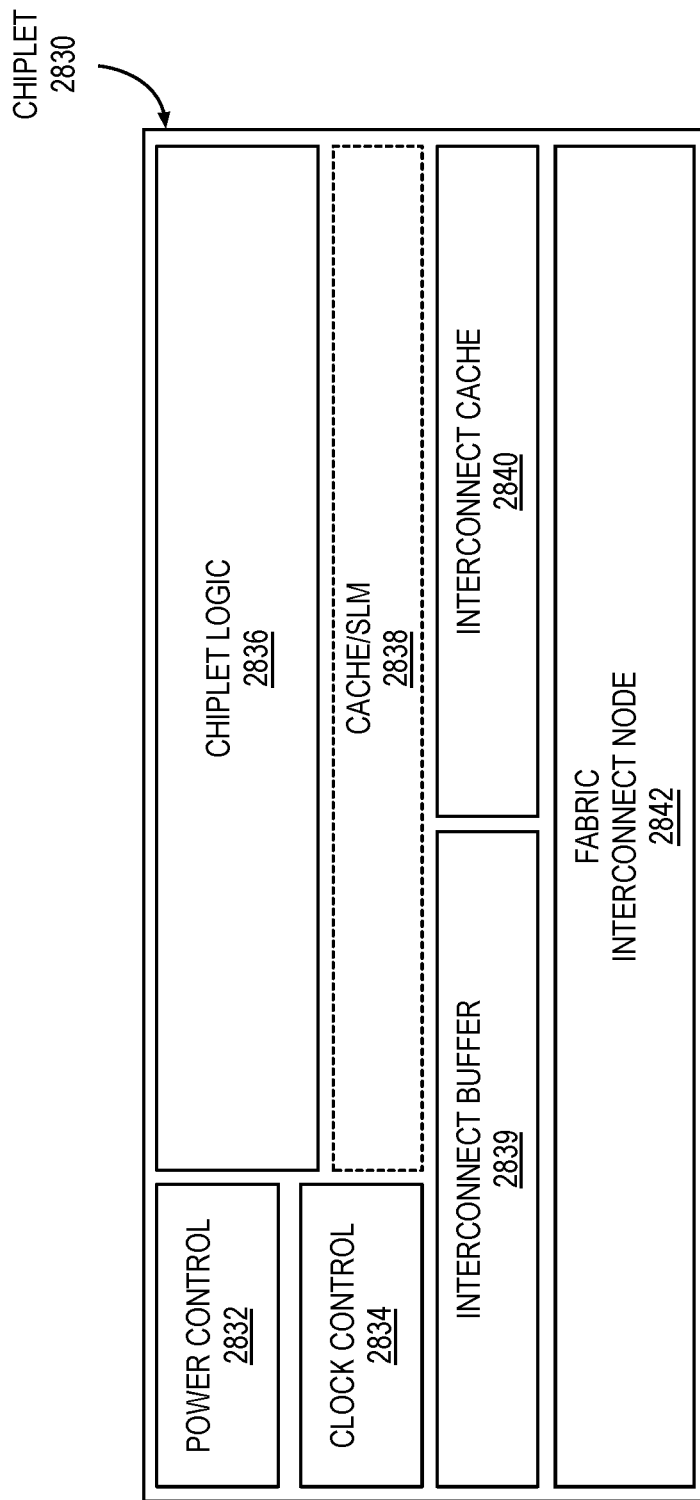

FIG. 28A-28B illustrate a hybrid logical/physical view of a disaggregated parallel processor, according to embodiments described herein. FIG. 28A illustrates a disaggregated parallel compute system 2800. FIG. 28B illustrates a chiplet 2830 of the disaggregated parallel compute system 2800.

As shown in FIG. 28A, a disaggregated compute system 2800 can include a parallel processor 2820 in which the various components of the parallel processor SOC are distributed across multiple chiplets. Each chiplet can be a distinct IP core that is independently designed and configured to communicate with other chiplets via one or more common interfaces. The chiplets include but are not limited to compute chiplets 2805, a media chiplet 2804, and memory chiplets 2806. Each chiplet can be separately manufactured using different process technologies. For example, compute chiplets 2805 may be manufactured using the smallest or most advanced process technology available at the time of fabrication, while memory chiplets 2806 or other chiplets (e.g., I/O, networking, etc.) may be manufactured using a larger or less advanced process technologies.

The various chiplets can be bonded to a base die 2810 and configured to communicate with each other and logic within the base die 2810 via an interconnect layer 2812. In one embodiment, the base die 2810 can include global logic 2801, which can include scheduler 2811 and power management 2821 logic units, an interface 2802, a dispatch unit 2803, and an interconnect fabric 2808 coupled with or integrated with one or more L3 cache banks 2809A-2809N. The interconnect fabric 2808 can be an inter-chiplet fabric that is integrated into the base die 2810. Logic chiplets can use the fabric 2808 to relay messages between the various chiplets. Additionally, L3 cache banks 2809A-2809N in the base die and/or L3 cache banks within the memory chiplets 2806 can cache data read from and transmitted to DRAM chiplets within the memory chiplets 2806 and to system memory of a host.

In one embodiment the global logic 2801 is a microcontroller that can execute firmware to perform scheduler 2811 and power management 2821 functionality for the parallel processor 2820. The microcontroller that executes the global logic can be tailored for the target use case of the parallel processor 2820. The scheduler 2811 can perform global scheduling operations for the parallel processor 2820. The power management 2821 functionality can be used to enable or disable individual chiplets within the parallel processor when those chiplets are not in use.

The various chiplets of the parallel processor 2820 can be designed to perform specific functionality that, in existing designs, would be integrated into a single die. A set of compute chiplets 2805 can include clusters of compute units (e.g., execution units, streaming multiprocessors, etc.) that include programmable logic to execute compute or graphics shader instructions. A media chiplet 2804 can include hardware logic to accelerate media encode and decode operations. Memory chiplets 2806 can include volatile memory (e.g., DRAM) and one or more SRAM cache memory banks (e.g., L3 banks).

As shown in FIG. 28B, each chiplet 2830 can include common components and application specific components. Chiplet logic 2836 within the chiplet 2830 can include the specific components of the chiplet, such as an array of streaming multiprocessors, compute units, or execution units described herein. The chiplet logic 2836 can couple with an optional cache or shared local memory 2838 or can include a cache or shared local memory within the chiplet logic 2836. The chiplet 2830 can include a fabric interconnect node 2842 that receives commands via the inter-chiplet fabric. Commands and data received via the fabric interconnect node 2842 can be stored temporarily within an interconnect buffer 2839. Data transmitted to and received from the fabric interconnect node 2842 can be stored in an interconnect cache 2840. Power control 2832 and clock control 2834 logic can also be included within the chiplet. The power control 2832 and clock control 2834 logic can receive configuration commands via the fabric can configure dynamic voltage and frequency scaling for the chiplet 2830. In one embodiment, each chiplet can have an independent clock domain and power domain and can be clock gated and power gated independently of other chiplets.

At least a portion of the components within the illustrated chiplet 2830 can also be included within logic embedded within the base die 2810 of FIG. 28A. For example, logic within the base die that communicates with the fabric can include a version of the fabric interconnect node 2842. Base die logic that can be independently clock or power gated can include a version of the power control 2832 and/or clock control 2834 logic.

Figure 29A:
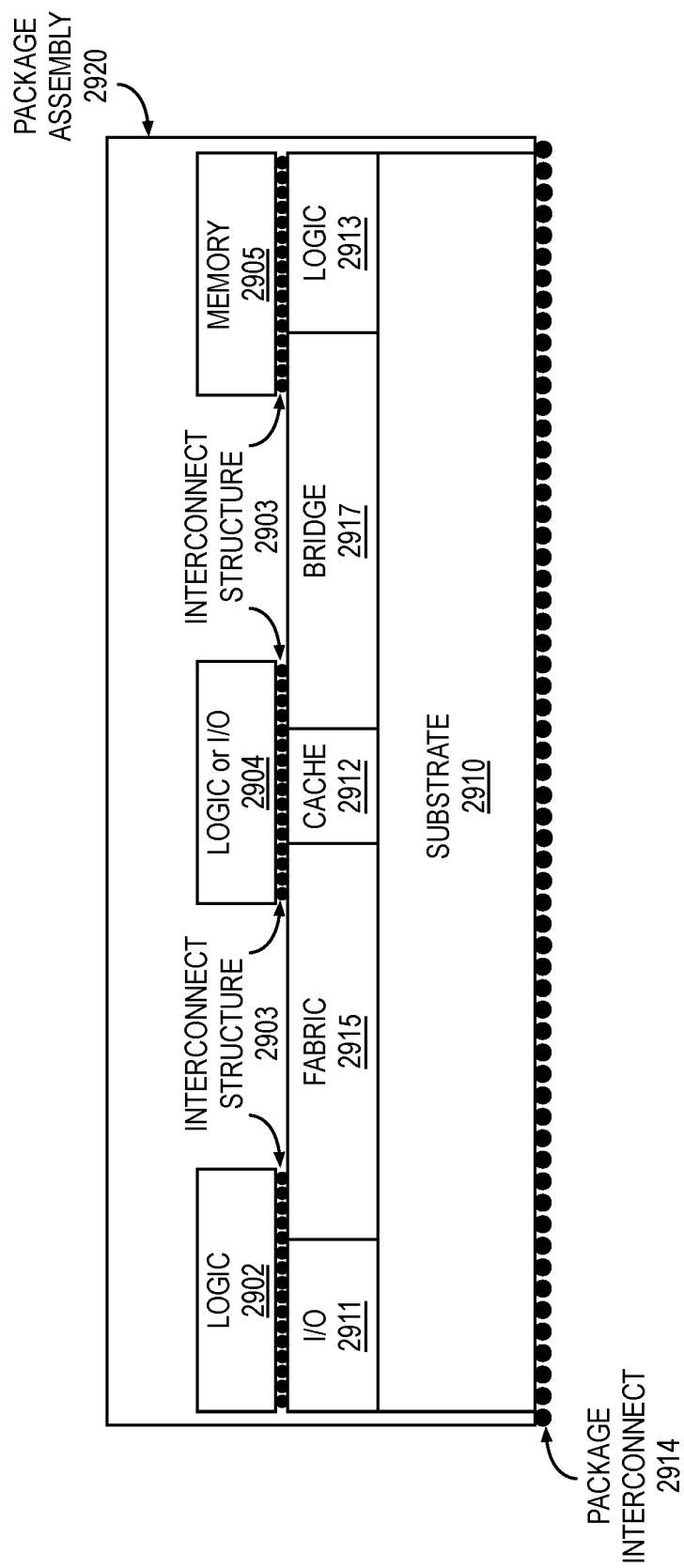
FIG. 29A-29B illustrate a package view of a disaggregated parallel processor, according to embodiments.
Figure 29B:
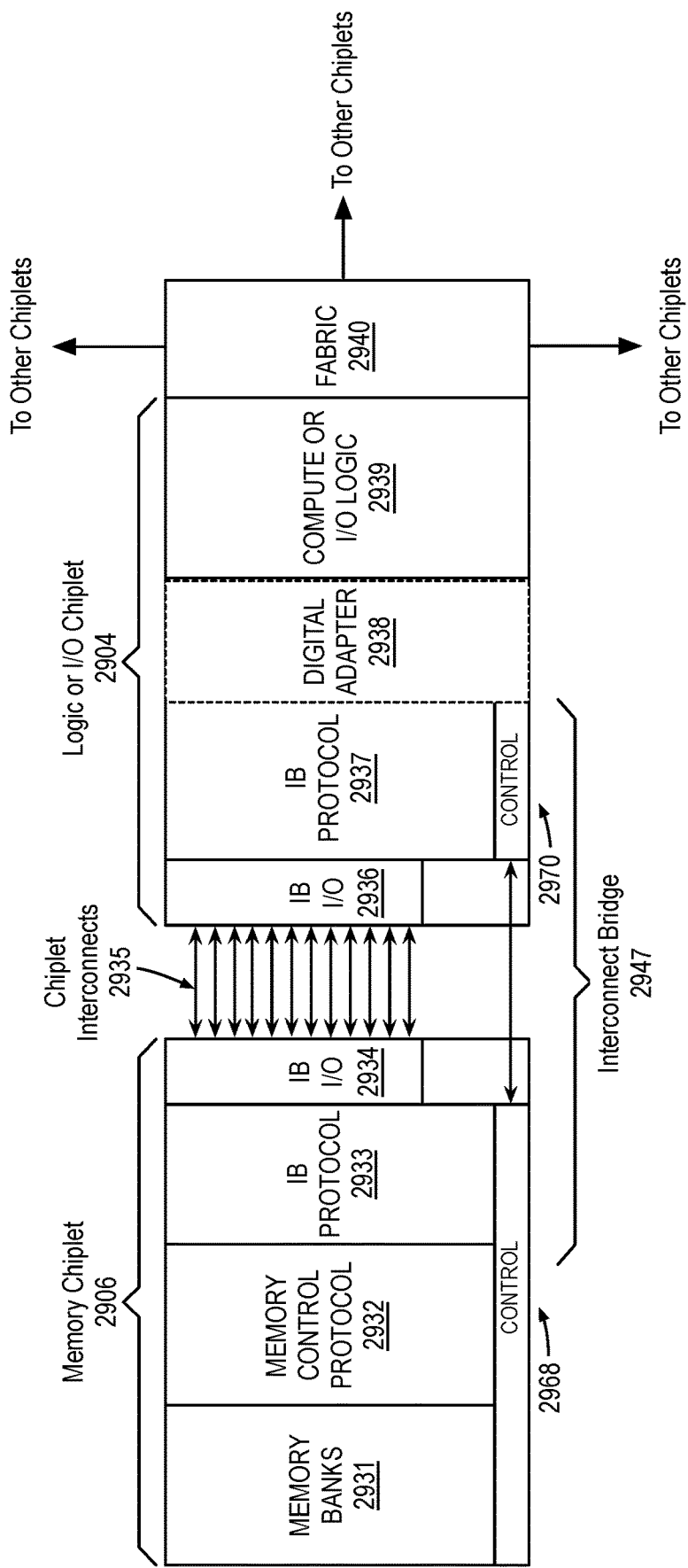

FIG. 29A-29B illustrate a package view of a disaggregated parallel processor, according to embodiments. FIG. 29A illustrates a physical layout of a package assembly 2920. FIG. 29B illustrates an interconnect between multiple chiplets 2904, 2906 and an interconnect fabric 2940.

As shown in FIG. 29A, a package assembly 2920 can include multiple units of hardware logic chiplets connected to a substrate 2910 (e.g., base die). The hardware logic chiplets can include special purpose hardware logic chiplets 2902, logic or I/O chiplets 2904, and/or memory chiplets 2905. The hardware logic chiplets 2902 and logic or I/O chiplets 2904 may be implemented at least partly in configurable logic or fixed-functionality logic hardware and can include one or more portions of any of the processor core(s), graphics processor(s), parallel processors, or other accelerator devices described herein. The memory chiplets 2905 can be DRAM (e.g., GDDR, HBM) memory or cache (SRAM) memory, as described and illustrated herein.

Each chiplet can be fabricated as separate semiconductor die and coupled with the substrate 2910 via an interconnect structure 2903. The interconnect structure 2903 may be configured to route electrical signals between the various chiplets and logic within the substrate 2910. The interconnect structure 2903 can include interconnects such as, but not limited to bumps or pillars. In some embodiments, the interconnect structure 2903 may be configured to route electrical signals such as, for example, input/output (I/O) signals and/or power or ground signals associated with the operation of the logic, I/O and memory chiplets.

In some embodiments, the substrate 2910 is an epoxy-based laminate substrate. The substrate 2910 may include other suitable types of substrates in other embodiments. The package assembly 2920 can be connected to other electrical devices via a package interconnect 2914. The package interconnect 2914 may be coupled to a surface of the substrate 2910 to route electrical signals to other electrical devices, such as a motherboard, other chipset, or multi-chip module.

In some embodiments, a logic or I/O chiplet 2904 and a memory chiplet 2905 can be electrically coupled via a bridge 2917 that is configured to route electrical signals between the logic or I/O chiplet 2904 and a memory chiplet 2905. The bridge 2917 may be a dense interconnect structure that provides a route for electrical signals. The bridge 2917 may include a bridge substrate composed of glass or a suitable semiconductor material. Electrical routing features can be formed on the bridge substrate to provide a chip-to-chip connection between the logic or I/O chiplet 2904 and a memory chiplet 2905. The bridge 2917 may also be referred to as a silicon bridge or an interconnect bridge. For example, the bridge 2917, in some embodiments, is an Embedded Multi-die Interconnect Bridge (EMIB). In some embodiments, the bridge 2917 may simply be a direct connection from one chiplet to another chiplet.

The substrate 2910 can include hardware components for I/O 2911, cache memory 2912, and other hardware logic 2913. A fabric 2915 can be embedded in the substrate 2910 to enable communication between the various logic chiplets and the logic 2911, 2913 within the substrate 2910.

In various embodiments a package assembly 2920 can include fewer or greater number of components and chiplets that are interconnected by a fabric 2915 or one or more bridges 2917. The chiplets within the package assembly 2920 may be arranged in a 3D or 2.5D arrangement. In general, bridge structures 2917 may be used to facilitate a point to point interconnect between, for example, logic or I/O chiplets and memory chiplets. The fabric 2915 can be used to interconnect the various logic and/or I/O chiplets (e.g., chiplets 2902, 2904, 2911, 2913). with other logic and/or I/O chiplets. In one embodiment, the cache memory 2912 within the substrate can act as a global cache for the package assembly 2920, part of a distributed global cache, or as a dedicated cache for the fabric 2915.

As shown in FIG. 29B, a memory chiplet 2906 can connect with a logic or I/O chiplet 2904 via chiplet interconnects 2935 routed though the interconnect bridge 2947. The interconnect bridge 2947 can be a variant of the bridge 2917 embedded in the substrate 2910 of the package assembly 2920 shown in FIG. 29A. The logic or I/O chiplet 2904 can communicate with other chiplets via the interconnect fabric 2940, which is a variant of the fabric 2915 of FIG. 29A.

In one embodiment, the memory chiplet 2906 includes a set of memory banks 2931 that correspond with the memory technology provided by the chiplet. The memory banks 2931 can include any of the types of memory described herein, including but not limited to DRAM, SRAM, or flash, or 3D XPoint memory. A memory control protocol layer 2932 can enable control of the memory banks 2931 and can include logic for one or more memory controllers. An interconnect bridge protocol layer 2933 can relay messages between the memory control protocol layer 2932 and the interconnect bridge I/O layer 2934. Interconnect bridge I/O layer 2934 can communicate with interconnect bridge I/O layer 2936 over the chiplet interconnects 2935. Interconnect bridge I/O layers 2934, 2936 can represent physical layers that transmit signals to or receive signals from a corresponding interconnect point over the chiplet interconnects 2935. The physical I/O layers may include circuitry to drive signals over the chiplet interconnects 2935 and/or receive signals from the chiplet interconnects 2935. An interconnect bridge protocol layer 2937 within the logic or I/O chiplet 2904 can translate signals from interconnect bridge I/O layer 2936 into messages or signals that can be communicated to the compute or I/O logic 2939. In one embodiment a digital adapter layer 2938 can be used to facilitate the translation of signals into messages or signals for use by the compute or I/O logic 2939.

The compute or I/O logic 2939 can communicate with other logic or I/O chiplets via the interconnect fabric 2940. The compute or I/O logic 2939, in one embodiment, includes integrated fabric node logic 2939 that can communicate with the interconnect fabric 2940, such as the fabric interconnect node 2842 of FIG. 28B.

In one embodiment, a control layer 2968 in the memory chiplet 2906 can be in communication with a control layer 2970 in the logic or I/O chiplet. These control layers 2968, 2970 can be used to propagate or transmit certain control signals in an out-of-band manner, for example, to send power and configuration messages between interface bus protocol layer 2937 of the logic or I/O chiplet 2904 and interface bus protocol layer 2933, memory control protocol layer 2932, and/or memory banks 2931 of the memory chiplet 2906.

Figure 30:
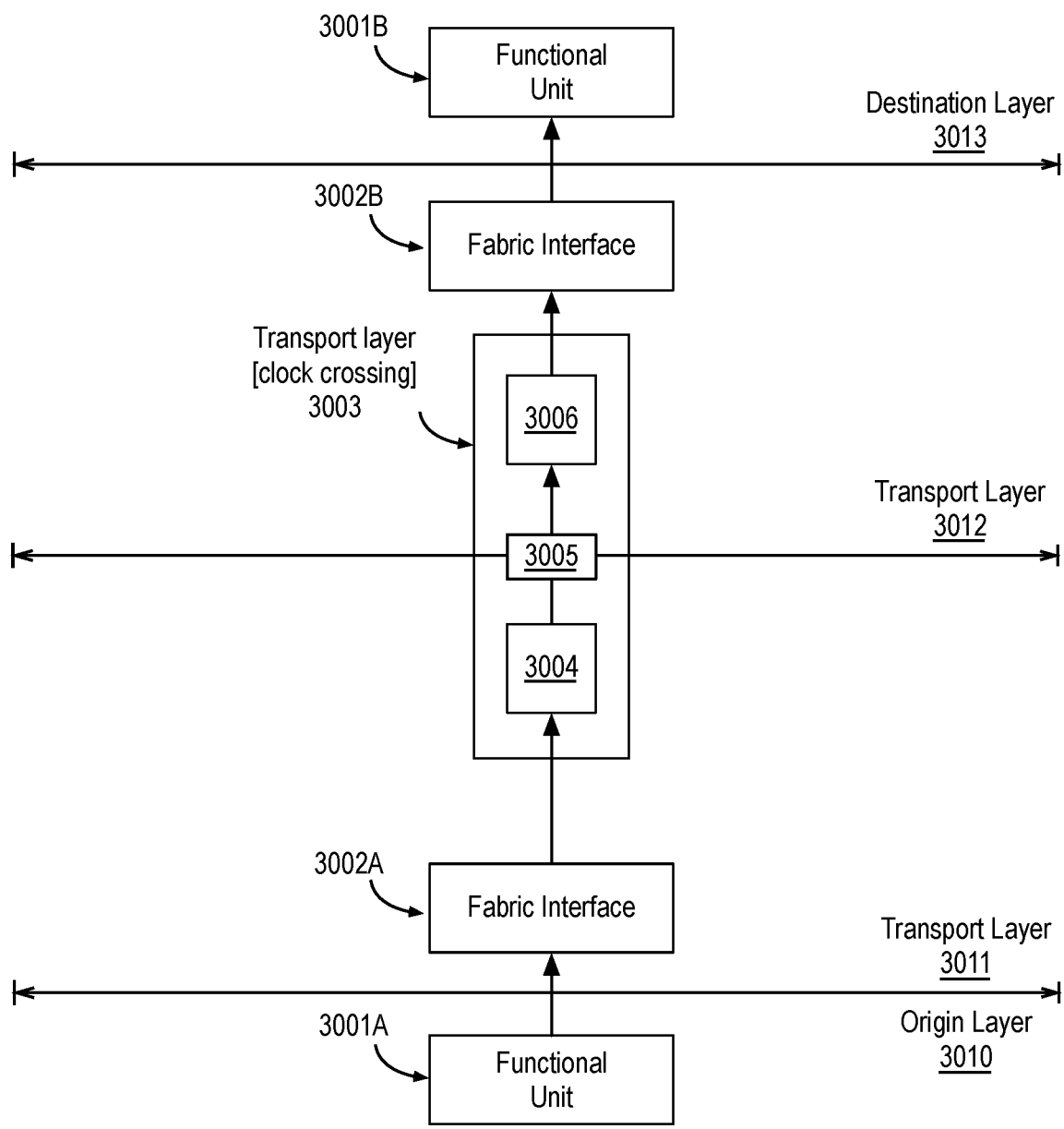
FIG. 30 illustrates a message transportation system for an interconnect fabric, according to an embodiment.

FIG. 30 illustrates a message transportation system 3000 for an interconnect fabric, according to an embodiment. The message transportation system 3000 can be configured to handle traffic at different rates depending on the interface widths available. The specific interface widths can vary on a chiplet-by-chiplet basis and the speed or configuration of the fabric can be adjusted to enable data to be transmitted at a rate that is appropriate for the various functional units to be interconnected. The transport layer can also cross one or more clock domains via the use of clock-domain-crossing FIFOs at a boundaries between clock domains to enable data to be transferred across the clock domains. The transport layer can also be divided into one or more sub-layers, where each sub-layer includes one or more clock domains. While transport layers are described and illustrated, in some embodiments the illustrated operations can be performed at a data-link layer of the interconnect fabric.

In one embodiment a first functional unit 3001A in an origin layer 3010 can communicate via a second functional unit 3001B in a destination layer 3013 via one or more transport layers 3011, 3012. The origin layer 3010 can be logic or I/O within a chiplet or within the substrate of a package assembly, such as the substrate 2910 of package assembly 2920 as in FIG. 29A. The destination layer 3013 can also be logic or I/O within a chiplet or within the substrate. In one embodiment, the origin layer 3010 and/or destination layer 3013 can be associated with cache memory within a chiplet or the substrate/base die.

The one or more transport layers 3011, 3012 can be within separate clock domains. For example, transport layer 3011 can be in a first clock domain while transport layer 3012 can be in a second clock domain. The separate clock domains can operate at different frequencies. Data can be transmitted between the clock domains via a clock crossing module 3003 within the transport layer. In one embodiment a first buffer or high-speed memory module 3004 within the clock crossing module 3003 can buffer data to be relayed via a cross-crossing FIFO 3005 to a second buffer or high-speed memory module 3006. The first buffer/high-speed memory module 3004 can be in the first clock domain while the second buffer/high-speed memory module 3006 can be within the second block domain.

Functional unit 3001A and functional unit 3001B can transmit and receive messages to and from the fabric via respective fabric interfaces 3002A-3002B. The fabric interfaces 3002A-3002B can dynamically configure the width of the connection used within the fabric to relay messages and signals across the transport layers, as shown in FIG. 31-32 below.

Figure 31:
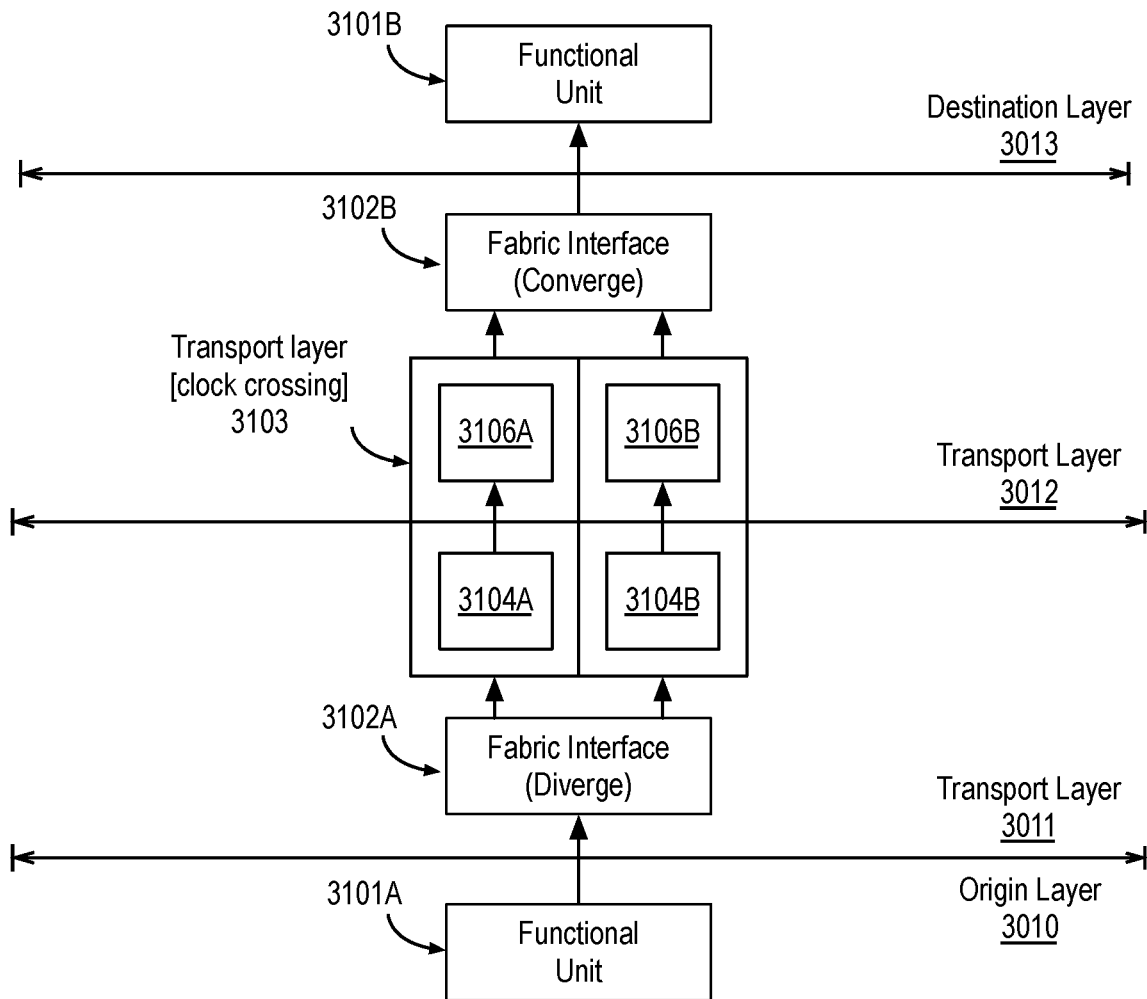
FIG. 31 illustrates transmission of messages or signals between functional units across multiple physical links of the interconnect fabric.
Figure 32:
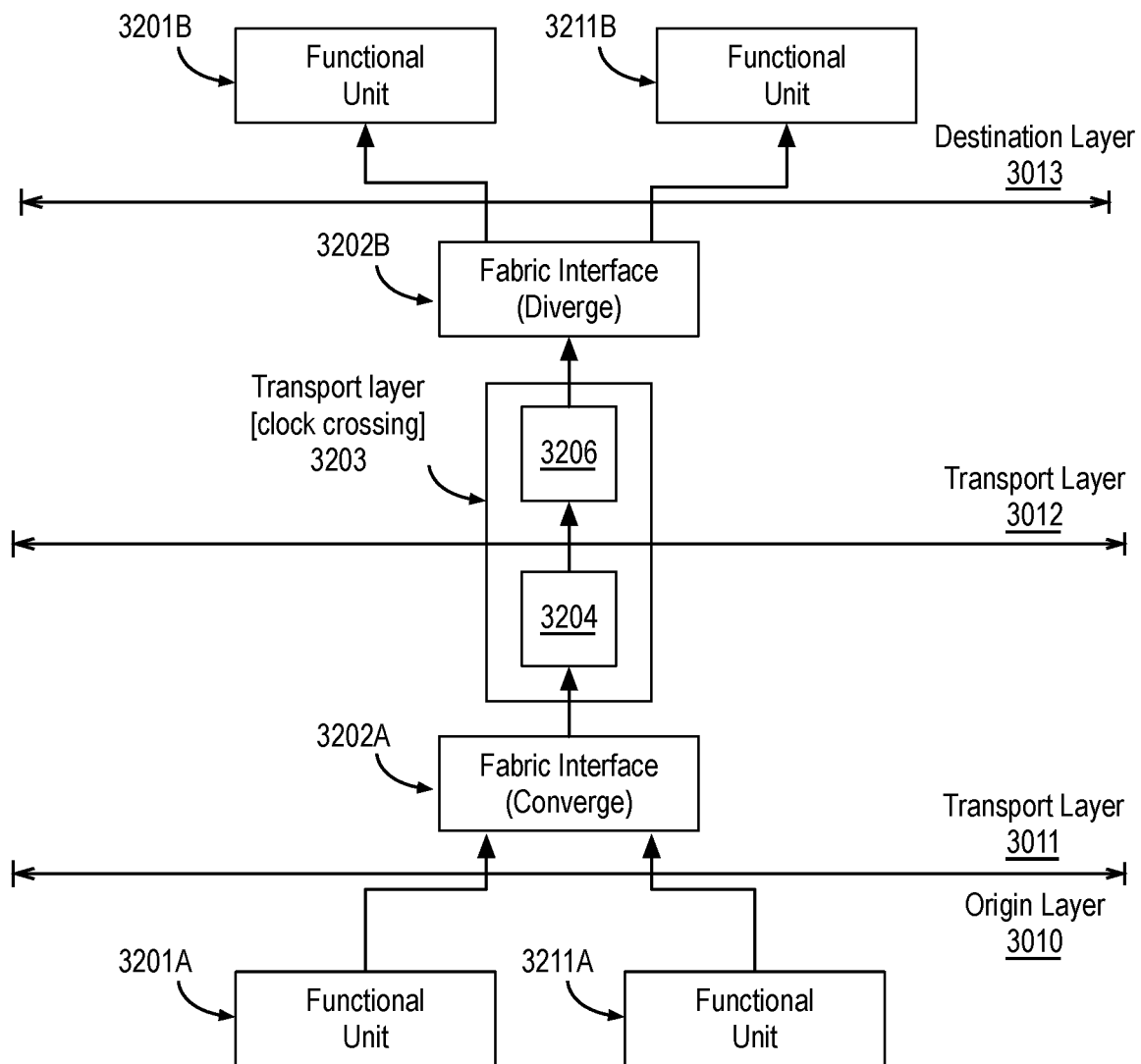
FIG. 32 illustrates transmission of messages or signals for multiple functional units across a single physical link of the interconnect fabric.

FIG. 31 illustrates transmission of messages or signals between functional units across multiple physical links of the interconnect fabric. In one embodiment, where a communication channel between a set of functional units has a bandwidth requirement that exceeds what can be provided via a single physical link, multiple links can be used to facilitate communication between the functional units.

In one embodiment a first functional unit 3101A can send a message or signal to a first fabric interface 3102A. The first fabric interface 3102A can diverge the message or signal and send the message or signal across multiple physical links as a single virtual channel. For example, multiple physical links can be assigned to the same virtual channel and each can carry messages or signals for the virtual channel.

Data can be transmitted between the clock domains via a clock crossing module 3103 within the one or more transport layers transport layers 3011, 3012 that transits messages or signals for the channel across the multiple physical links via multiple buffers or high-speed memories 3104A-3104B, 3106A-3106B (and clock-domain-crossing FIFOs) in a similar manner as shown in FIG. 30. The multiple physical links can be converged at the second fabric interface 3102B before the message or signal is provided to the second functional unit 3101B.

FIG. 32 illustrates transmission of messages or signals for multiple functional units across a single channel of the interconnect fabric. In one embodiment, where a communication channel between a set of functional units has a bandwidth requirement that does not utilize all available bandwidth of a physical link, multiple virtual channels can be transported across the physical link. The virtual channels can be time switched along the physical link a specific set of data lines within the physical link can be allocated to specific functional units.

In one embodiment a first set of functional units 3201A, 3211A can communicate with a second set of functional units 3201B, 3211B over a single physical link of the interconnect fabric. Functional units 3201A-3201B can be associated with a first virtual channel, while functional units 3211A-3211B can be associated with a second virtual channel. The first virtual channel and second virtual channels can be converged at a first fabric interface 3202A. Messages or signals can be relayed across one or more transport layers 3011, 3012. Data can be transmitted between the clock domains via a clock crossing module 3203 within the one or more transport layers transport layers 3011, 3012 via multiple buffers or high-speed memories 3204, 3206 (and clock-domain-crossing FIFOs) in a similar manner as shown in FIG. 30. The multiple virtual channels can be diverged at the second fabric interface 3202B before the message or signal is provided to the second set of functional units 3201B, 3211B.

Figure 33:
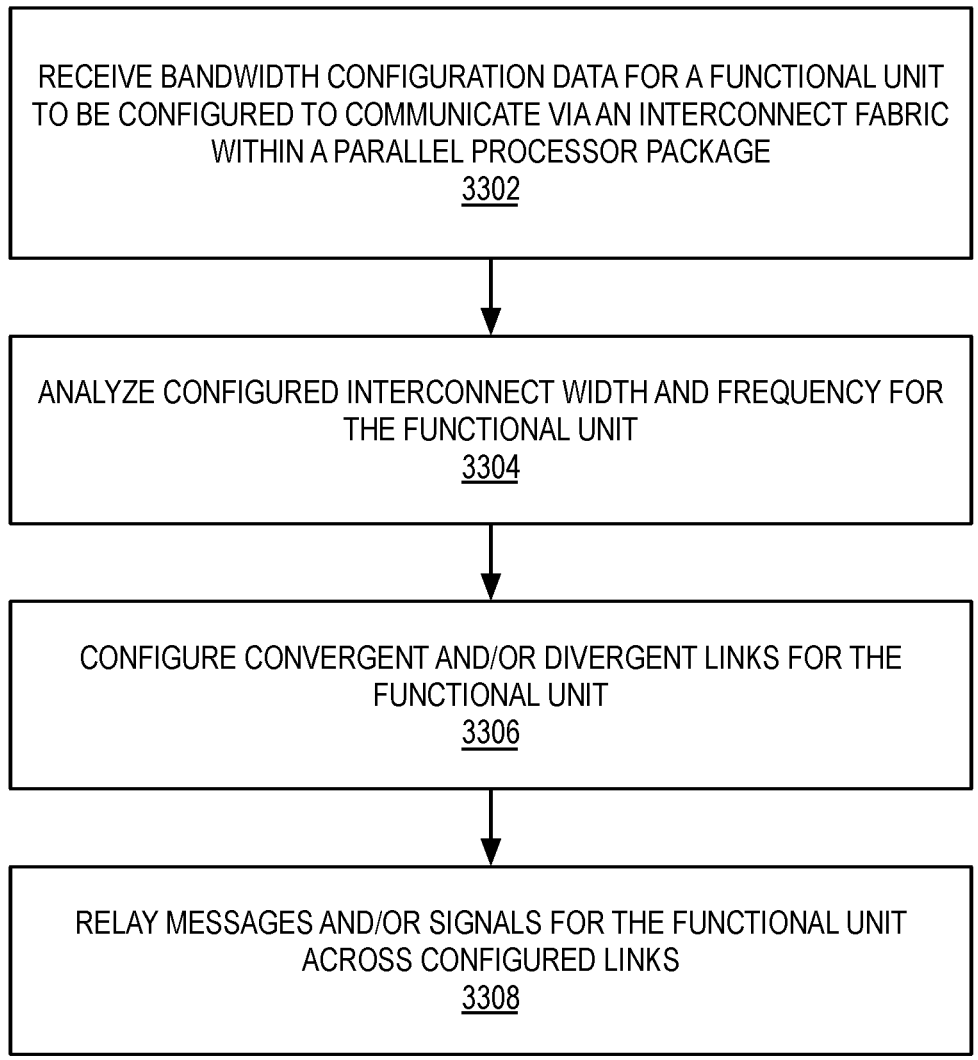
FIG. 33 illustrates a method of configuring a fabric connection for a functional unit within a disaggregated parallel processor.

FIG. 33 illustrates a method 3300 of configuring a fabric connection for a functional unit within a disaggregated parallel processor. The interconnect fabric of the disaggregated parallel processor described herein is configurable to transmit messages and/or signals for a variety of diverse components, which may be IP cores that have different designers and/or manufactures. The specific type of link used by each functional unit within a chiplet or base-die logic component can be configurable. In one embodiment the link is configurable at the fabric interconnect node used by the functional unit.

In one embodiment a fabric interconnect node can receive bandwidth configuration data for a functional unit that is to be configured to communicate via an interconnect fabric within a parallel processor package (block 3302). The configuration data can be provided statically during initial assembly and provisioning for the disaggregated parallel processor of can be configured dynamically during initialization of the disaggregated parallel processor. For dynamic initialization, the fabric interconnect node can receive a bandwidth configuration request from the functional unit that specifies the physical width and frequency of the interconnect between the functional unit and the fabric interconnect node, as well as the bandwidth requirement of the functional unit.

The fabric interconnect node can then analyze configured interconnect width and frequency for the functional unit (block 3304). The fabric interconnect node can then configure convergent and/or divergent links for the functional unit (block 3306). Once configured, the fabric interconnect node can relay messages and/or signals for the functional unit across configured links (block 3308).

Figure 34:
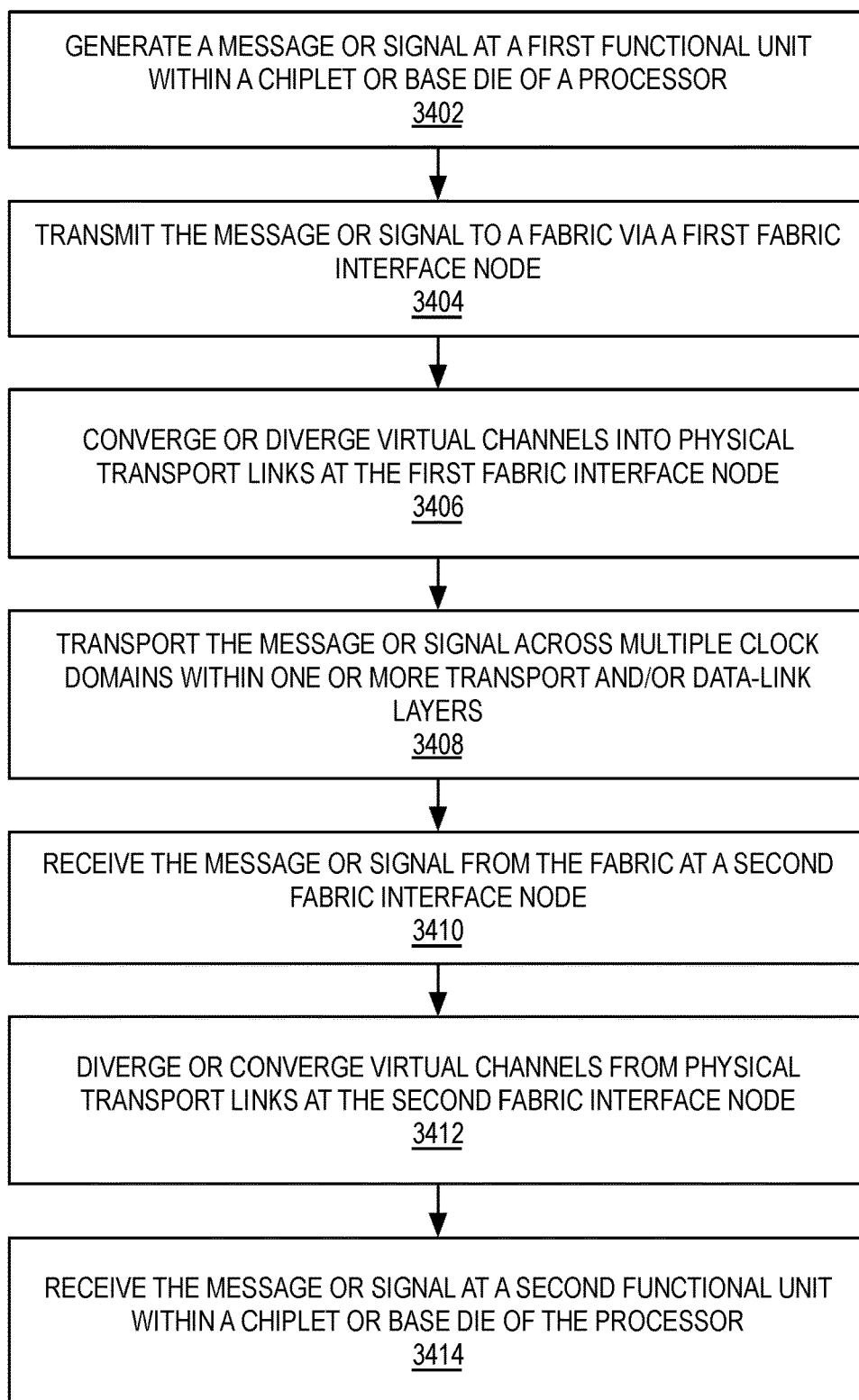
FIG. 34 illustrates a method of relaying messages and/or signals across an interconnect fabric within a disaggregated parallel processor.

FIG. 34 illustrates a method 3400 of relaying messages and/or signals across an interconnect fabric within a disaggregated parallel processor. The interconnect fabric of the disaggregated parallel processor described herein can relay messages and/or signals across one or more layers of the disaggregated parallel processor, while crossing multiple clock domains.

In one embodiment a first functional unit within a chiplet or base die of a processor can generate data in the form of a message or signal to be transmitted (block 3402). The first functional unit can transmit the message or signal to the interconnect fabric via a first fabric interface node (block 3404). The fabric interface node can converge or diverge virtual channels into physical transport links (block 3406), as shown in FIG. 31 and FIG. 32. The message or signal to be transmitted can be associated with a virtual channel and transmitted via the associated virtual channel. How the fabric interconnect performs forwarding and/or switching operations for the message or signal can be influenced by the virtual channel assigned to the message or signal. Additionally, multiple virtual channels can be combined into a single physical link or a virtual channel can be carried by multiple physical links.

In one embodiment the interconnect fabric can transport the message or signal across multiple clock domains within one or more transport and/or data-link layers (block 3408). One or more clock crossing modules including high-speed memory and domain crossing FIFOs can be used to cross the multiple clock domains. In one embodiment, each chiplet can have a separate clock domain relative to the interconnect fabric. The interconnect fabric can also have multiple clock domains. Transmitting the message or signal across the multiple clock domains can include switching the message or signal using switching logic within the interconnect fabric.

A second fabric interface node can receive the message or signal (block 3410). The second fabric interface node can then diverge or converge virtual channels from physical transport links at the second fabric interface node (block 3412). Multiple virtual channels can be diverged from a single physical link or a virtual channel can be converged from multiple physical links. A second functional unit within a chiplet or base die of the processor can then receive data in the form of the message or signal at second hardware logic (block 3414). The second functional unit can then perform an operation based on the received data.

Figure 35:
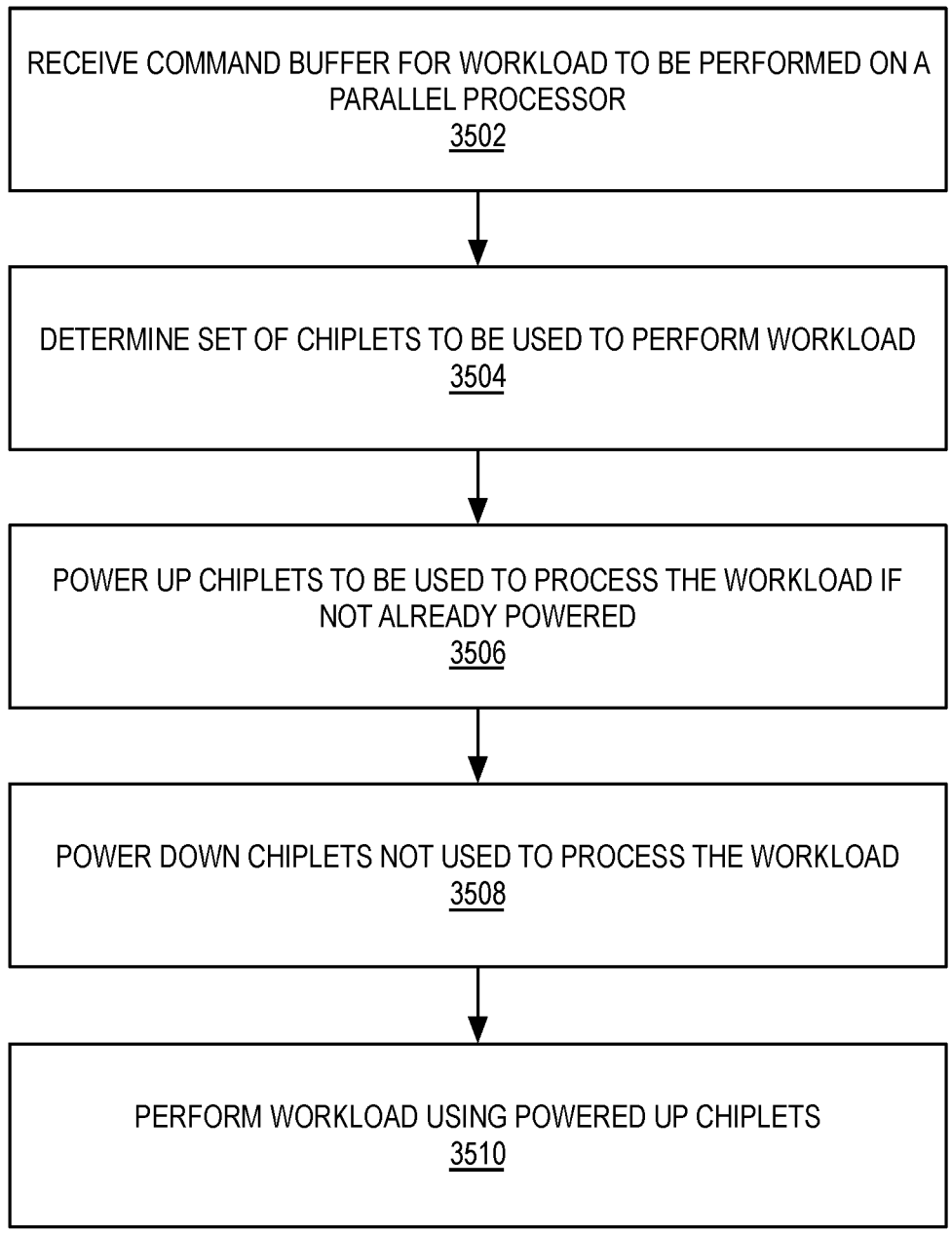
FIG. 35 illustrates a method of power gating chiplets on a per-workload basis.

FIG. 35 illustrates a method 3500 of power gating chiplets on a per-workload basis. In one embodiment, power control logic within a disaggregated parallel processor can determine which chiplets or logic units should be powered while executing a workload based on the requirements for the workload. In one embodiment the power control logic can work in concert with other global logic, such as a global scheduler or front-end interface, to determine which components will be used to process a workload.

The method 3500 includes to receive command buffer for workload to be performed on a parallel processor (block 3502). The command buffer can be received, for example, at a global scheduler or front-end interface. The method 3500 additionally includes to determine a set of chiplets to be used to perform workload (block 3504). This determination can be performed by determining the global set and/or types of functional units that will be used to execute the commands within the command buffer.

The method 3500 additionally includes to determine whether any functional chiplets to be used to process the workload reside on chiplets that are power gated and to power up chiplets to be used if those chiplets not already powered (block 3506). Additionally, functional units that will not be used to process the workload can be determined. If all functional units within a chiplet will not be used to process the workload, power control logic can power down (e.g., power-gate) chiplets not used to process the workload (block 3508). To power up and power down chiplets the global power control logic can signal local power control logic within the chiplet. The local power control logic within the chiplet can then perform the appropriate power down sequence for the chiplet. The disaggregated parallel processor can then perform the workload using the powered up (e.g., active) chiplets (block 3510).

Enabling Product SKUs Based on Chiplet Configuration

Semiconductor dies are be tested during manufacturing to evaluate the integrated circuits formed on the dies. Standard tests for gross functionality can be performed by probe testing the die at the wafer. Burn-in testing can be performed after the dies have been divided and packaged, or using a test harness for the bare die. Defective dies may be discarded. However, dies that pass initial testing but fail subsequent test at maximum frequency may operate correctly at a lower frequency. This binning-out process can select dies that under or over-perform and target those dies for higher or lower performance products with differing stock keeping units (SKUs). For monolithic system on a chip integrated circuits, the bin-out process is a coarse-grained process. While a processor with a few defective compute or graphics cores may be down-binned, a minimum number of non-defective components must be present to meet minimum product requirements.

With a disaggregated. SoC architecture described herein, individual chiplets can be tested and binned at the chiplet level and SKU level can be determined for a product during assembly based on demand for a given product SKU. During assembly, different product SKUs with different configurations can be assembled with different amounts of memory, different functionality, and different performance, by specifying specific chiplets or different bins of the same chiplet design.

A disaggregated processor package can be configured to accept interchangeable chiplets. Interchangeability is enabled by specifying a standard physical interconnect for chiplets that can enable the chiplet to interface with a fabric or bridge interconnect. Chiplets from different IP designers can conform to the common interconnect, enabling such chiplets to be interchangeable during assembly. The fabric and bridge interconnects logic on the chiplet can then be configured to confirm with the actual interconnect layout of the on-board logic of the chiplet. Additionally, data from chiplets can be transmitted across an inter-chiplet fabric using encapsulation, such that the actual data being transferred is opaque to the fabric, further enable interchangeability of the individual chiplets. With such an interchangeable design, higher or lower density memory can be inserted into memory chiplet slots, while compute or graphics chiplets with a higher or lower core count can be inserted into logic chiplet slots.

Functionality can also be determined during assembly. For example, media chiplets can be added or excluded based on product specification and demand. In some products, on-package networking or other communication chiplets can be added. In some products, different types of host connections can be enabled using different chiplets. For example, where a host interconnect version change involves a change to interconnect logic, without a change in physical form factor, an upgrade to the new interconnect version may be performed by changing host interconnect chiplets during assembly, without requiring a re-design of the SoC to insert new interconnect logic into a monolithic die.

Chiplet binning can be further enabled by the provision of a chiplet testing harness that conforms the standardized chassis interfaces. This chiplet testing harness can enable rapid testing and binning of chiplets for different SKUs.

Figure 36:
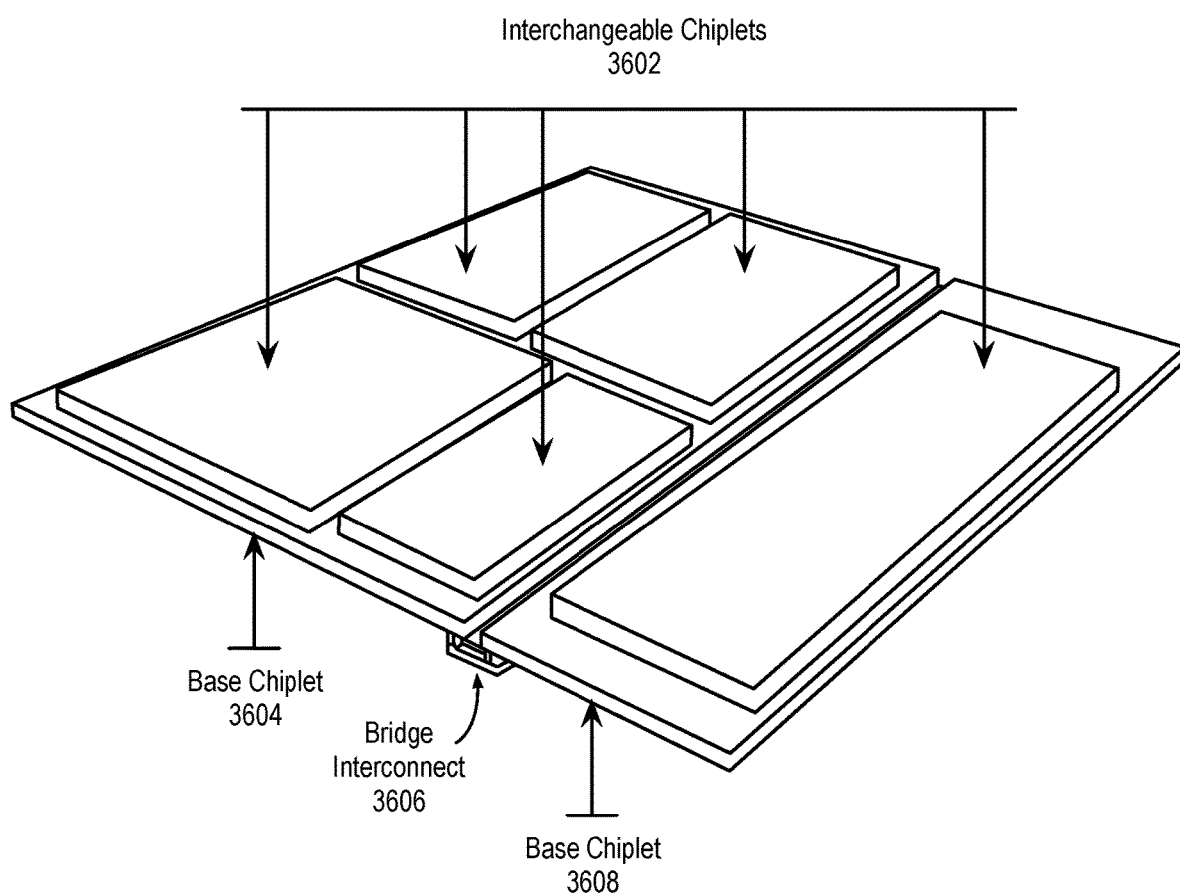
FIG. 36 illustrates a parallel processor assembly including interchangeable chiplets.

FIG. 36 illustrates a parallel processor assembly 3600 including interchangeable chiplets 3602. The interchangeable chiplets 3602 can be assembled into standardized slots on one or more base chiplets 3604, 3608. The base chiplets 3604, 3608 can be coupled via a bridge interconnect 3606, which can be similar to the other bridge interconnects described herein. Memory chiplets can be connected to logic or I/O chiplets via a bridge interconnect. I/O and logic chiplets can communicate via an interconnect fabric. The base chiplets can each support one or more slots in a standardized format for one of logic or I/O or memory/cache. Different memory densities can be assembled into a chiplet slot based on the target SKU of the product. Additionally, logic chiplets with a different number of type of functional units can be selected at time of assembly based on the target SKU of the product. Additionally, chiplets containing IP logic cores of differing types can be inserted into the interchangeable chiplet slots.

Figure 37:
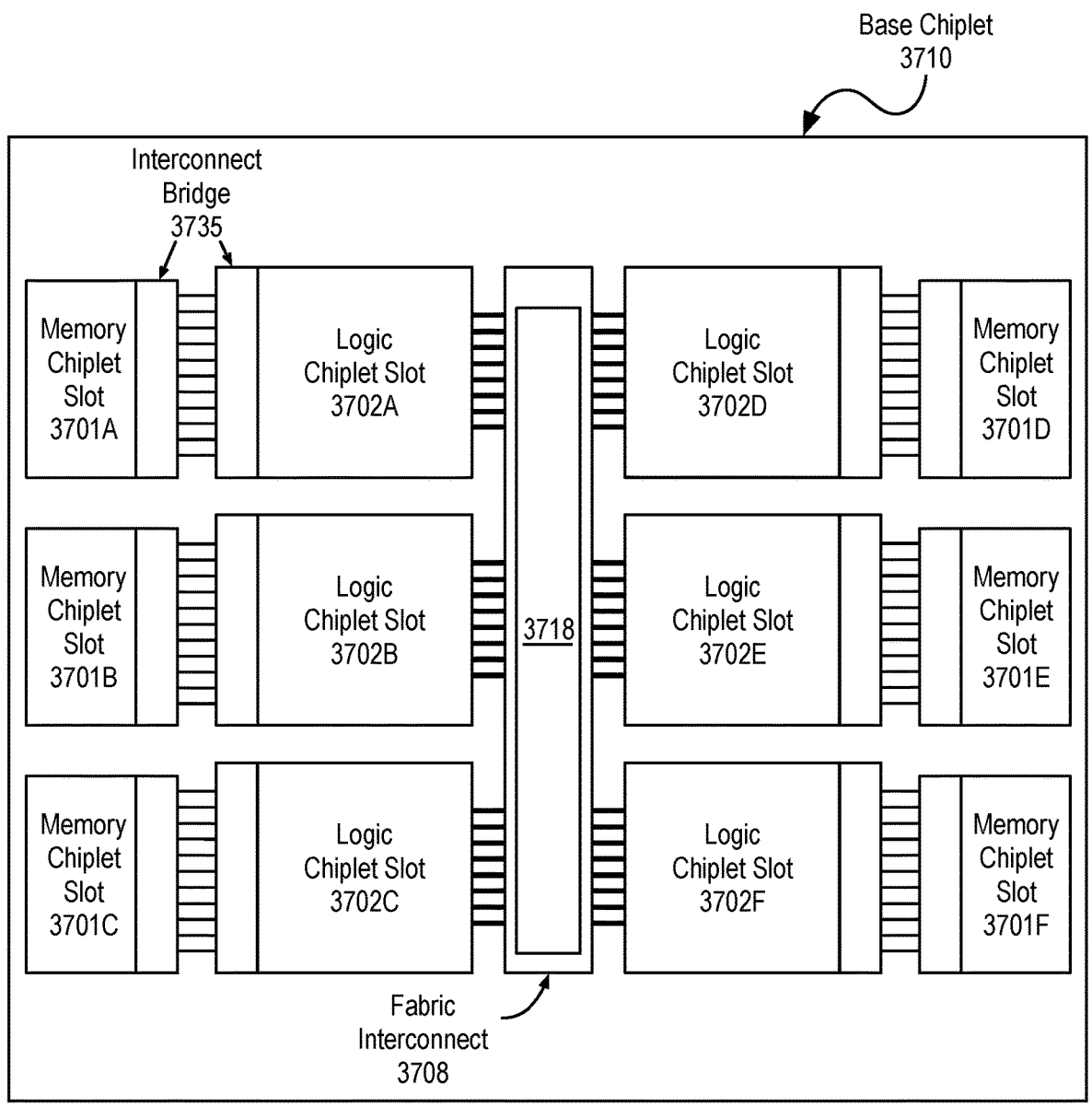
FIG. 37 illustrates an interchangeable chiplet system, according to an embodiment.

FIG. 37 illustrates an interchangeable chiplet system 3700, according to an embodiment. In one embodiment the interchangeable chiplet system 3700 includes at least one base chiplet 3710 including multiple memory chiplet slots 3701A-3701F and multiple logic chiplet slots 3702A-3702F. A logic chiplet slot (e.g., 3702A) and a memory chiplet slot (e.g., 3701A) can be connected by an interconnect bridge 3735, Which can be similar to other interconnect bridges described herein. Logic chiplet slots 3702A-3702F can be interconnected via a fabric interconnect 3708. The fabric interconnect 3708 includes switching logic 3718 that can be configured to enable the relay of data packets between logic chiplets slots in a manner that is agnostic to the data by encapsulating the data into a fabric packet. The fabric packet can then be switched to the destination slot within the fabric interconnect 3708.

The fabric interconnect 3708 can include one or more physical data channels. One or more programmable virtual channels can be carried by each physical channel. The virtual channels may be arbitrated independently, with channel access negotiated separately per virtual channel. Traffic over the virtual channels may be classified into one or more traffic classes. In one embodiment, a prioritization system allows virtual channels and traffic classes to be assigned a relative priority for arbitration. In one embodiment, traffic balancing algorithms operate to maintain substantially equal bandwidth and throughput to each node coupled to the fabric. In one embodiment, the fabric interconnect logic operates at a higher clock rate than the nodes couples to the fabric, allowing reduction in interconnect width while maintaining the bandwidth requirements between nodes. Where certain nodes require higher bandwidth, multiple physical links can be combined to carry a single virtual channel, as in FIG. 31 above. In one embodiment, each physical link is separately clock gated when idle. An early indication upcoming activity can be used as a trigger to wake the physical link before data is to be transmitted.

Figure 38:
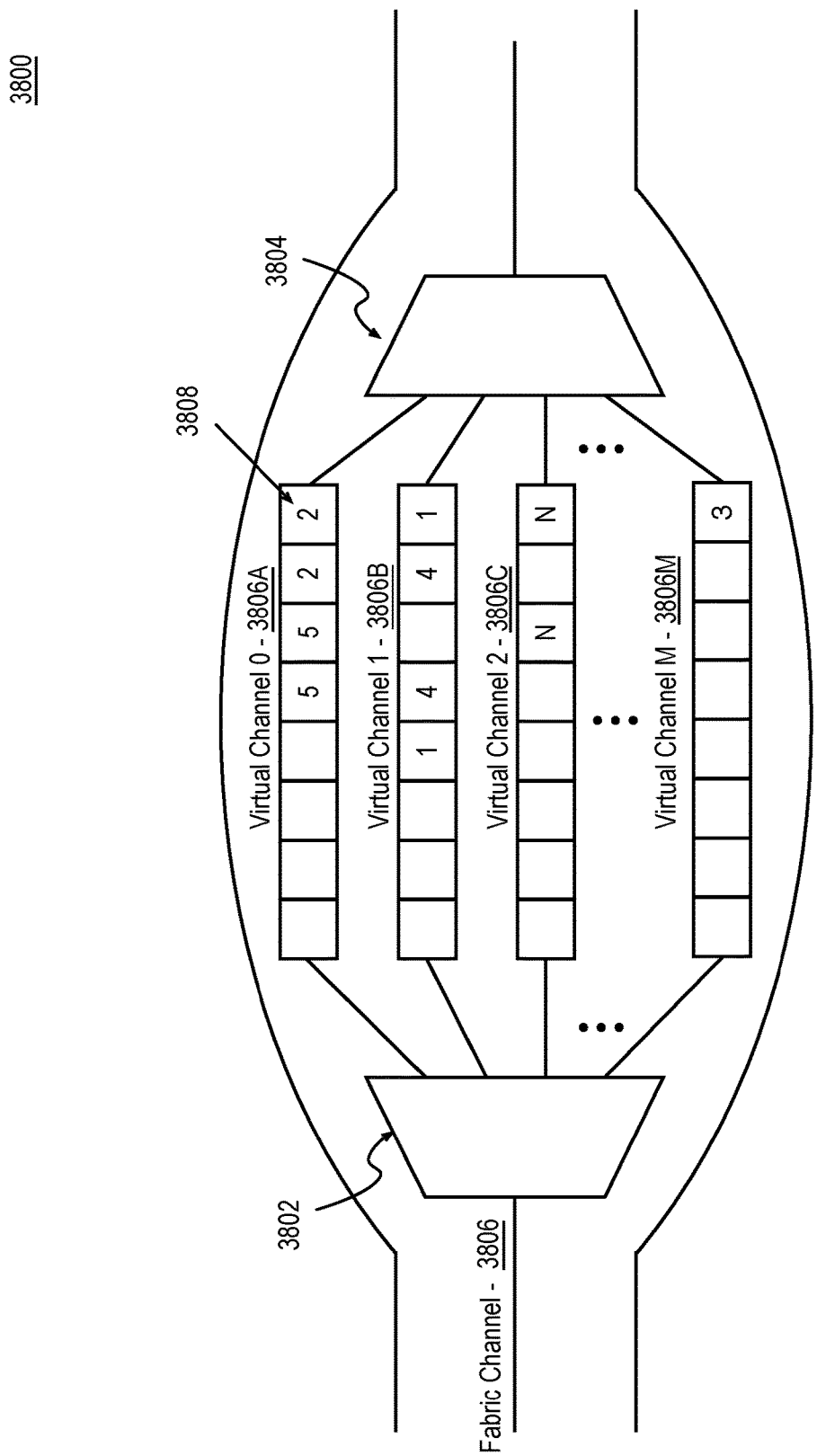
FIG. 38 is an illustration of multiple traffic classes carried over virtual channels, according to an embodiment.

FIG. 38 is an illustration of multiple traffic classes carried over virtual channels, according to an embodiment. A first fabric connector 3802 and second fabric connector 3804 facilitate communication over a fabric channel 3806 having up to 'M' virtual channels 3806A-3806M. The virtual channels enable the transfer of variable length information over a fixed set of physical channels. The virtual channels may be permanent virtual channels, or the virtual channels may be dynamically enabled or disabled based on the system configuration. Using permanent virtual channels allows fixed channel IDs, which to minimizes the overhead of virtual channel management. Dynamically configuring channels increases design flexibility at the expense of additional channel management overhead.

Each virtual channel may be assigned multiple traffic classes. A traffic class is a division of traffic that is related for arbitration. Each virtual channel may carry up to 'N' traffic classes. Each class of traffic is assigned to a specific virtual channel through programming (fuses, configuration registers etc.). Up to classes of traffic types may be assigned to a given virtual channel.

TABLE 5

Traffic Class Assignment

| # | Traffic Class | Virtual Channel |
|---|---|---|
| 1 | Class 1 | 1 |
| 2 | Class 2 | 0 |
| 3 | Class 3 | M |
| 4 | Class 4 | 1 |
| 5 | Class 5 | 0 |
| ... | | |
| N | Class N | 2 |

Table 5 above shows an exemplary traffic class to virtual channel assignment as illustrated in FIG. 38. The fabric interconnect classifies each unit of incoming traffic and may include logic to ensure that the incoming unit travels within its assigned virtual channel. In one embodiment, data transmission over the channels occurs in first-in-first-out (FIFO) order, and channel arbitration occurs based on virtual channels. Traffic within a virtual channel may block the transmission of additional traffic on the same virtual channel. However, a given virtual channel will not block a different virtual channel. Accordingly, traffic on different virtual channels is arbitrated independently.

Coherency is maintained during data transmission between fabric interconnect nodes. In one embodiment, data for an originating thread on a GPGPU or parallel processor is routed within the same traffic class and the traffic classes are assigned to a specific virtual channel. Data within a single traffic class on a single virtual channel is transmitted in FIFO order. Thus, data from a single thread is strictly ordered when transmitted via the fabric and per-thread coherency is maintained to avoid read-after-write or write-after-read data hazards. In one embodiment, thread group coherency is maintained via a global synchronization mechanism between resource nodes.

TABLE 6

Traffic Class Prioritization

| # | Traffic Class | Priority |
|---|---|---|
| 1 | Class 1 | 2 |
| 2 | Class 2 | 1 |
| 3 | Class 3 | 4 |
| 4 | Class 4 | 2 |
| 5 | Class 5 | 1 |
| ... | | |
| N | Class N | 3 |

Table 6 above shows an exemplary traffic class prioritization. A priority algorithm may be programmed to determine the priority to assign to each of the traffic classes. The programmable traffic class priorities allow the traffic classes to be used as an arbitrary traffic grouping mechanism, where traffic may be grouped within a class merely to maintain coherency, or specific traffic can be assigned a high priority and dedicated to high priority data. For example, class 1 and class 4, each assigned to virtual channel one 3806B, may be assigned a priority of 2. Class 2 and class 5, each assigned to virtual channel 0 3806A, may be assigned a priority of 1. A traffic class 'N' may be assigned to virtual channel two 3806C with a priority of 3. Traffic in class 2 may be latency sensitive data that should be transmitted as soon as possible or should not be blocked by other traffic classes, while traffic in class 1 may be moderately latency sensitive traffic from a single thread that is grouped to maintain coherency.

A traffic class may be assigned a priority relative to all traffic classes or relative to the priority of traffic classes on the same virtual channel. In one embodiment, the priority scheme is designed by assigning weights to the traffic classes, where a higher weight indicates a higher priority. A fair prioritization algorithm may be employed, where each participant is guaranteed a minimum amount of bandwidth to prevent starvation. In one embodiment, an absolute priority algorithm is used under certain circumstances, where higher priority traffic always blocks lower priority.

Where absolute priority is in use, additional algorithms are in place to prevent a communication deadlock. The use of virtual channels and traffic classes in combination reduces the likelihood of a deadlock, as a single traffic class having absolute priority on a given virtual channel does not block traffic on a different virtual channel. In one embodiment, if a starvation condition or a potential deadlock is detected on one virtual channel, blocked traffic classes may be re-assigned to a different virtual channel.

TABLE 7

Virtual Channel Prioritization

| # | Virtual Channel | Priority |
|---|---|---|
| 1 | 1 | 2 |
| 2 | 2 | 1 |
| 3 | 3 | 3 |
| ... | | |
| M | M | 4 |

Table 7 above shows an exemplary virtual channel prioritization. As with traffic classes, each virtual channel may also receive a priority and channel arbitration can factor the relative priorities of the virtual channels. For example, data traffic on virtual channel 2 may have a higher relative priority than data on other virtual channels. A weighted priority system may be employed with virtual channel prioritization, where a higher weight indicates a higher priority. A fair priority system or an absolute priority system may be used.

Figure 39:
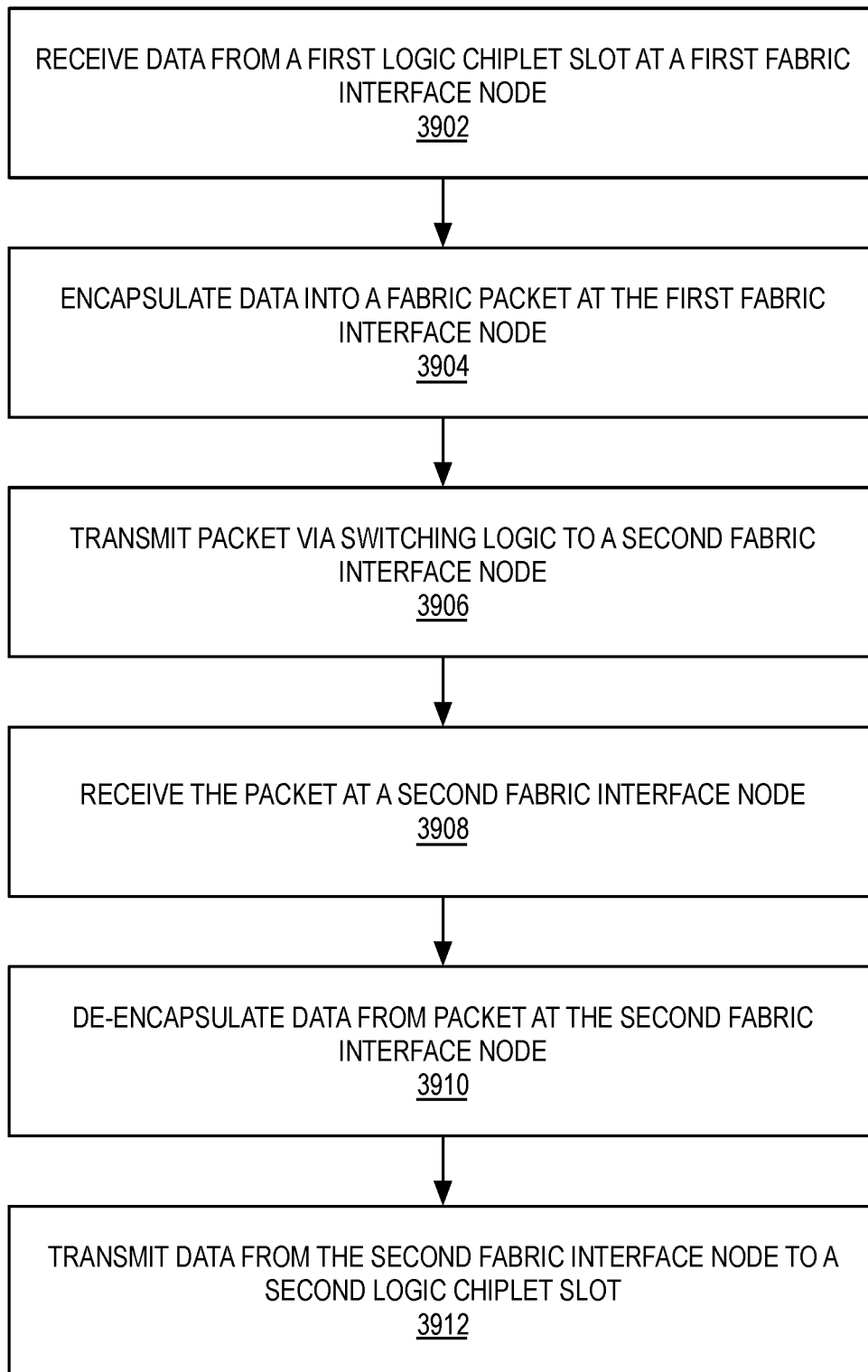
FIG. 39 illustrates a method of agnostic data transmitting between slots for interchangeable chiplets, according to an embodiment.

FIG. 39 illustrates a method 3900 of agnostic data transmitting between slots for interchangeable chiplets, according to an embodiment. Method 3900 can be performed by hardware logic within a fabric interconnect and fabric interconnect nodes as described herein. In one embodiment, method 3900 incudes for a first fabric interface node to receive data from a first chiplet logic slot (block 3902). The first fabric interface node can encapsulate data into a fabric packet (block 3904). The first fabric interface node can then transmit the packet via switching logic within the fabric interconnect to a second fabric interface node. The second fabric interface node can receive the packet (block 3908) and de-encapsulate data from packet (block 3910). The second fabric interface node can then transmit data de-encapsulated from the packet to a second chiplet logic slot (block 3912).

Figure 40:
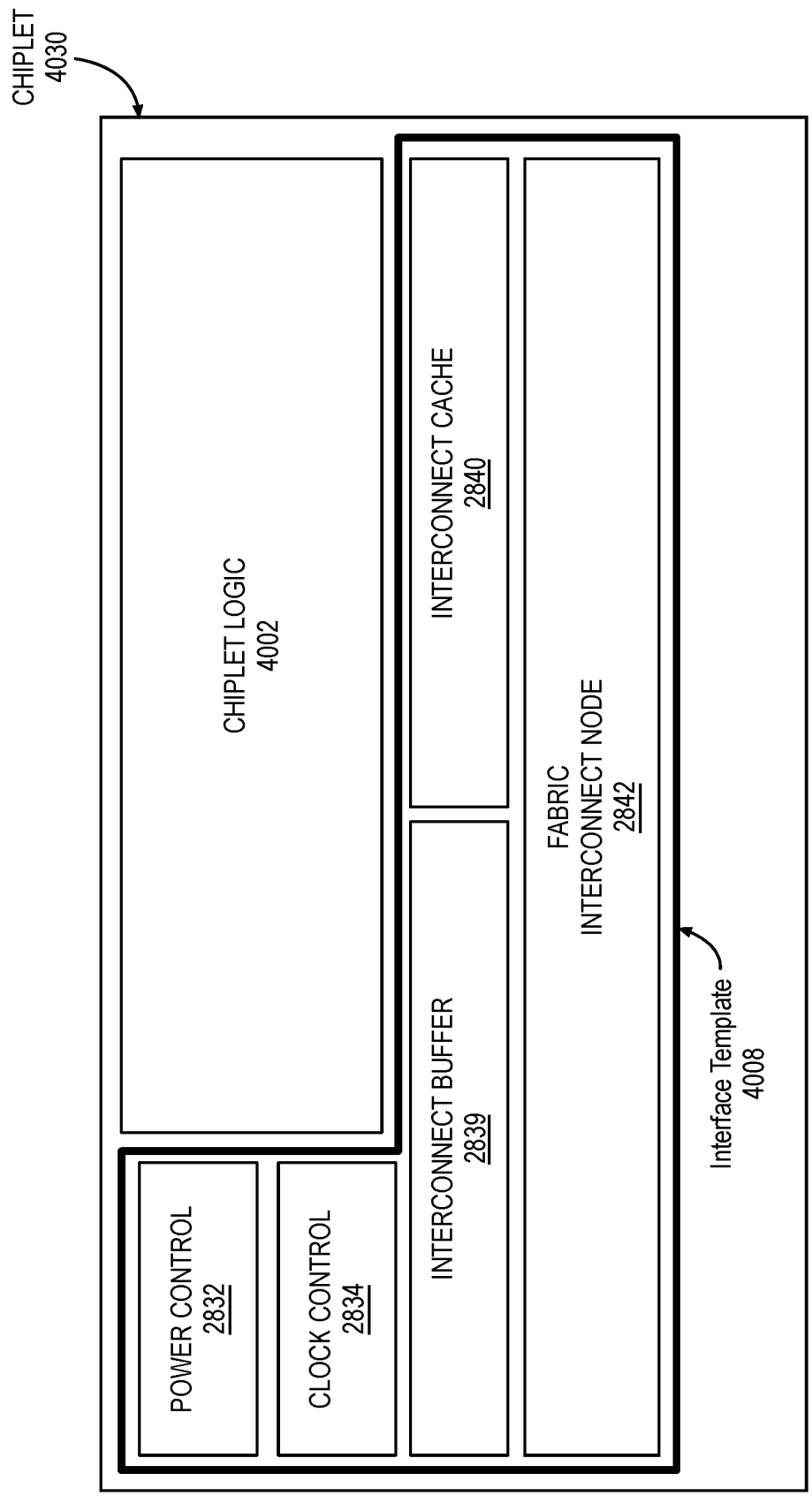
FIG. 40 illustrates a modular architecture for interchangeable chiplets, according to an embodiment.

FIG. 40 illustrates a modular architecture for interchangeable chiplets, according to an embodiment. In one embodiment a chiplet architecture 4030 can be made interchangeable by adapting the chiplet logic 4002 for interoperability with an interface template 4008. The interface template 4008 can include standardized logic such as power control 2832 and clock control 2834 logic, and interconnect buffer 2839, interconnect cache 2840, a fabric interconnect node 2842, as in chiplet 2830 of FIG. 28B. The IP designer can then provide the chiplet logic 4002, which is designed to interface with the interface template 4008. The specifics of the chiplet logic 4002 can vary and can include execution units, compute units, or streaming multiprocessors as described herein. The chiplet logic 4002 can also include media encode and/or decode logic, matrix acceleration logic, or ray-tracing logic. For memory chiplets, the chiplet logic 4002 can be replaced with memory cells and the fabric interconnect node can be replaced with interconnect bridge I/O circuits, for example, as illustrated in the memory chiplet 2906 of FIG. 29B.

Figure 41:
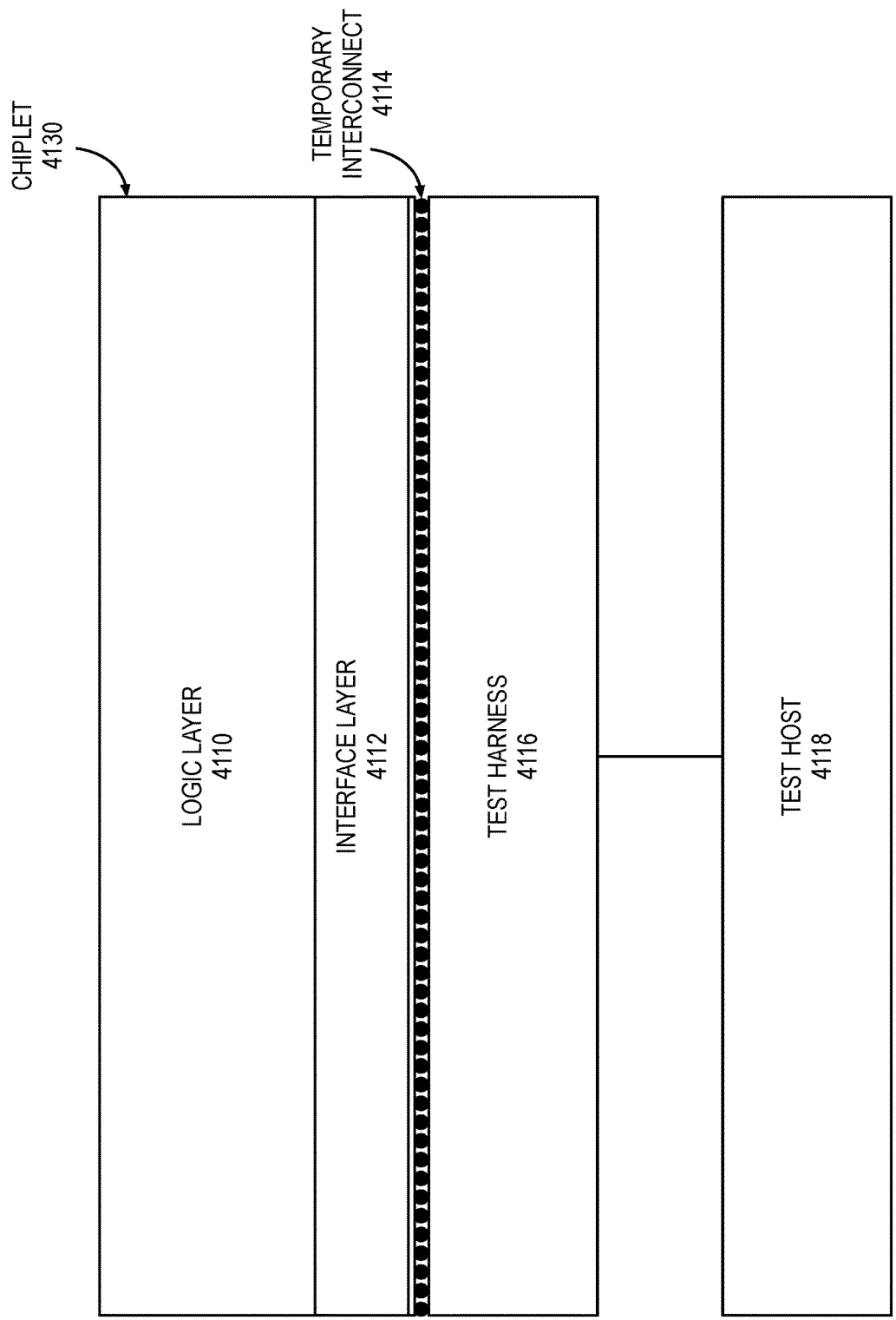
FIG. 41 illustrates the use of a standardized chassis interface for use in enabling chiplet testing, validation and integration.

FIG. 41 illustrates the use of a standardized chassis interface for use in enabling chiplet testing, validation and integration. A chiplet 4130 can include a logic layer 4110 and an interface layer 4112, similar to chiplet architecture 4030 of FIG. 40. The interface layer 4112 can be a standardized interface that can communicate with a temporary interconnect 4114 that enables the chiplet to be removably coupled to a test harness 4116. The test harness 4116 can communicate with a test host 4118. The test harness 4116, under the communication of the test host 4118, can perform a battery of tests on an individual chiplet 4130 during an initial testing or binning-out process to check for defects within the logic layer 4110 and to determine a performance or functionality bin for the chiplet 4130. For example, the logic layer 4110 can be tested to determine a number of defective and non-defective functional units and whether a threshold number of special functional units (e.g., matrix accelerators, ray-tracing cores, etc.) are functional. The logic layer 4110 can also be tested to determine if the internal logic can operate at a target frequency.

Figure 42:
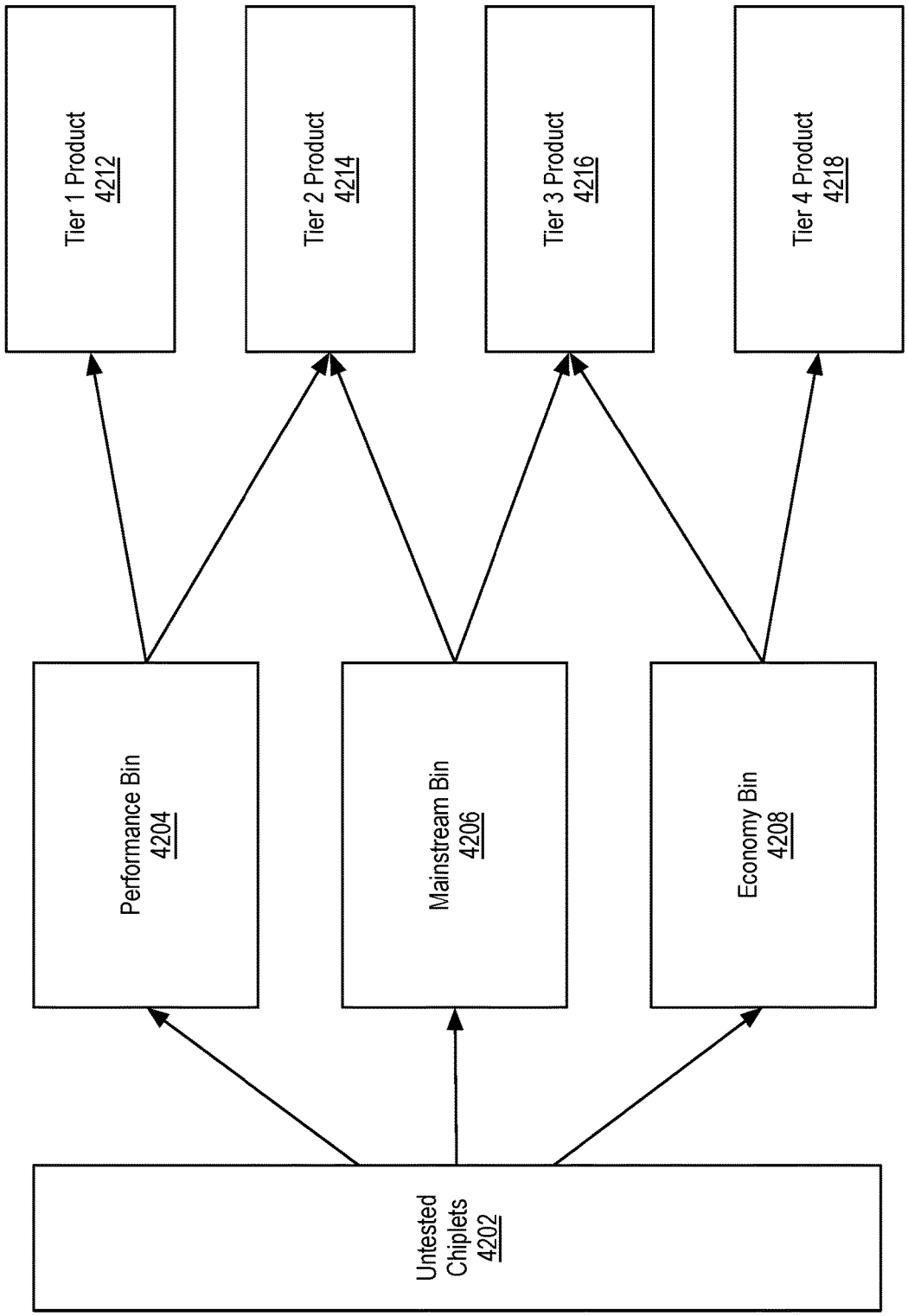
FIG. 42 illustrates the use of individually binned chiplets to create a variety of product tiers.

FIG. 42 Illustrates the use of individually binned chiplets to create a variety of product tiers. A set of untested chiplets 4202 can be tested and binned into a set of bins, including a performance bin 4204, a mainstream bin 4206, and an economy bin 4208, depending on whether the individual chiplets conform to specific performance or functionality tiers. The performance bin 4204 can include chiplets that exceed the performance (e.g., stable frequency) of the mainstream bin 4206, while the economy bin 4208 can include chiplets that are functional but underperform those of the mainstream bin 4206.

As the chiplets may be placed interchangeably during assembly different product tiers can be assembled based on the selected set of chiplets. A tier 1 product 4212 may be assembled only from chiplets in the performance bin 4204, while a tier 2 product 4214 can include a selection of chiplets from the performance bin 4204 and other chiplets from the mainstream bin 4206. For example, a tier 2 product 4214 that is designed for workloads that require high-bandwidth, low latency memory can use high performance memory chiplets from the performance bin 4204, while using compute, graphics, or media chiplets from the mainstream bin. Additionally, a tier 3 product 4216 can be assembled using mainstream compute chiplets from the mainstream bin 4206 and memory from the economy bin 4208 if such product is tailored for workloads without high memory bandwidth requirements. A tier 4 product 4218 can be assembled from functional but underperforming chiplets in the economy bin 4208.

Figure 43:
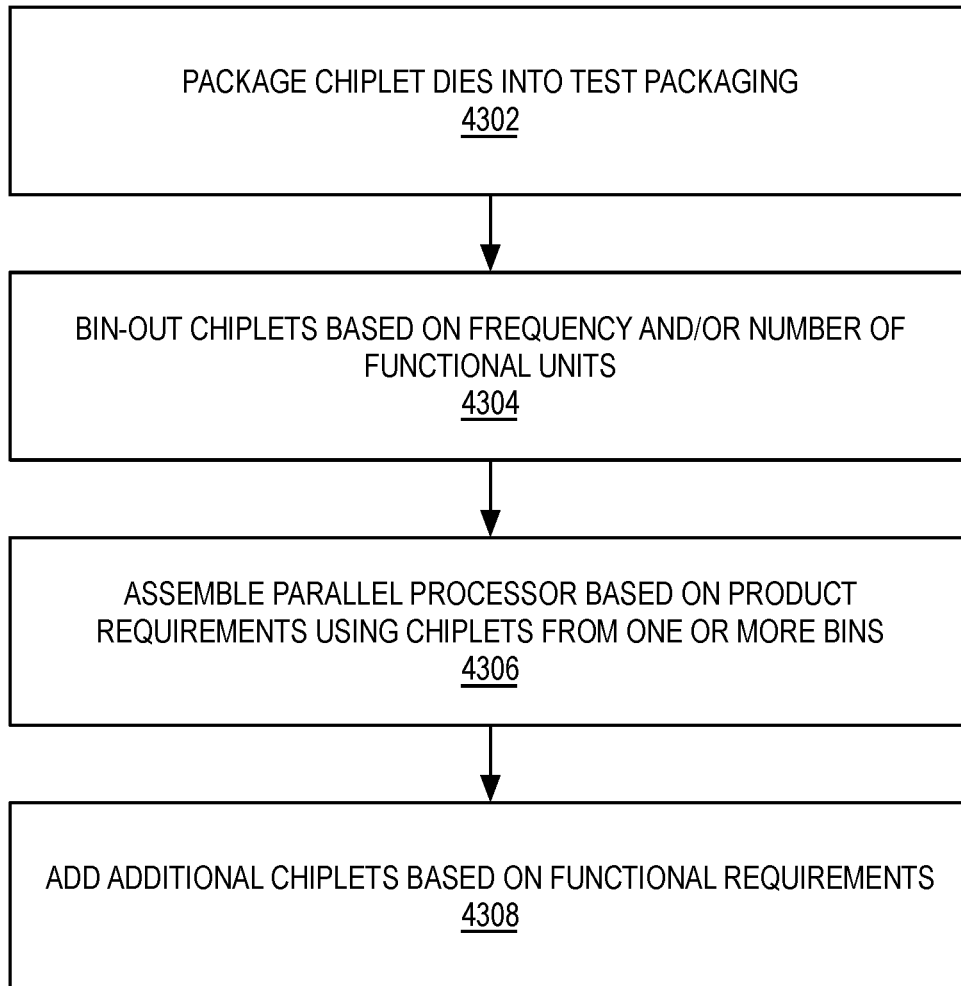
FIG. 43 illustrates a method of enabling different product tiers based on chiplet configuration.

FIG. 43 illustrates a method 4300 of enabling different product tiers based on chiplet configuration. The method 4300 includes to package chiplet dies into test packaging (block 4302). The chiplets can then be tested to bin-out chiplets based on frequency and/or number of functional units (block 4304). A disaggregated parallel processor can then be assembled based on product requirements using chiplets from one or more bins (block 4306). Additional chiplets (e.g., media, ray-tracing, etc.) can also be added based on functional requirements (block 4308).

The following clauses and/or examples pertain to specific embodiments or examples thereof. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to perform acts of the method, or of an apparatus or system according to embodiments and examples described herein. Various components can be a means for performing the operations or functions described.

Embodiments described herein provide techniques to dis-aggregate an architecture of a system on a chip integrated circuit into multiple distinct chiplets that can be packaged onto a common chassis. In one embodiment, a graphics processing unit or parallel processor is composed from diverse silicon chiplets that are separately manufactured. A chiplet is an at least partially packaged integrated circuit that includes distinct units of logic that can be assembled with other chiplets into a larger package. A diverse set of chiplets with different IP core logic can be assembled into a single device.

One embodiment provides for a general-purpose graphics processor comprising a base die including an interconnect fabric; and one or more chiplets coupled with the base die and the interconnect fabric via an interconnect structure, the interconnect structure to enable electrical communication between the one or more chiplets and the interconnect fabric. The one or more chiplets can include a first chiplet and a second chiplet, where the first chiplet is coupled with the base die and connected to the interconnect fabric via a first interconnect structure and the second chiplet is coupled with the base die and connected to the interconnect fabric via a second interconnect structure. The chiplets can include functional units configured to perform general-purpose graphics processing operations, media encode or decode operations, matrix operation acceleration, and/or ray-tracing. In one embodiment the chiplets include a network processor and a physical network interface (e.g., network port, wireless radio, etc.). The chiplets can additionally include memory, which may be cache memory or DRAM. Each chiplet may be separately and independently power gated. Additionally, logic or memory can be included in the base die. In one embodiment the base die includes cache memory. The cache memory in the base die can be a processor-wide cache. Base die cache memory can be configured to work in concert with cache memory in a chiplet.

One embodiment provides for a data processing system comprising a general-purpose graphics processor comprising a base die including an interconnect fabric and multiple chiplets coupled with the base die and the interconnect fabric via multiple interconnect structures, the multiple interconnect structures to enable electrical communication between the multiple chiplets and the interconnect fabric, wherein the interconnect fabric is to receive a message or signal from a first fabric interface node associated with a first chiplet of the multiple chiplets and relay the message or signal to a second fabric interface node associated with a second chiplet of the multiple chiplets. The interconnect fabric can transmit messages or signals via multiple virtual channels over multiple physical links of the interconnect fabric. In one embodiment multiple virtual channels can be transmitted across a single physical link. In one embodiment, a single virtual channel can be transmitted across multiple physical links. Idle physical links can be separately power gated.

One embodiment provides for a method comprising generating a data at a first functional unit within a chiplet or base die of a processor, transmitting the data to an interconnect fabric via a first fabric interface node, transporting the data across multiple clock domains within the processor, receiving the data at a second fabric interface node; transmitting the data to a second functional unit within the chiplet or base die of the processor; and performing an operation at the second functional unit based on received data. The method additionally comprises associating the data with a virtual channel of the interconnect fabric and forwarding or switching the data based on the virtual channel. In a further embodiment, the method includes diverging the virtual channel at the first fabric interface node, transporting data of the virtual channel across the multiple clock domains using multiple physical links, and converging the virtual channel at the second fabric interface node. In yet another embodiment, the virtual channel is a first virtual channel and the method additionally comprises converging the first virtual channel at the first fabric interface node with a second virtual channel, transporting the first virtual channel and the second virtual channel across the multiple clock domains using a single physical link, and diverging the first virtual channel at the second virtual channel at the second fabric interface node.

One embodiment provides for a non-transitory machine readable medium storing firmware for a microcontroller within a processor having a disaggregated architecture, the firmware including instructions to cause the microcontroller to perform operations comprising receiving a command buffer for a workload to be performed on the processor, determining a set of chiplets on the processor that include functional units to be used to perform the workload, power-gating one or more chiplets that do not contain functional units to be used to perform the workload, and performing the workload using powered chiplets. The operations can additionally comprise determining whether a chiplet that includes functional units to be used to perform the workload is powered and powering up the chiplet when the chiplet is power-gated.

Further embodiments provide for a disaggregated processor package that can be configured to accept interchangeable chiplets. Interchangeability is enabled by specifying a standard physical interconnect for chiplets that can enable the chiplet to interface with a fabric or bridge interconnect. Chiplets from different IP designers can conform to the common interconnect, enabling such chiplets to be interchangeable during assembly. The fabric and bridge interconnects logic on the chiplet can then be configured to confirm with the actual interconnect layout of the on board logic of the chiplet. Additionally, data from chiplets can be transmitted across an inter-chiplet fabric using encapsulation, such that the actual data being transferred is opaque to the fabric, further enable interchangeability of the individual chiplets. With such an interchangeable design, higher or lower density memory can be inserted into memory chiplet slots, while compute or graphics chiplets with a higher or lower core count can be inserted into logic chiplet slots.

One embodiment provides for a general-purpose graphics processor comprising a base die including an interconnect fabric and one or more chiplets coupled with the base die and the interconnect fabric via an interconnect structure, the interconnect structure to enable electrical communication between the one or more chiplets and the interconnect fabric, wherein the one or more chiplets are interchangeable during assembly of the general-purpose graphics processor. The one or more chiplets include a memory chiplet having memory cells associated with a memory device. The memory chiplet is coupled to a first memory chiplet slot. The one or more chiplets can additionally include a first logic chiplet and a second logic chiplet. The first logic chiplet can be coupled with the base die and connected to the interconnect fabric via a first interconnect structure. The first interconnect structure is bonded to a first logic chiplet slot. The second logic chiplet is coupled with the base die and connected to the interconnect fabric via a second interconnect structure. The second interconnect structure is bonded to a second logic chiplet slot.

In one embodiment the first logic chiplet slot is configured to accept the first logic chiplet or a third logic chiplet. The first logic chiplet includes functional units (e.g., execution units, compute units, streaming multi-processors, etc.) configured to perform general-purpose graphics processing operations, while the third logic chiplet includes functional units configured to perform matrix acceleration operations, such as a tensor core. The second logic chiplet slot can be configured to accept the second logic chiplet or a fourth logic chiplet. The second logic chiplet includes functional units configured to perform media operations to encode, decode, or transcode media to, from, or between one or more media encoding formats described herein. The fourth logic chiplet can instead include a network processor and a physical network interface. Each chiplet can be independently power gated.

In one embodiment, a logic chiplet as described herein includes a first layer including functional units and second layer including a fabric interconnect node. A memory chiplet described herein can include a first layer including a bank of memory cells and second layer including I/O circuits associated with an interconnect bridge between the memory chiplet and a logic chiplet. In a further embodiment, the base die is a first base die and the first base die couples with a second base die via an interconnect bridge.

One embodiment provides for a data processing system comprising a general-purpose graphics processor comprising a base die including an interconnect fabric and multiple chiplets coupled with the base die and the interconnect fabric via multiple interconnect structures. The multiple interconnect structures enable electrical communication between the multiple chiplets and the interconnect fabric. The interconnect fabric can receive a fabric packet from a first fabric interface node associated with a first logic chiplet of the multiple chiplets and relay the fabric packet to a second fabric interface node associated with a second logic chiplet of the multiple chiplets. The interconnect fabric can transmit the fabric packet via multiple virtual channels over multiple physical links of the interconnect fabric. The interconnect fabric can transmit fabric packets associated with a single virtual channel across multiple physical links of the interconnect fabric. The interconnect fabric can also transmit fabric packets for multiple virtual channels across a single physical link of the interconnect fabric. A physical link of the multiple physical links can be power gated when the physical link is idle. In one embodiment, a fabric packet for a virtual channel can be associated with one or more traffic classes. A virtual channel and a traffic class can each have an associated priority.

One embodiment provides for a method comprising receiving data from a first logic chiplet slot at a first fabric interface node, encapsulating the data into a fabric packet at the first fabric interface node, transmitting the fabric packet via switching logic to a second fabric interface node, receiving the packet at the second fabric interface node, de-encapsulating data from the fabric packet at the second fabric interface node, and transmitting the data from the fabric packet from the second fabric interface node to a second logic chiplet slot. The fabric packet can transit multiple clock domains between the first fabric interface node and the second fabric interface node.

Of course, one or more parts of an embodiment may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the embodiments may be practiced without some of these specific details. In certain instances, well-known structures and functions were not described in elaborate detail to avoid obscuring the inventive subject matter of the embodiments. Accordingly, the scope and spirit of the invention should be judged in terms of the claims that follow.

What is claimed is:

1. A general-purpose graphics processor comprising:
a 3-dimensional (3D) or 2.5 dimensional (2.5D) package assembly including:
an active base die including hardware logic and an interconnect fabric;
an array of multiple distinctly packaged chiplets coupled with the active base die and the interconnect fabric via an array of interconnect structures, the interconnect structures to enable electrical communication between the array of multiple distinctly packaged chiplets and the interconnect fabric, the array of multiple distinctly packaged chiplets comprising;
a first chiplet coupled with the active base die, the first chiplet including a first set of functional units configured to perform graphics processing operations;
a second chiplet coupled with the active base die, the second chiplet including a second set of functional units configured to perform graphics processing operations; and
a third chiplet coupled with the first chiplet and the second chiplet, the third chiplet including a cache memory that is shared by the first chiplet and the second chiplet.

2. The general-purpose graphics processor as in claim 1, wherein the first chiplet includes an interconnect buffer to store data received via the interconnect fabric.

3. The general-purpose graphics processor as in claim 2, wherein the first chiplet includes an interconnect cache coupled with a first fabric interface node, wherein the first fabric interface node couples the first chiplet with the interconnect fabric and the interconnect cache is to cache data transmitted and received via the first fabric interface node.

4. The general-purpose graphics processor as in claim 2, wherein the first chiplet or the second chiplet additionally includes functional units configured to perform media encode or decode operations.

5. The general-purpose graphics processor as in claim 2, wherein the array of chiplets additionally includes a fourth chiplet.

6. The general-purpose graphics processor as in claim 5, wherein the fourth chiplet includes a network processor and a physical network interface to an external network.

7. The general-purpose graphics processor as in claim 6, wherein the fourth chiplet includes memory cells associated with a memory device.

8. The general-purpose graphics processor as in claim 7, wherein the memory device is a cache memory associated with the network processor.

9. The general-purpose graphics processor as in claim 7, wherein the first chiplet, second chiplet, and fourth chiplet are independently power gated via power management hardware logic within the active base die.

10. The general-purpose graphics processor as in claim 1, wherein the active base die includes a cache memory and the cache memory is connected to the interconnect fabric.

11. The general-purpose graphics processor as in claim 10, wherein the cache memory is configured as a processor-wide cache.

12. A data processing system comprising:
a 3-dimensional (3D) or 2.5 dimensional (2.5D) package assembly including:
a graphics processor comprising an active base die including hardware logic, an interconnect fabric, and an array of multiple distinctly packaged chiplets coupled with the active base die and the interconnect fabric via multiple interconnect structures, the multiple interconnect structures to enable electrical communication between the array of multiple distinctly packaged chiplets and the interconnect fabric,
wherein the array of multiple distinctly packaged chiplets include a first chiplet including a first set of functional units configured to perform general-purpose graphics processing operations, a second chiplet including a second set of functional units configured to perform graphics processing operations, and a third chiplet coupled with the first chiplet and the second chiplet, the third chiplet including a cache memory that is shared by the first chiplet and the second chiplet, and
wherein the interconnect fabric is to receive a message or signal from a first fabric interface node associated with the first chiplet and relay the message or signal to a second fabric interface node associated with the second chiplet.

13. The data processing system as in claim 12, wherein the interconnect fabric is to transmit messages or signals via multiple virtual channels over multiple physical links of the interconnect fabric.

14. The data processing system as in claim 13, wherein the interconnect fabric is to transmit data for a single virtual channel across multiple physical links of the interconnect fabric.

15. The data processing system as in claim 13, wherein the interconnect fabric is to transmit data for multiple virtual channels across a single physical link of the interconnect fabric.

16. The data processing system as in claim 13, wherein a physical link of the multiple physical links is power gated when the physical link is idle via power management hardware logic within the active base die.

17. A method comprising:
via circuitry of a processor including a 3-dimensional (3D) or 2.5 dimensional (2.5) package assembly having multiple distinctly packaged chiplets coupled with an active base die including hardware logic:
generating data at a first functional unit within a first distinctly packaged chiplet of the multiple distinctly packaged chiplets, the first distinctly packaged chiplet coupled with the active base die of the processor;
caching the data in an interconnect cache within the chiplet, the interconnect cache coupled with a first fabric interface node;
transmitting the data to an interconnect fabric via the first fabric interface node;
routing the data within the interconnect fabric to a second fabric interface node;
receiving the data at the second fabric interface node;
transmitting the data to a second functional unit within a second distinctly packaged chiplet of the multiple distinctly packaged chiplets, the second distinctly packaged chiplet coupled with the active base die of the processor; and
performing an operation at the second functional unit based on received data.

18. The method as in claim 17, additionally comprising associating the data with a virtual channel of the interconnect fabric and forwarding or switching the data based on the virtual channel.

19. The method as in claim 18, additionally comprising:
diverging the virtual channel at the first fabric interface node;

transporting data of the virtual channel across multiple clock frequency domains within the processor using multiple physical links; and converging the virtual channel at the second fabric interface node.

20. The method as in claim 18, wherein the virtual channel is a first virtual channel and the method additionally comprises:

converging the first virtual channel at the first fabric interface node with a second virtual channel;

transporting the first virtual channel and the second virtual channel across multiple clock frequency domains within the processor using a single physical link; and diverging the first virtual channel at the second virtual channel at the second fabric interface node.

* * * * *